US011804061B2

United States Patent
He et al.

(10) Patent No.: US 11,804,061 B2
(45) Date of Patent: Oct. 31, 2023

(54) OPTICAL SENSING OF FINGERPRINTS OR OTHER PATTERNS ON OR NEAR DISPLAY SCREEN USING OPTICAL DETECTORS INTEGRATED TO DISPLAY SCREEN

(71) Applicant: Shenzhen Goodix Technology Co., Ltd., Shenzhen (CN)

(72) Inventors: Yi He, San Diego, CA (US); Bo Pi, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/533,425

(22) Filed: Aug. 6, 2019

(65) Prior Publication Data

US 2020/0050818 A1     Feb. 13, 2020

Related U.S. Application Data

(60) Provisional application No. 62/715,792, filed on Aug. 7, 2018.

(51) Int. Cl.
| | |
|---|---|
| *G06V 40/13* | (2022.01) |
| *G06V 40/12* | (2022.01) |
| *H01L 27/12* | (2006.01) |

(52) U.S. Cl.
CPC ...... *G06V 40/1318* (2022.01); *G06V 40/1359* (2022.01); *G06V 40/1394* (2022.01); *G06V 40/1341* (2022.01); *H01L 27/1214* (2013.01)

(58) Field of Classification Search
None
See application file for complete search history.

(56) References Cited

U.S. PATENT DOCUMENTS

| | | | | |
|---|---|---|---|---|
| 2007/0253607 | A1* | 11/2007 | Higuchi | G06K 9/0012 |
| | | | | 382/124 |
| 2009/0027694 | A1* | 1/2009 | Kobayashi | G06F 3/0418 |
| | | | | 356/622 |
| 2015/0254495 | A1* | 9/2015 | Rowe | A61B 5/0059 |
| | | | | 382/124 |
| 2015/0331508 | A1 | 11/2015 | Nho et al. | |
| 2017/0124370 | A1* | 5/2017 | He | G06K 9/0002 |
| 2017/0220838 | A1 | 8/2017 | He et al. | |
| 2017/0337413 | A1* | 11/2017 | Bhat | G06K 9/00087 |

(Continued)

FOREIGN PATENT DOCUMENTS

| | | |
|---|---|---|
| CN | 103886297 A | 6/2014 |
| CN | 104281841 A | 1/2015 |

(Continued)

OTHER PUBLICATIONS

International Search Report for International Patent Application No. PCT/CN2019/098949, filed Aug. 1, 2019, dated Nov. 13, 2019 (5 pages).

(Continued)

*Primary Examiner* — Benjamin X Casarez
(74) *Attorney, Agent, or Firm* — Perkins Coie LLP

(57) ABSTRACT

Devices and optical sensor modules are provided for on-screen optical sensing of fingerprints or other patterns by interleaving optical sensors with display pixels across a display panel for using a top surface above the display panel over the entire display surface as an optical sensing surface.

22 Claims, 31 Drawing Sheets

(56) References Cited

U.S. PATENT DOCUMENTS

| | | | |
|---|---|---|---|
| 2017/0371213 A1 | 12/2017 | Wang et al. | |
| 2018/0137337 A1* | 5/2018 | Zeng | G06V 40/1365 |
| 2019/0050619 A1* | 2/2019 | Kern | G06V 40/13 |
| 2019/0050621 A1* | 2/2019 | Xu | G06K 9/0004 |
| 2019/0129530 A1* | 5/2019 | Shen | H01L 27/124 |
| 2019/0157337 A1* | 5/2019 | Lin | H01L 31/167 |
| 2019/0286870 A1* | 9/2019 | Ling | G06F 3/03547 |
| 2019/0303639 A1 | 10/2019 | He et al. | |
| 2019/0311176 A1* | 10/2019 | Haddad | G06K 9/00046 |
| 2019/0346939 A1* | 11/2019 | Na | G06F 3/0421 |
| 2020/0285345 A1* | 9/2020 | Xiang | G06K 9/0004 |
| 2020/0403018 A1* | 12/2020 | Hai | H01L 27/14621 |

FOREIGN PATENT DOCUMENTS

| | | |
|---|---|---|
| CN | 106462765 A | 2/2017 |
| CN | 106886767 A | 6/2017 |
| CN | 107004130 A | 8/2017 |
| CN | 107251046 A | 10/2017 |
| CN | 107275374 A | 10/2017 |
| CN | 107580703 A | 1/2018 |
| CN | 107967876 A | 4/2018 |
| CN | 108153027 A | 6/2018 |
| CN | 108369135 A | 8/2018 |
| WO | 2016205832 A1 | 12/2016 |
| WO | 2017076292 A1 | 5/2017 |
| WO | 2017129126 A1 | 8/2017 |

OTHER PUBLICATIONS

Office Action from Chinese Patent Application No. 201980006131.1 dated Mar. 23, 2023.

Jiang Fayun et al. "Optical Structure and Designing of Nakedness Eye Steroscopic LCD Panel," Chinese Journal of liquid Crystals and Displays, Dec. 26, 2005, 20(6):544-548.

Notification of Registration Procedures, Chinese Patent No. 2023081000120320, dated Aug. 10, 2023

* cited by examiner (Optical Sensing Zone in FIGs. 2E and 2F)

423- Display assembly
431- Enhanced cover glass
433- OLED display module
445, 447- Touching finger
613- Viewing zone
615- Effective Fingerprint sensing zone 524- Bottom layers
431- Cover glass
433- Display module
60- Finger tissues
61- Finger skin ridge
63- Finger skin valley
73- Display OLED
181- Cover glass reflected light
82, 201, 202, 211, 212- Light beams from an OLEDs group
185, 205, 206- Cover glass reflected light
187- Finger skin reflected light
189, 203, 204- Light coupled into finger tissues
191- Light scattered into the bottom layers
213, 214- Cover glass total reflected light 3301- Lightly pressed fingerprint
3303- Heavily pressed fingerprint
3305- Integration zone 60a - Finger
431 - Cover glass
450 - Small holes in OLED TFT layers
937, 937a - Background light
939, 939a - Transmitted background light
941, 941a - Filtered background light

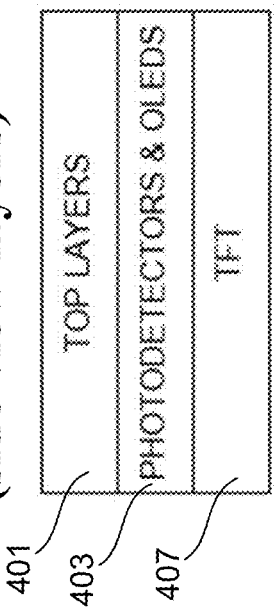
FIG. 15A
(side view-layers)
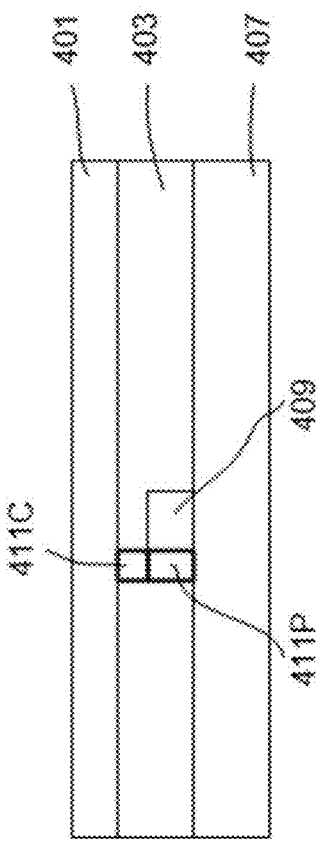
FIG. 15B
(side view-pixel detail)
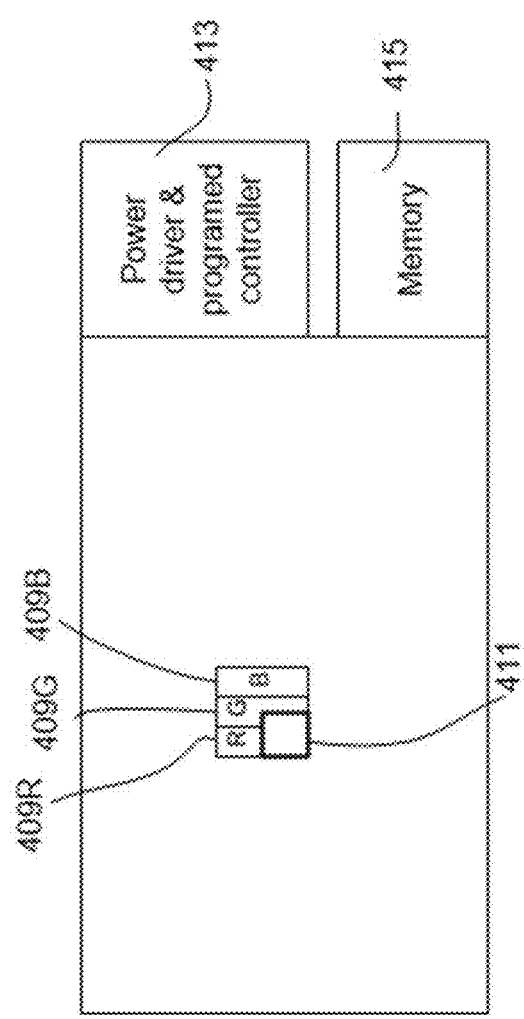
FIG. 15C
(top view)
FIG. 15
401- Top layers such as sealing layer
403- Photodetector and OLEDs
407- Thin film transistor (TFT) layer
409- One pixel group of OLED
409R- Red light emitter
409G- Green light emitter
409B- Blue light emitter
411- One photodetector assembly
411P- Photodiode
411C- Collimation structure
413- Power driver and programed controller
415- Memory

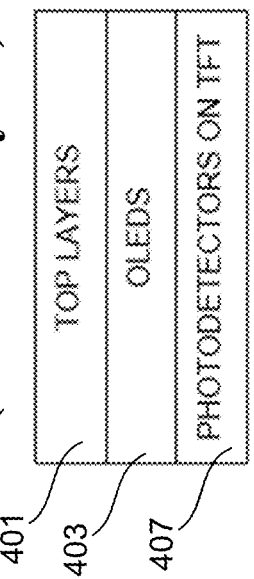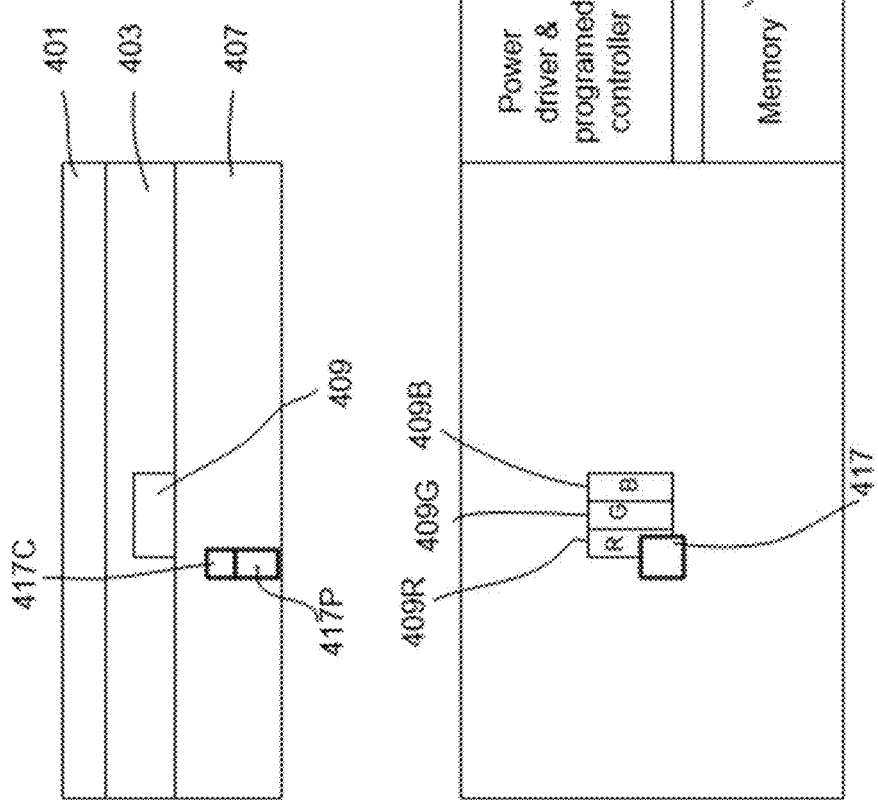

FIG. 16A (side view-layers)
- 401 TOP LAYERS
- 403 OLEDS
- 407 PHOTODETECTORS ON TFT FIG. 16
- 401- Top layers such as sealing layer
- 403- Photodetector and OLEDs
- 407- Thin film transistor (TFT) layer
- 409- One pixel group of OLED
- 409R- Red light emitter
- 409G- Green light emitter
- 409B- Blue light emitter
- 417- One photodetector assembly
- 417P- Photodiode
- 417C- Collimation structure
- 413- Power driver and programed controller
- 415- Memory FIG. 16B (side view-pixel detail)

FIG. 16C (top view)

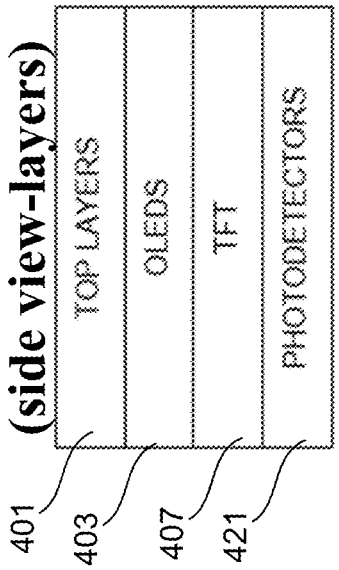

FIG. 17A (side view-layers)

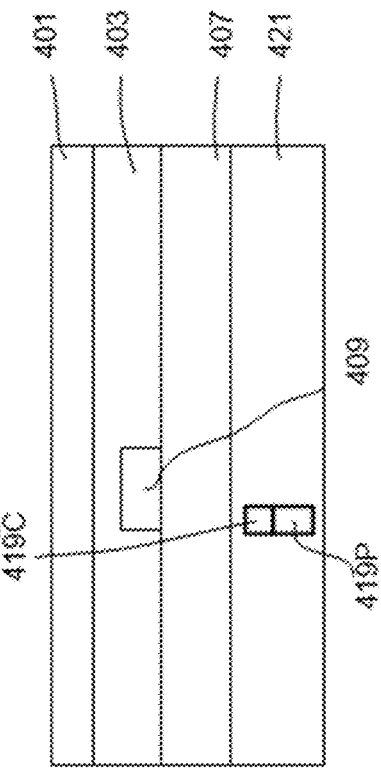

FIG. 17B (side view-pixel detail)

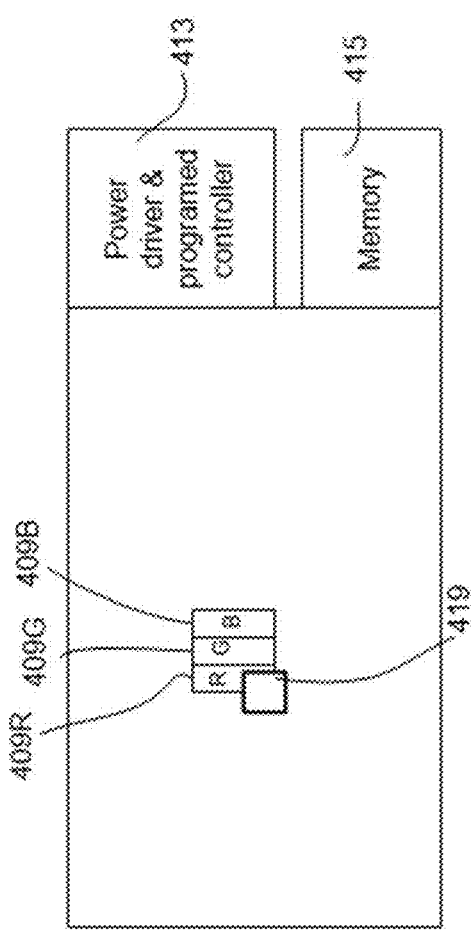

FIG. 17C (top view)

401- Top layers such as sealing layer
403- Photodetector and OLEDs
407- Thin film transistor (TFT) layer
409- One pixel group of OLED
409R- Red light emitter
409G- Green light emitter
409B- Blue light emitter
419- One photodetector assembly
419P- Photodiode
419C- Collimation structure
413- Power driver and programed controller
415- Memory
421- Photodetectors layer

FIG. 17

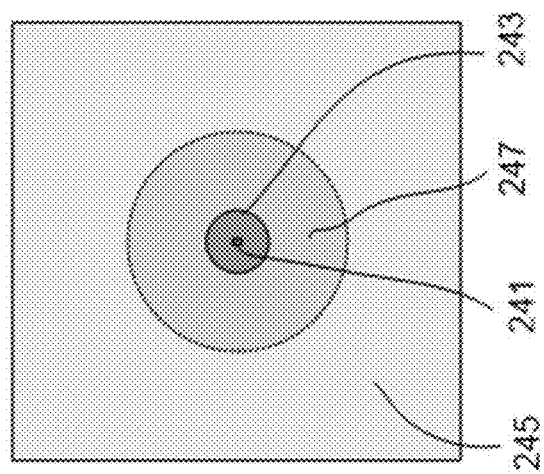
FIG. 19B
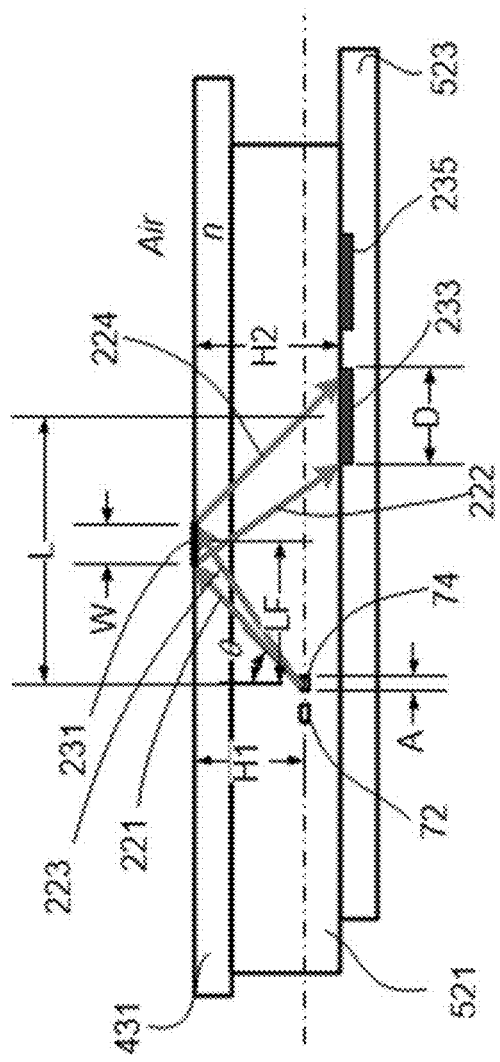
FIG. 19A
FIG. 19
- 523 - Photodetector array
- 431 - Cover glass
- 521 - Other display layers
- 72, 74, 241 - Display OLEDs
- 221, 223 - Light beams from a group of display OLEDs
- 222, 224 - Cover glass total reflected light
- 233 - Photodetectors
- 235 - Central light beams zone
- 243 - Total reflection zone
- 245 - Effective sensing zone (extra illumination light outside OLED pixels)

Control the extra illumination light sources to sequentially produce different illumination probe light beams to illuminate a finger, one extra illumination light source at a time, from different directions, respectively, so that the probe light in each illumination probe light beam enters the finger and is scattered by internal tissues of the finger to cause a transmission of a portion of the scattered probe light inside the finger to through internal tissues of ridges and valleys of the finger to carry both (1) a first 2-dimensional transmissive pattern representing a fingerprint pattern formed by bridges and valleys of the finger, and (2) a first fingerprint topographic pattern that is associated with the illumination of internal tissues of ridges and valleys of the finger in the first illumination direction and is embedded within the first 2-dimensional transmissive pattern Operate the optical sensors to capture fingerprint images carried by scattered probe light from scattering of the different illumination probe light beams inside the finger, respectively Process the captured fingerprint images caused by the different illumination probe light beams, respectively, to extract spatial shifts in the captured fingerprint images associated with the different directions of the different illumination probe light beams and a 3-D topographic profile of the fingerprint pattern that is superimposed on the scattered probe light from inside the finger Process the extracted spatial shifts in the captured fingerprint images associated with the different directions of the different illumination probe light beams in determining whether the captured fingerprint images are from a person's finger

FIG. 21B

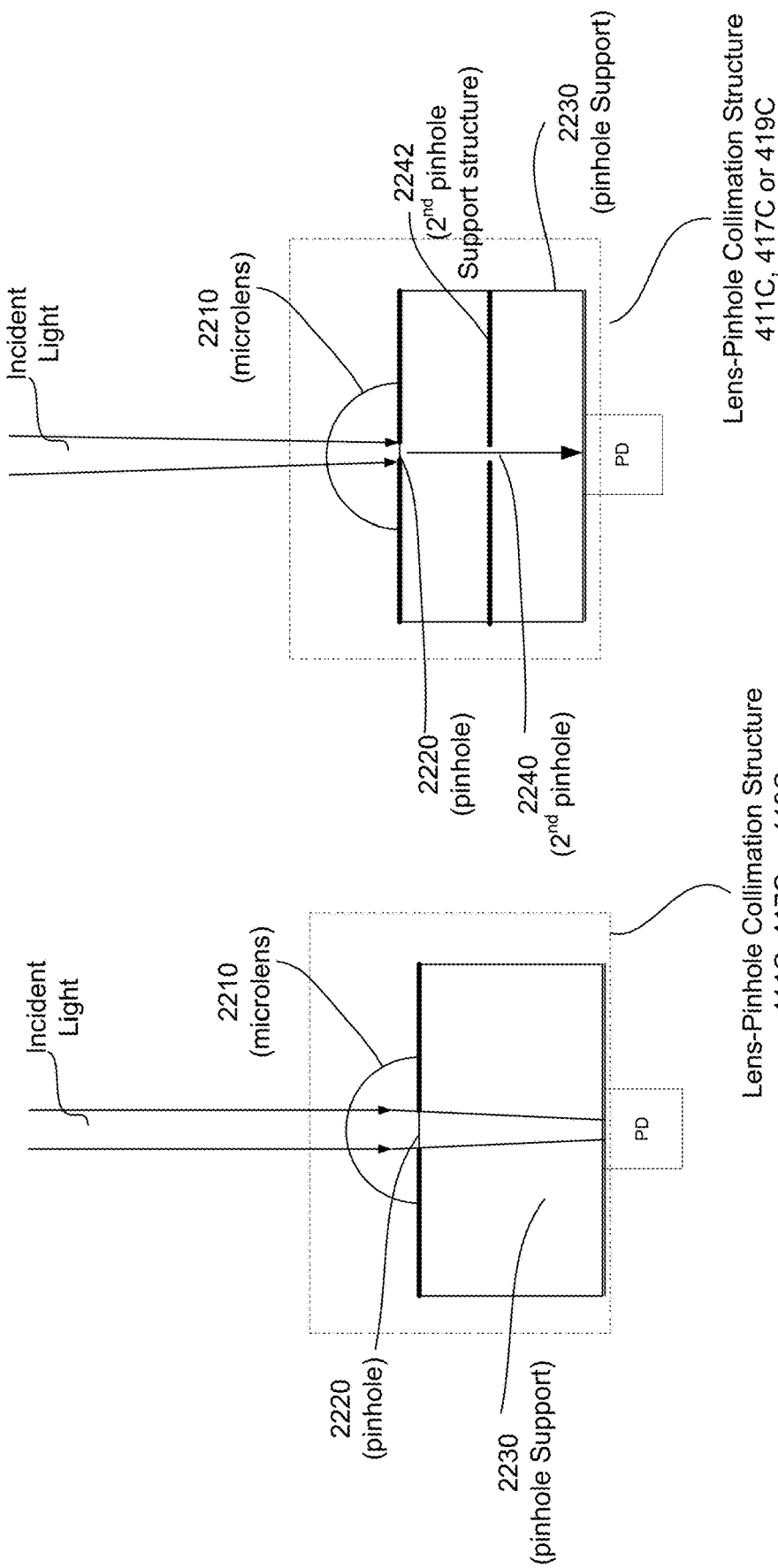

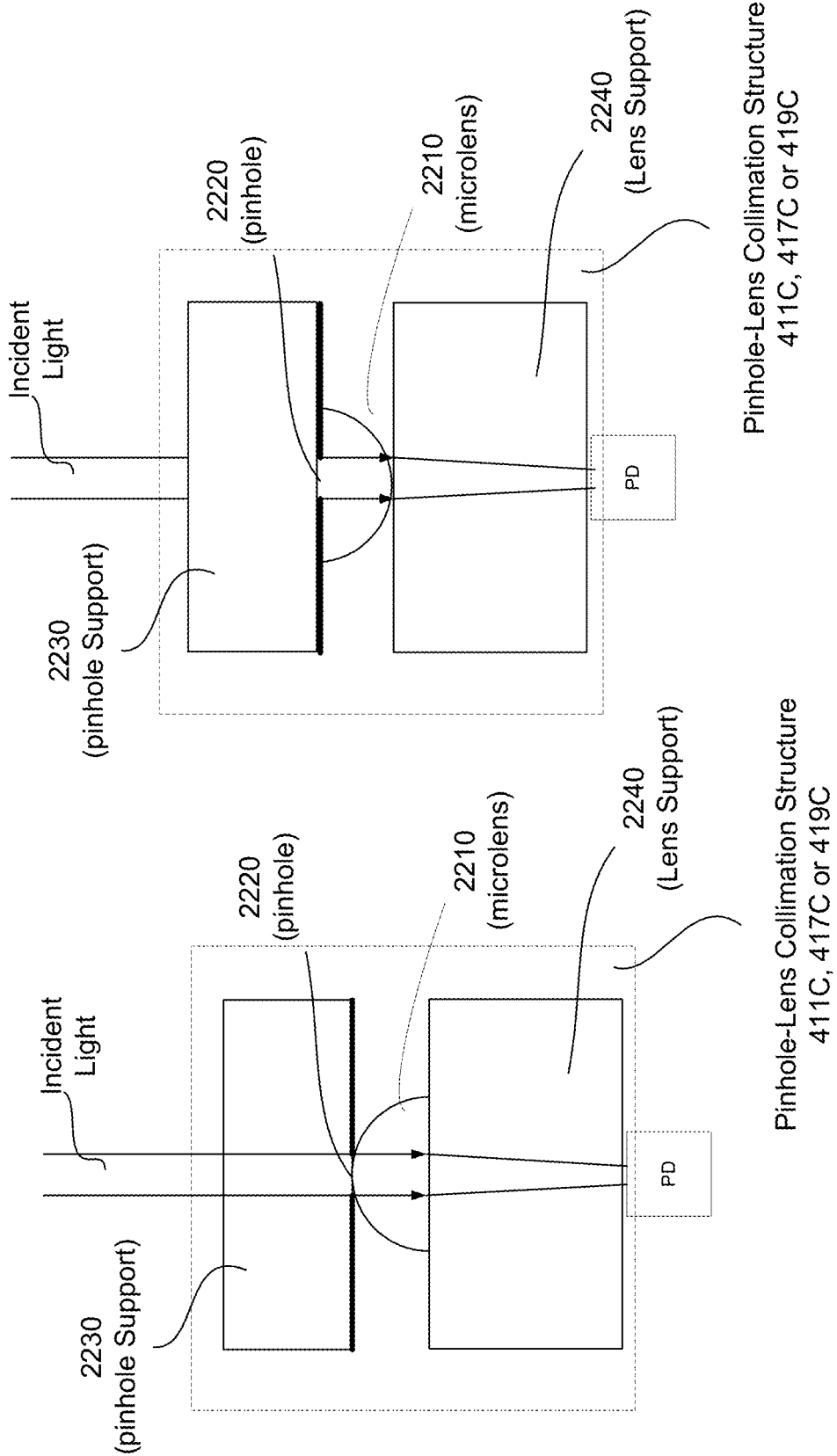

OPTICAL SENSING OF FINGERPRINTS OR OTHER PATTERNS ON OR NEAR DISPLAY SCREEN USING OPTICAL DETECTORS INTEGRATED TO DISPLAY SCREEN

PRIORITY CLAIM AND RELATED PATENT APPLICATION

This patent document claims the priority and benefits of U.S. Provisional Patent Application No. 62/715,792 entitled "OPTICAL SENSING OF FINGERPRINTS OR OTHER PATTERNS ON OR NEAR DISPLAY SCREEN USING OPTICAL DETECTORS INTEGRATED TO DISPLAY SCREEN" and filed by Applicant and Assignee Shenzhen Goodix Technology Co., Ltd. on Aug. 7, 2018, the entire disclosure of which is incorporated by reference as part of this patent document.

TECHNICAL FIELD

This patent document relates to optical sensing of patterns such as fingerprints and faces, and to performing one or more sensing operations of other parameter measurements in electronic devices or systems, including portable devices such as a mobile device or a wearable device and larger systems.

BACKGROUND

Various sensors can be implemented in electronic devices or systems to provide certain desired functions. There is an increasing need for securing access to computers and computer-controlled devices or systems where only authorized users be identified and be distinguished from non-authorized users.

For example, mobile phones, digital cameras, tablet PCs, notebook computers and other portable electronic devices have become more and more popular in personal, commercial and governmental uses. Portable electronic devices for personal use may be equipped with one or more security mechanisms to protect the user's privacy.

For another example, a computer or a computer-controlled device or system for an organization or enterprise may be secured to allow only authorized personnel to access to protect the information or the use of the device or system for the organization or enterprise.

The information stored in portable devices and computer-controlled databases, devices or systems, may be of certain characteristics that should be secured. For example, the stored information may be personal in nature, such as personal contacts or phonebook, personal photos, personal health information or other personal information, or confidential information for proprietary use by an organization or enterprise, such as business financial information, employee data, trade secrets and other proprietary information. If the security of the access to the electronic device or system is compromised, the data may be accessed by others that are not authorized to gain the access, causing loss of privacy of individuals or loss of valuable confidential information. Beyond security of information, securing access to computers and computer-controlled devices or systems also allow safeguard of the use of devices or systems that are controlled by computers or computer processors such as computer-controlled automobiles and other systems such as ATMs.

Secured access to a device such as a mobile device or a system such as an electronic database and a computer-controlled system can be achieved in different ways such as using user passwords. A password, however, may be easily to be spread or obtained and this nature of passwords can reduce the level of the security. Moreover, a user needs to remember a password to use password-protected electronic devices or systems, and, if the user forgets the password, the user needs to undertake certain password recovery procedures to get authenticated or otherwise regain the access to the device. Unfortunately, in various circumstances, such password recovery processes may be burdensome to users and have various practical limitations and inconveniences.

The personal fingerprint identification can be utilized to achieve the user authentication for enhancing the data security while mitigating certain undesired effects associated with passwords.

Electronic devices or systems, including portable or mobile computing devices, may employ user authentication mechanisms to protect personal or other confidential data and prevent unauthorized access. User authentication on an electronic device or system may be carried out through one or multiple forms of biometric identifiers, which can be used alone or in addition to conventional password authentication methods. One form of biometric identifiers is a person's fingerprint pattern. A fingerprint sensor can be built into an electronic device or system to read a user's fingerprint pattern as part of the authentication process so that the device or system can only be unlocked by an authorized user through authentication of the authorized user's fingerprint pattern.

SUMMARY

The sensor technology and examples of implementations of the sensor technology described in this patent document provide designs for an optical sensor module formed by optical sensors that are spatially interleaved with display pixels of the display panel for using a top surface above the display panel for optical sensing of fingerprints and additional optical sensing functions over the entire display surface as an optical sensing surface for sensing a fingerprint or other patterns (e.g., palm patterns or facial patterns). In some implementations of the disclosed optical sensing, in addition to capturing reflected or scattered light from a finger, the optical sensing can be used to capture and process optical transmissive patterns in probe light that transmits through the internal finger tissues associated with the external fingerprint pattern formed on the outer finger skin to provide 3-dimensional topographical information for improved optical fingerprint sensing.

In one aspect, the disclosed technology can be implemented to provide an electronic device capable of detecting a fingerprint by optical sensing to include a display panel that includes light emitting display pixels operable to emit light for displaying images; a top transparent layer formed over the display panel as an interface for user touch operations and for transmitting the light from the display panel to display images, the top transparent layer including a designated fingerprint sensing area for a user to place a finger for fingerprint sensing; an optical sensor module including an optical sensor array of optical detectors that are spatially distributed across the light emitting display pixels and are spatially interleaved with the light emitting display pixels to provide optical sensing across the display panel, each optical detector operable to convert the received light that carries a fingerprint pattern of the user into a detector signal representing the fingerprint pattern; and optical collimation structures that are spatially distributed so that each optical collimation structure is coupled to a corresponding optical detector to spatially select incident light to be detected by the optical detector.

In one aspect, the disclosed technology can be implemented to provide an electronic device capable of detecting a fingerprint by optical sensing. This device includes a display panel that displays images; a top transparent layer formed over the display panel as an interface for user touch operations and for transmitting the light from the display panel to display images, the top transparent layer including a designated fingerprint sensing area for a user to place a finger for fingerprint sensing; and an optical sensor module located below the display panel and underneath the designated fingerprint sensing area on the top transparent layer to receive light from the top transparent layer to detect a fingerprint, wherein the optical sensor module includes an optical sensor array of optical detectors to convert the received light that carries a fingerprint pattern of the user into detector signals representing the fingerprint pattern.

This device further includes extra illumination light sources located outside the optical sensor module at different locations to produce different illumination probe beams to illuminate the designated fingerprint sensing area on the top transparent layer in different illumination directions, each extra illumination light source structured to produce probe light in an optical spectral range with respect to which tissues of a human finger exhibit optical transmission to allow probe light in each illumination probe beam to enter a user finger over the designated fingerprint sensing area on the top transparent layer to produce scattered probe light by scattering of tissues inside the finger that propagates towards and passes the top transparent layer to carry both (1) fingerprint pattern information and (2) different fingerprint topographical information associated with the different illumination directions, respectively, caused by transmission through internal tissues of ridges and valleys of the finger; and a probe illumination control circuit coupled to control the extra illumination light sources to sequentially turn on and off in generating the different illumination probe beams at different times, one beam at a time, so that the optical sensor module located below the display panel is operable to sequentially detect the scattered probe light from the different illumination probe beams to capture both (1) the fingerprint pattern information and (2) the different fingerprint topographical information associated with the different illumination directions, respectively.

In another aspect, the disclosed technology can be implemented to provide a method for operating an electronic device to detect a fingerprint by optical sensing, wherein the electronic device includes a display panel that displays images, a top transparent layer formed over the display panel as an interface for user touch operations and for transmitting the light from the display panel to display images, and an optical sensor array of optical detectors located under the display panel. This the method includes directing a first illumination probe beam to illuminate a designated fingerprint sensing area over the top transparent layer in a first illumination direction and to enter a user finger over the designated fingerprint sensing area to produce first scattered probe light by scattering of tissues inside the finger that propagates towards and passes the top transparent layer by transmission through internal tissues of ridges and valleys of the finger to carry both (1) a first 2-dimensional transmissive pattern representing a fingerprint pattern formed by bridges and valleys of the finger, and (2) a first fingerprint topographical pattern that is associated with the illumination of internal tissues of ridges and valleys of the finger in the first illumination direction and is embedded within the first 2-dimensional transmissive pattern. This further also includes operating the optical sensor array to detect transmitted part of the first scattered probe light that passes through the top transparent layer and the display panel to reach the optical sensor array so as to capture both (1) the first 2-dimensional transmissive pattern, and (2) the first fingerprint topographical pattern.

In addition, this method includes directing a second illumination probe beam, while turning off the first illumination light source, to illuminate the designated fingerprint sensing area over the top transparent layer in a second, different illumination direction and to enter the user finger to produce second scattered probe light by scattering of tissues inside the finger that propagates towards and passes the top transparent layer by transmission through internal tissues of ridges and valleys of the finger to carry both (1) a second 2-dimensional transmissive pattern representing the fingerprint pattern, and (2) a second fingerprint topographical pattern that is associated with the illumination of the internal tissues of ridges and valleys of the finger in the second illumination direction and that is embedded within the second 2-dimensional transmissive pattern, wherein the second topographical pattern is different from the first topographical pattern due to different beam directions of the first and second illumination probe beams. The optical sensor array is operated to detect transmitted part of the second scattered probe light that passes through the top transparent layer and the display panel to reach the optical sensor array so as to capture both (1) the second 2-dimensional transmissive pattern, and (2) the second fingerprint topographical pattern. Next, a detected fingerprint pattern is constructed from the first and second transmissive patterns and the first and second fingerprint topographical patterns are processed to determine whether the detected fingerprint pattern is from a natural finger.

Those and other aspects and their implementations are described in greater detail in the drawings, the description and the claims.

BRIEF DESCRIPTION OF THE DRAWINGS

FIGS. 15, 16, 17, 18 and 19 show examples of implementation for interleaving optical sensors with OLED pixels in the OLED display panel for optical sensing.

FIG. 21B show an example of an operation method for operating the extra illumination light sources for sensing the 3-D topographical fingerprint features under the finger skin.

FIGS. 22A and 22B show two examples for using a pinhole-lens assembly as the optical collimation structure 411C, 417C or 419C in FIG. 15, 16 or 17, respectively, where a lens is placed to receive incident light to be imaged onto the photodetector and a pinhole is placed between the lens and the photodetector to limit the numerical aperture of the assembly to reduce optical cross talk in the optical sensing.

FIGS. 23A and 23B show two others examples for using a pinhole-lens assembly as the optical collimation structure 411C, 417C or 419C in FIG. 15, 16 or 17, respectively, where a pinhole is placed to receive incident light to be imaged onto the photodetector and a lens is placed between the pinhole and the photodetector.

DETAILED DESCRIPTION

Figure 1:
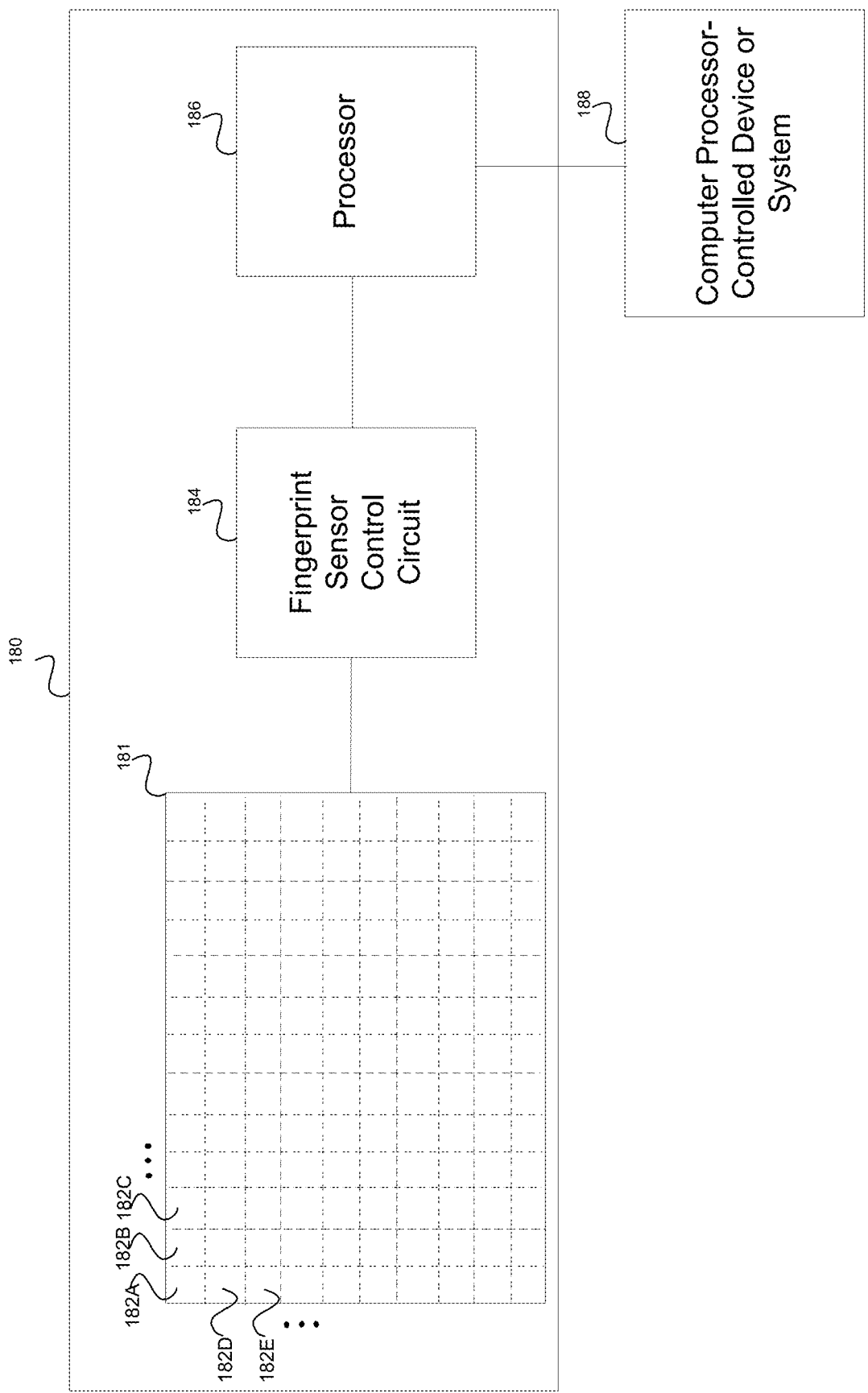
FIG. 1 is a block diagram of an example of a system with a fingerprint sensing module which can be implemented to include an optical fingerprint sensor disclosed in this document.

The sensor technology and examples of implementations of the sensor technology described in this patent document provide optical sensing mechanisms to use optical sensors that are integrated to display pixels of the display panel for using a top surface above the display panel over the entire display surface as an optical sensing surface for sensing a fingerprint or other patterns for optically sensing an object in contact with or near the device display panel surface. The disclosed optical sensing can be used to detect structural patterns (e.g., fingerprints, palm prints, palm vein prints, facial patterns and other patterns) that are either formed on surfaces as external surface patterns or formed below the external skin surface as under-skin internal tissue structures (e.g., topographical patterns inside a finger under the finger skin). Optical sensors are provided to spatially interleave with display pixels of the display panel for implementing the disclosed optical sensing.

Various optical sensing features using optical sensors that are integrated to display pixels of the display panel share commonalities with optical sensing using an optical sensor array smaller than the display panel area that is included as part of an optical sensor module separated from the optical display panel and is placed underneath the optical display panel to use a portion of the entire display panel area as an optical sensing area. The description of U.S. Provisional Patent Application No. 62/715,792 from which this patent document claims priority includes description of various technical features for optical sensing using an optical sensor array as part of an optical sensor module separated from and placed underneath the optical display panel. Applicant's U.S. patent application Ser. No. 16/147,855 entitled "3-DIMENSIONAL OPTICAL TOPOGRAPHICAL SENSING OF FINGERPRINTS USING UNDER-SCREEN OPTICAL SENSOR MODULE" and filed on Sep. 30, 2018 includes the description in the U.S. Provisional Patent Application No. 62/715,792 and description on technical features related to the disclosed technology in this patent document. Accordingly, the entire disclosure of U.S. patent application Ser. No. 16/147,855 is incorporated by reference as part of the disclosure of this patent document.

In the examples for implementations of the disclosed optical sensing technology, the optical sensors of the optical sensor array are integrated to the display panel to spatially interleave with the display pixels of the display panel so that the entire display surface can be used as an optical sensing surface for sensing a fingerprint or other patterns (e.g., palm patterns or facial patterns) while also serving as a display panel for displaying images, graphics, text and video contents. For example, the optical sensors or photodetectors of the optical sensor array can be integrated with the light emitting pixels of an organic light emitting diode display (OLED) panel so that a unit color pixel having OLED pixels of different emitting colors includes at least one optical sensor. For another example, the optical sensors or photodetectors of the optical sensor array can be formed outside the OLED pixel layer of the OLED display panel but are directly formed in a thin film transistor (TFT) layer on the same substrate for forming the OLED display pixel layer as a display size photodetector array to use the entire OLED display panel surface as an optical sensing surface. For yet another example, the optical sensors or photodetectors of the optical sensor array can be formed in a separate substrate from the OLED substrate for forming the OLED pixels as a display size photodetector array to use the entire OLED display panel surface as an optical sensing surface.

The following sections use optical sensing of fingerprints as a specific example for the more general optical sensing of an object in contact with on near the optical display panel surface to describe example designs for the disclosed optical sensing technology.

Electronic devices or systems may be equipped with fingerprint authentication mechanisms to improve the security for accessing the devices. Such electronic devices or system may include, portable or mobile computing devices, e.g., smartphones, tablet computers, wrist-worn devices and other wearable or portable devices, larger electronic devices or systems, e.g., personal computers in portable forms or desktop forms, ATMs, various terminals to various electronic systems, databases, or information systems for commercial or governmental uses, motorized transportation systems including automobiles, boats, trains, aircraft and others.

Fingerprint sensing is useful in mobile applications and other applications that use or require secure access. For example, fingerprint sensing can be used to provide secure access to a mobile device and secure financial transactions including online purchases. It is desirable to include robust and reliable fingerprint sensing suitable for mobile devices and other applications. In mobile, portable or wearable devices, it is desirable for fingerprint sensors to minimize or eliminate the footprint for fingerprint sensing given the limited space on those devices, especially considering the demands for a maximum display area on a given device.

The disclosed devices or systems in this patent document use optical sensing techniques to perform optical fingerprint sensing and other optical sensing operations. Notably, the optical sensing disclosed in this patent document can be used to optically capture a 2-dimensional spatial pattern of external ridges and valleys of a fingerprint or the internal fingerprint pattern and the topographical information of the internal fingerprint pattern that are associated with the external ridges and valleys of a finger under the finger skin. The internal fingerprint pattern and the topographical information of the internal fingerprint pattern are not just 2-dimensional pattern but also contain spatial information are 3-dimensional in nature due to the spatial variations in the internal tissues below the skin that support and give rise to the external ridges and valleys.

Overview of Disclosed Optical Sensing

The light produced by a display screen for displaying images can pass through the top surface of the display screen in order to be viewed by a user. A finger can touch the top surface and thus interacts with the light at the top surface to cause the reflected or scattered light at the surface area of the touch to carry spatial image information of the finger to return to the display panel underneath the top surface. In touch sensing display devices, the top surface is the touch sensing interface with the user and this interaction between the light for displaying images and the user finger or hand constantly occurs but such information-carrying light returning back to the display panel is largely wasted and is not used in most touch sensing devices. In various mobile or portable devices with touch sensing displays and fingerprint sensing functions, a fingerprint sensor tends to be a separate device from the display screen, either placed on the same surface of the display screen at a location outside the display screen area such as in the popular Apple iPhones® and Samsung Galaxy® smartphones, or placed on the backside of a smartphone, such as some new models of smart phones by Huawei®, Lenovo®, Xiaomi® or Google®, to avoid taking up valuable space for placing a large display screen on the front side. Those fingerprint sensors are separate devices from the display screens and thus need to be compact to save space for display and other functions while still providing reliable and fast fingerprint sensing with a spatial image resolution above a certain acceptable level. However, the need to be compact and small and the need to provide a high spatial image resolution in capturing a fingerprint pattern are in direct conflict with each other in many fingerprint sensors because a high spatial image resolution in capturing a fingerprint pattern in based on various suitable fingerprint sensing technologies (e.g., capacitive touch sensing or optical imaging) requires a large sensor area with a large number of sensing pixels.

The optical sensor technology disclosed herein uses the light for displaying images in a display screen that is returned from the top surface of the device display assembly for fingerprint sensing and other sensing operations. The returned light carries information of an object in touch with the top surface (e.g., a finger) and the capturing and detecting this returned light constitute part of the design considerations in implementing a particular optical sensor module located underneath the display screen. Because the top surface of the touch screen assembly is used as a fingerprint sensing area, the optical image of this touched area should be captured by an optical imaging sensor array inside the optical sensor module with a high image fidelity to the original fingerprint for robust fingerprint sensing. The optical sensor module can be designed to achieve this desired optical imaging by properly configuring optical elements for capturing and detecting the returned light.

The disclosed technology can be implemented to provide devices, systems, and techniques that perform optical sensing of human fingerprints and authentication for authenticating an access attempt to a locked computer-controlled device such as a mobile device or a computer-controlled system, that is equipped with a fingerprint detection module. The disclosed technology can be used for securing access to various electronic devices and systems, including portable or mobile computing devices such as laptops, tablets, smartphones, and gaming devices, and other electronic devices or systems such as electronic databases, automobiles, bank ATMs, etc.

The optical sensor technology disclosed here can be implemented to detect a portion of the light that is used for displaying images in a display screen where such a portion of the light for the display screen may be the scattered light, reflected light or some stray light. For example, in some implementations of the disclosed optical sensor technology for an OLED display screen or another display screen having light emitting display pixels without using backlight, the image light produced by the OLED display screen, at or near the OLED display screen's top surface, may be reflected or scattered back into the OLED display screen as returned light when encountering an object such as a user finger or palm, or a user pointer device like a stylus. Such returned light can be captured for performing one or more optical sensing operations using the disclosed optical sensor technology. Due to the use of the light from OLED display screen's own OLED pixels for optical sensing, an optical sensor module based on the disclosed optical sensor technology can be, in some implementations, specially designed to be integrated to the OLED display screen in a way that maintains the display operations and functions of the OLED display screen without interference while providing optical sensing operations and functions to enhance overall functionality, device integration and user experience of the electronic device such as a smart phone or other mobile/wearable device or other forms of electronic devices or systems.

For example, an optical sensor module based on the disclosed optical sensor technology can be coupled to a display screen having light emitting display pixels without using backlight (e.g., an OLED display screen) to sense a fingerprint of a person by using the above described returned light from the light produced by OLED display screen. In operation, a person's finger, either in direct touch with the OLED display screen or in a near proximity of the OLED display screen, can produce the returned light back into the OLED display screen while carrying information of a portion of the finger illuminated by the light output by the OLED display screen. Such information may include, e.g., the spatial pattern and locations of the ridges and valleys of the illuminated portion of the finger. Accordingly, the optical sensor module can be integrated to capture at least a portion of such returned light to detect the spatial pattern and locations of the ridges and valleys of the illuminated portion of the finger by optical imaging and optical detection operations. The detected spatial pattern and locations of the ridges and valleys of the illuminated portion of the finger can then be processed to construct a fingerprint pattern and to perform fingerprint identification, e.g., comparing with a stored authorized user fingerprint pattern to determine whether the detected fingerprint is a match as part of a user authentication and device access process. This optical sensing based fingerprint detection by using the disclosed optical sensor technology uses the OLED display screens as an optical sensing platform and can be used to replace existing capacitive fingerprint sensors or other fingerprint sensors that are basically self-contained sensors as "add-on" components without using light from display screens or using the display screens for fingerprint sensing for mobile phones, tablets and other electronic devices.

The disclosed optical sensor technology can be implemented in ways that use a display screen having light emitting display pixels (e.g., an OLED display screen) as an optical sensing platform by using the light emitted from the display pixels of the OLED display screens for performing fingerprint sensing or other optical sensing functions after such emitted light interacts with an area on the top touch surface touched by a finger. This intimate relationship between the disclosed optical sensor technology and the OLED display screen provides a unique opportunity for using an optical sensor module to provide both (1) additional optical sensing functions and (2) useful operations or control features in connection with the touch sensing aspect of the OLED display screen.

Notably, in some implementations, an optical sensor module based on the disclosed optical sensor technology can be coupled to the backside of the OLED display screen without requiring a designated area on the display surface side of the OLED display screen that would occupy a valuable device surface real estate in some electronic devices such as a smartphone, a tablet or a wearable device where the exterior surface area is limited. Such an optical sensor module can be placed under the OLED display screen that vertically overlaps with the display screen area, and, from the user's perspective, the optical sensor module is hidden behind the display screen area. In addition, because the optical sensing of such an optical sensor module is by detecting the light that is emitted by the OLED display screen and is returned from the top surface of the display area, the disclosed optical sensor module does not require a special sensing port or sensing area that is separate from the display screen area. Accordingly, different from fingerprint sensors in other designs, including, e.g., Apple's iPhone®/iPad® devices or Samsung Galaxy® smartphone models where the fingerprint sensor is located at a particular fingerprint sensor area or port (e.g., the home button) on the same surface of the display screen but located in a designated non-displaying zone that is outside the display screen area, the optical sensor module based on the disclosed optical sensor technology can be implemented in ways that would allow fingerprint sensing to be performed at a location on the OLED display screen by using unique optical sensing designs to route the returned light from the finger into an optical sensor and by providing proper optical imaging mechanism to achieve high resolution optical imaging sensing. In this regard, the disclosed optical sensor technology can be implemented to provide a unique on-screen fingerprint sensing configuration by using the same top touch sensing surface that displays images and provides the touch sensing operations without a separate fingerprint sensing area or port outside the display screen area.

Regarding the additional optical sensing functions beyond fingerprint detection, the optical sensing may be used to measure other parameters. For example, the disclosed optical sensor technology can measure a pattern of a palm of a person given the large touch area available over the entire OLED display screen (in contrast, some designated fingerprint sensors such as the fingerprint senor in the home button of Apple's iPhone®/iPad® devices have a rather small and designated off-screen fingerprint sensing area that is highly limited in the sensing area size that may not be suitable for sensing large patterns). For yet another example, the disclosed optical sensor technology can be used not only to use optical sensing to capture and detect a pattern of a finger or palm that is associated with a person, but also to use optical sensing or other sensing mechanisms to detect whether the captured or detected pattern of a fingerprint or palm is from a live person's hand by a "live finger" detection mechanism, which may be based on, for example, the different optical absorption behaviors of the blood at different optical wavelengths, the fact that a live person's finger tends to be moving or stretching due to the person's natural movement or motion (either intended or unintended) or pulsing when the blood flows through the person's body in connection with the heartbeat. In one implementation, the optical sensor module can detect a change in the returned light from a finger or palm due to the heartbeat/blood flow change and thus to detect whether there is a live heartbeat in the object presented as a finger or palm. The user authentication can be based on the combination of the both the optical sensing of the fingerprint/palm pattern and the positive determination of the presence of a live person to enhance the access control. For yet another example, the optical sensor module may include a sensing function for measuring a glucose level or a degree of oxygen saturation based on optical sensing in the returned light from a finger or palm. As yet another example, as a person touches the OLED display screen, a change in the touching force can be reflected in one or more ways, including fingerprint pattern deforming, a change in the contacting area between the finger and the screen surface, fingerprint ridge widening, or a change in the blood flow dynamics. Those and other changes can be measured by optical sensing based on the disclosed optical sensor technology and can be used to calculate the touch force. This touch force sensing can be used to add more functions to the optical sensor module beyond the fingerprint sensing.

With respect to useful operations or control features in connection with the touch sensing aspect of the OLED display screen, the disclosed optical sensor technology can provide triggering functions or additional functions based on one or more sensing results from the optical sensor module to perform certain operations in connection with the touch sensing control over the OLED display screen. For example, the optical property of a finger skin (e.g., the index of refraction) tends to be different from other artificial objects. Based on this, the optical sensor module may be designed to selectively receive and detect returned light that is caused by a finger in touch with the surface of the OLED display screen while returned light caused by other objects would not be detected by the optical sensor module. This object-selective optical detection can be used to provide useful user controls by touch sensing, such as waking up the smartphone or device only by a touch via a person's finger or palm while touches by other objects would not cause the device to wake up for energy efficient operations and to prolong the battery use. This operation can be implemented by a control based on the output of the optical sensor module to control the waking up circuitry operation of the OLED display screen which, most of the OLED pixels are put in a "sleep" mode by being turned off without emitting light while part of the OLED pixels in the OLED display screen are turned on in a flash mode to intermittently emit flash light to the screen surface for sensing any touch by a person's finger or palm. Another "sleep" mode configuration can be achieved by using one or more extra LED light sources built into the optical sensor module to produce the "sleep" mode wake-up sensing light flashes where all the OLED pixels are turned off during the sleep mode so that the optical sensor module can detect returned light of such wake-up sensing light caused by the finger touch on the OLED display screen and, upon a positive detection, the OLED pixels on the OLED display screen are turned on or "woken up". In some implementations, the wake-up sensing light can be in the infrared invisible spectral range so a user will not experience any visual of a flash light. For another example, the fingerprint sensing by the optical sensor module is based on sensing of the returned light from the surface of the OLED display screen in the course of the normal OLED display screen operation, the OLED display screen operation can be controlled to provide an improved fingerprint sensing by eliminating background light for optical sensing of the fingerprint. In one implementation, for example, each display scan frame generates a frame of fingerprint signals. If, two frames of fingerprint signals with the display are generated in one frame when the OLED display screen is turned on and in the other frame when the OLED display screen is turned off, the subtraction between those two frames of signals can be used to reduce the ambient background light influence. By operating the fingerprint sensing frame rate is at one half of the display frame rate in some implementations, the background light noise in fingerprint sensing can be reduced.

As discussed above, an optical sensor module based on the disclosed optical sensor technology can be coupled to the backside of the OLED display screen without requiring creation of a designated area on the surface side of the OLED display screen that would occupy a valuable device surface real estate in some electronic devices such as a smartphone, a tablet or a wearable device. This aspect of the disclosed technology can be used to provide certain advantages or benefits in both device designs and product integration or manufacturing.

In some implementations, an optical sensor module based on the disclosed optical sensor technology can be configured as a non-invasive module that can be easily integrated to a display screen having light emitting display pixels (e.g., an OLED display screen) without requiring changing the design of the OLED display screen for providing a desired optical sensing function such as fingerprint sensing. In this regard, an optical sensor module based on the disclosed optical sensor technology can be independent from the design of a particular OLED display screen design due to the nature of the optical sensor module: the optical sensing of such an optical sensor module is by detecting the light that is emitted by the OLED display screen and is returned from the top surface of the display area, and the disclosed optical sensor module is coupled to the backside of the OLED display screen as a under-screen optical sensor module for receiving the returned light from the top surface of the display area and thus does not require a special sensing port or sensing area that is separate from the display screen area. Accordingly, such a under-screen optical sensor module can be used to combine with OLED display screens to provide optical fingerprint sensing and other sensor functions on an OLED display screen without using a specially designed OLED display screen with hardware especially designed for providing such optical sensing. This aspect of the disclosed optical sensor technology enables a wide range of OLED display screens in smartphones, tablets or other electronic devices with enhanced functions from the optical sensing of the disclosed optical sensor technology.

For example, for an existing phone assembly design that does not provide a separate fingerprint sensor as in certain Apple iPhones® or Samsung Galaxy Models®, such an existing phone assembly design can integrate the under-screen optical sensor module as disclosed herein without changing the touch sensing-display screen assembly to provide an added on-screen fingerprint sensing function. Because the disclosed optical sensing does not require a separate designated sensing area or port as in the case of certain Apple iPhones®/Samsung Galaxy® phones with a front fingerprint senor outside the display screen area, or some smartphones with a designated rear fingerprint sensor on the backside like in some models by Huawei®, Xiaomi®, Google® or Lenovo®, the integration of the on-screen fingerprint sensing disclosed herein does not require a substantial change to the existing phone assembly design or the touch sensing display module that has both the touch sensing layers and the display layers. Based on the disclosed optical sensing technology in this document, no external sensing port and no extern hardware button are needed on the exterior of a device are needed for adding the disclosed optical sensor module for fingerprint sensing. The added optical sensor module and the related circuitry are under the display screen inside the phone housing and the fingerprint sensing can be conveniently performed on the same touch sensing surface for the touch screen.

For another example, due to the above described nature of the optical sensor module for fingerprint sensing, a smartphone that integrates such an optical sensor module can be updated with improved designs, functions and integration mechanism without affecting or burdening the design or manufacturing of the OLED display screens to provide desired flexibility to device manufacturing and improvements/upgrades in product cycles while maintaining the availability of newer versions of optical sensing functions to smartphones, tablets or other electronic devices using OLED display screens. Specifically, the touch sensing layers or the OLED display layers may be updated in the next product release without adding any significant hardware change for the fingerprint sensing feature using the disclosed under-screen optical sensor module. Also, improved on-screen optical sensing for fingerprint sensing or other optical sensing functions by such an optical sensor module can be added to a new product release by using a new version of the under-screen optical sensor module without requiring significant changes to the phone assembly designs, including adding additional optical sensing functions.

The above and other features of the disclosed optical sensor technology can be implemented to provide a new generation of electronic devices with improved fingerprint sensing and other sensing functions, especially for smartphones, tablets and other electronic devices with display screens having light emitting display pixels without using backlight (e.g., an OLED display screen) to provide various touch sensing operations and functions and to enhance the user experience in such devices.

In practical applications, the performance of optical sensing for fingerprint sensing and other sensing functions in an electronic device equipped with optical fingerprint sensing may be degraded by the presence of undesired background light from the environment where a portion of the background light may enter the optical sensor module. Such background light causes the optical detectors in the optical sensor module to produce a noise signal that undesirable reduces the signal to noise ratio of the optical fingerprint sensing detection. In some conditions, such background noise can be high to a degree that may overwhelm the signal level of the useful signal that carries the optical fingerprint information or other useful information (e.g., biometric information) and could potentially cause unreliable optical sensing operation or even malfunction of the optical sensing. For example, one of sources for the undesired background light at the optical sensor module may be from the daylight from the sun and the impact of the sunlight can be particularly problematic for outdoor operations or in a sheltered environment with strong sunlight. For another example, other light sources present at locations at or near the location of the device with the disclosed optical fingerprint sensing may also lead to the undesired background light at the optical sensor module.

The undesired impact of the background light at the optical sensor module may be mitigated by reducing the amount of the undesired background light that can enter the optical sensor module, enhancing the optical signal level of the optical sensing signal carrying the fingerprint or other useful information beyond the signal level by using the returned OLED display light, or a combination of both background reduction and enhancing optical sensing signal level. In implementations, the background reduction can be achieved by using one or more optical filtering mechanisms in connection with the under-screen optical sensor module. In enhancing the optical signal level of the optical sensing signal carrying the fingerprint or other useful information, one or more extra illumination light sources may be added to the device to provide additional optical illumination light beyond the signal level caused by the returned OLED display light.

Using extra illumination light sources for optical fingerprint sensing and other optical sensing functions can also provide independent control over various features in providing illumination light for optical sensing, e.g., the selection of the illumination light wavelengths separate from the OLED display light in terms of the optical transmission property of human tissues, providing illumination for optical sensing operations beyond the spectral range in the OLED display light, controlling the mode of the illumination for optical sensing such as the timing or/and duration of illumination separate from the OLED display light, achieving a sufficiently high illumination level while maintaining an efficient use of power to prolong the battery operating time (an important factor for mobile computing or communication devices), and strategic placing the extra illumination light sources at certain locations to achieve illumination configurations that are difficult or impossible when using the OLED display light for illumination for optical sensing.

In addition, unlike many fingerprint sensing technologies that detect 2-dimensional spatial pattern of a fingerprint, the disclosed optical fingerprint sensing technology can be implemented to capture not only a 2-dimensional spatial pattern of external ridges and valleys of a fingerprint but also internal fingerprint pattern associated with the external ridges and valleys of a finger under the finger skin. The disclosed optical fingerprint sensing by capturing information on the internal fingerprint pattern associated with the external ridges and valleys of a finger under the finger skin is substantially immune from the contact conditions between the finger and the top touch surface of the device (e.g., dirty contact surface) and the conditions of the external finger skin condition (e.g., dirty, dry or wet fingers, or reduced external variations between ridges and valleys in fingers of certain users such as aged users), In implementations of the disclosed technical features, additional sensing functions or sensing modules, such as a biomedical sensor, e.g., a heartbeat sensor in wearable devices like wrist band devices or watches, may be provided. In general, different sensors can be provided in electronic devices or systems to achieve different sensing operations and functions.

General Architecture of Optical Sensing Modules

FIG. 1 is a block diagram of an example of a system 180 with a fingerprint sensing module 180 including a fingerprint sensor 181 which can be implemented to include an optical fingerprint sensor based on the optical sensing of fingerprints as disclosed in this document. The system 180 includes a fingerprint sensor control circuit 184, and a digital processor 186 which may include one or more processors for processing fingerprint patterns and determining whether an input fingerprint pattern is one for an authorized user. The fingerprint sensing system 180 uses the fingerprint sensor 181 to obtain a fingerprint and compares the obtained fingerprint to a stored fingerprint to enable or disable functionality in a device or system 188 that is secured by the fingerprint sensing system 180. In operation, the access to the device 188 is controlled by the fingerprint processing processor 186 based on whether the captured user fingerprint is from an authorized user. As illustrated, the fingerprint sensor 181 may include multiple fingerprint sensing pixels such as pixels 182A-182E that collectively represent at least a portion of a fingerprint. For example, the fingerprint sensing system 180 may be implemented at an ATM as the system 188 to determine the fingerprint of a customer requesting to access funds or other transactions. Based on a comparison of the customer's fingerprint obtained from the fingerprint sensor 181 to one or more stored fingerprints, the fingerprint sensing system 180 may, upon a positive identification, cause the ATM system 188 to grant the requested access to the user account, or, upon a negative identification, may deny the access. For another example, the device or system 188 may be a smartphone or a portable device and the fingerprint sensing system 180 is a module integrated to the device 188. For another example, the device or system 188 may be a gate or secured entrance to a facility or home that uses the fingerprint sensor 181 to grant or deny entrance. For yet another example, the device or system 188 may be an automobile or other vehicle that uses the fingerprint sensor 181 to link to the start of the engine and to identify whether a person is authorized to operate the automobile or vehicle.

The sensor device 181 in FIG. 1 can be an optical sensor module that is separated from a display panel as a separate module but is placed under the display panel for using a portion of the display surface for optical sensing of fingerprints and additional optical sensing functions. Examples of this design are illustrated in FIGS. 2A through 2D.

Figure 2A:
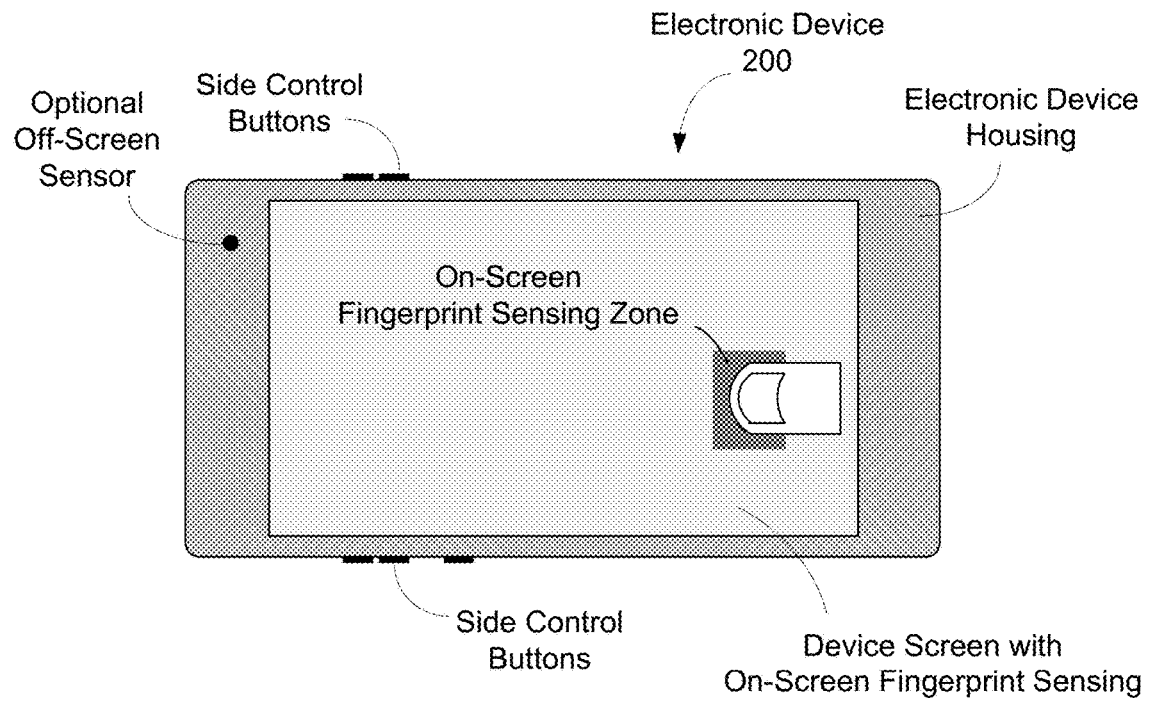
FIGS. 2A and 2B illustrate one exemplary implementation of an electronic device 200 having a touch sensing display screen assembly and an optical sensor module positioned underneath the touch sensing display screen assembly.
Figure 2B:
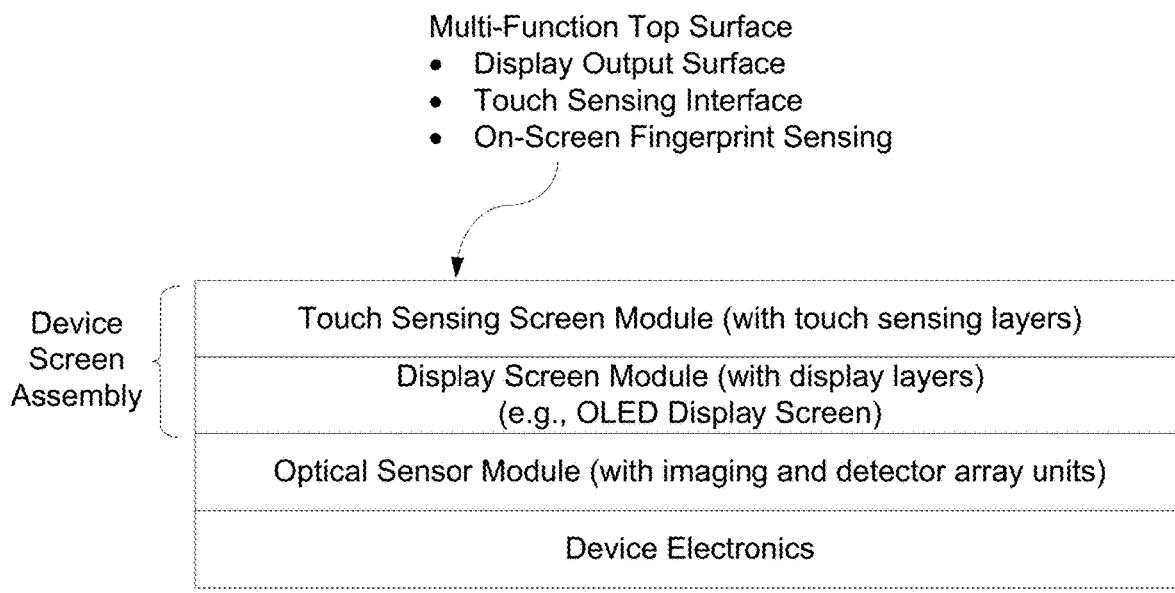

As a specific example, FIGS. 2A and 2B illustrate one exemplary implementation of an electronic device 200 having a touch sensing display screen assembly and an optical sensor module positioned underneath the touch sensing display screen assembly. In this particular example, the display technology can be implemented by an OLED display screen or another display screen having light emitting display pixels without using backlight. The electronic device 200 can be a portable device such as a smartphone or a tablet and can be the device 188 as shown in FIG. 1.

FIG. 2A shows the front side of the device 200 which may resemble some features in some existing smartphones or tablets. The device screen is on the front side of the device 200 occupying either entirety, a majority or a significant portion of the front side space and the fingerprint sensing function is provided on the device screen, e.g., one or more sensing areas for receiving a finger on the device screen. As an example, FIG. 2A shows a fingerprint sensing zone in the device screen for a finger to touch which may be illuminated as a visibly identifiable zone or area for a user to place a finger for fingerprint sensing. Such a fingerprint sensing zone can function like the rest of the device screen for displaying images. As illustrated, the device housing of the device 200 may have, in various implementations, side facets that support side control buttons that are common in various smartphones on the market today. Also, one or more optional sensors may be provided on the front side of the device 200 outside the device screen as illustrated by one example on the left upper corner of the device housing in FIG. 2A.

FIG. 2B shows an example of the structural construction of the modules in the device 200 relevant to the optical fingerprint sensing disclosed in this document. The device screen assembly shown in FIG. 2B includes, e.g., the touch sensing screen module with touch sensing layers on the top, and a display screen module with display layers located underneath the touch sensing screen module. An optical sensor module is coupled to, and located underneath, the display screen assembly module to receive and capture the returned light from the top surface of the touch sensing screen module and to guide and image the returned light onto an optical sensor array of optical sensing pixels or photodetectors which convert the optical image in the returned light into pixel signals for further processing. Underneath the optical sensor module is the device electronics structure containing certain electronic circuits for the optical sensor module and other parts in the device 200. The device electronics may be arranged inside the device housing and may include a part that is under the optical sensor module as shown in FIG. 2B.

In implementations, the top surface of the device screen assembly can be a surface of an optically transparent layer serving as a user touch sensing surface to provide multiple functions, such as (1) a display output surface through which the light carrying the display images passes through to reach a viewer's eyes, (2) a touch sensing interface to receive a user's touches for the touch sensing operations by the touch sensing screen module, and (3) an optical interface for on-screen fingerprint sensing (and possibly one or more other optical sensing functions). This optically transparent layer can be a rigid layer such as a glass or crystal layer or a flexible layer.

One example of a display screen having light emitting display pixels without using backlight is an OLED display having an array of individual emitting pixels, and a thin film transistor (TFT) structure or substrate which may include arrays of small holes and may be optically transparent and a cover substrate to protect the OLED pixels. Referring to FIG. 2B, the optical sensor module in this example is placed under the OLED display panel to capture the returned light from the top touch sensing surface and to acquire high resolution images of fingerprint patterns when user's finger is in touch with a sensing area on the top surface. In other implementations, the disclosed under-screen optical sensor module for fingerprint sensing may be implemented on a device without the touch sensing feature. In addition, a suitable display panel may be in various screen designs different from OLED displays.

Figure 2C:
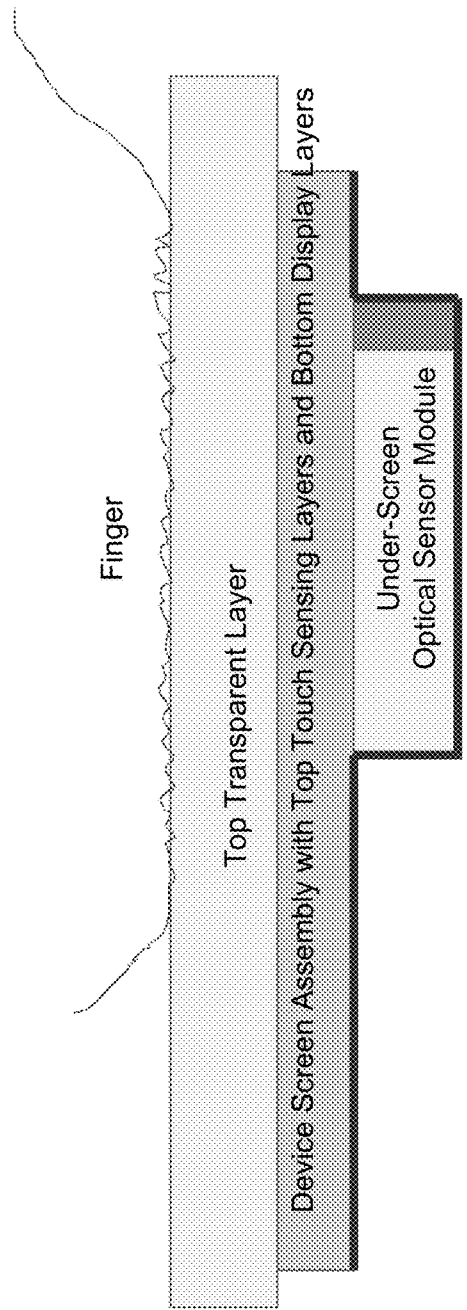
FIGS. 2C and 2D illustrate an example of a device that implements the optical sensor module in FIGS. 2A and 2B.
Figure 2D:
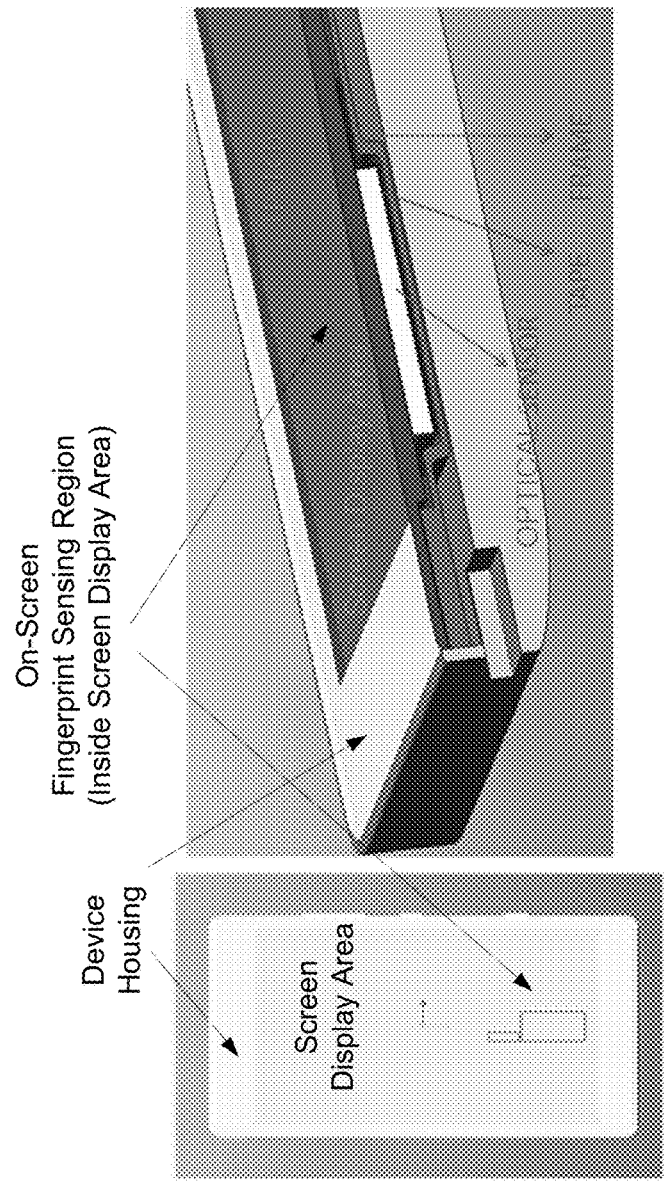

FIGS. 2C and 2D illustrate an example of a device that implements the optical sensor module in FIGS. 2A and 2B. FIG. 2C shows a cross sectional view of a portion of the device containing the under-screen optical sensor module. FIG. 2D shows, on the left, a view of the front side of the device with the touch sensing display indicating a fingerprint sensing area on the lower part of the display screen, and on the right, a perspective view of a part of the device containing the optical sensor module that is under the device display screen assembly. FIG. 2D also shows an example of the layout of the flexible tape with circuit elements.

In the design examples in FIGS. 2A, 2B, 2C and 2D, the optical fingerprint sensor design is different from some other fingerprint sensor designs using a separate fingerprint sensor structure from the display screen with a physical demarcation between the display screen and the fingerprint sensor (e.g., a button like structure in an opening of the top glass cover in some mobile phone designs) on the surface of the mobile device. In the illustrated designs here, the optical fingerprint sensor for detecting fingerprint sensing and other optical signals are located under the top cover glass or layer (e.g., FIG. 2C) so that the top surface of the cover glass serves as the top surface of the mobile device as a contiguous and uniform glass surface across both the display screen layers and the optical detector sensor that are vertically stacked and vertically overlap. This design for integrating optical fingerprint sensing and the touch sensitive display screen under a common and uniform surface provides benefits, including improved device integration, enhanced device packaging, enhanced device resistance to exterior elements, failure and wear and tear, and enhanced user experience over the ownership period of the device.

Figure 2E:
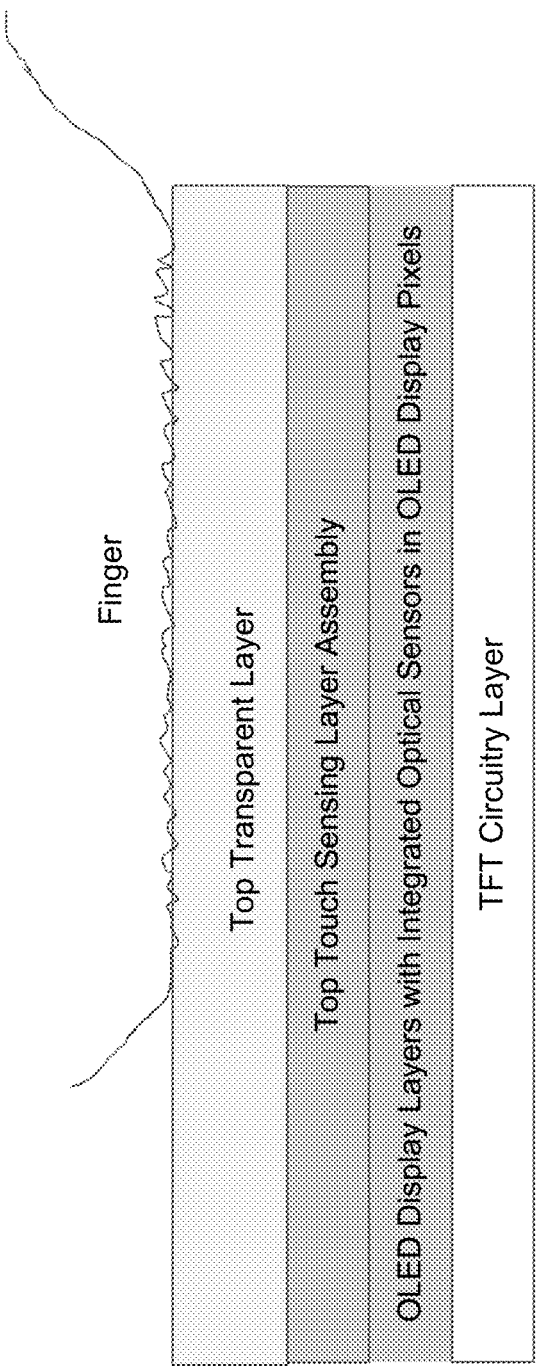
FIGS. 2E, 2F and 2G show examples of interleaving optical sensors with OLED pixels in the OLED display panel for optical sensing.
Figure 2F:
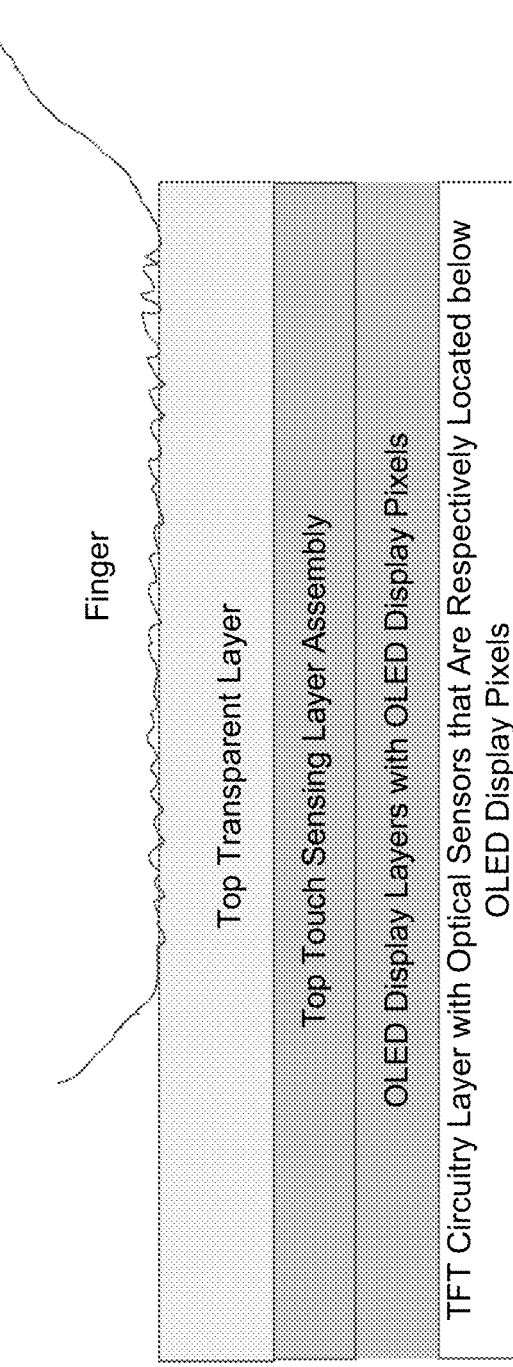
Figure 2G:
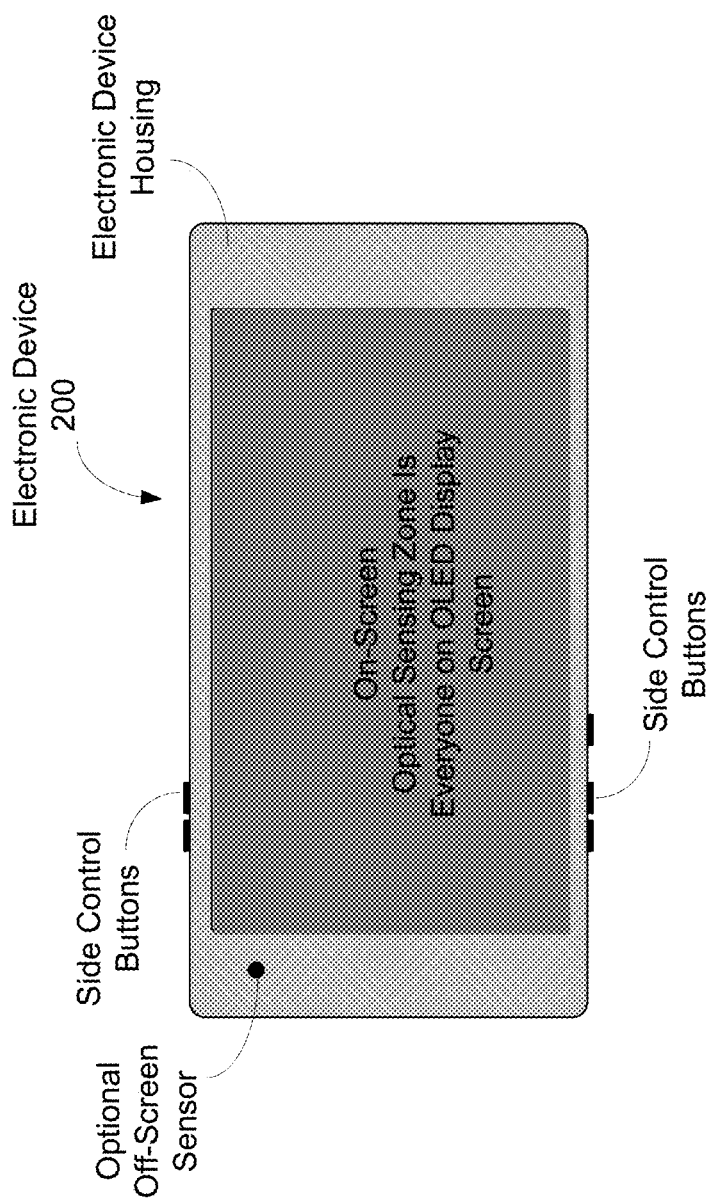

In other designs, the sensor device 181 in FIG. 1 can be an optical sensor module that is integrated to the display panel to utilize the entire display surface as an optical sensing surface for sensing a fingerprint or other patterns (e.g., palm patterns or facial patterns) where the optical sensors of the optical sensor array are spatially interleaved with the display pixels of the display panel so that the entire display surface can be used as an optical sensing surface for sensing a fingerprint or other patterns (e.g., palm patterns or facial patterns) while also serving as a display panel for displaying images, graphics, text and video contents. FIGS. 2E, 2F and 2G show examples of such designs and FIGS. 15 through 20 provide additional implementation examples.

In FIG. 2E, the optical sensors or photodetectors of the optical sensor array can be integrated with the light emitting pixels of an organic light emitting diode display (OLED) panel so that a unit color pixel having OLED pixels of different emitting colors includes at least one optical sensor. Implementations, the optical sensors (e.g., photodiodes) and the OLED pixels are grown over the same substrate along with other layers such as TFT circuitry layer electrically coupled to the OLED pixels and the optical sensors.

FIG. 2F shows another example in which the optical sensors or photodetectors of the optical sensor array can be formed outside the OLED pixel layer of the OLED display panel but are directly formed in a thin film transistor (TFT) layer on the same substrate for forming the OLED display pixel layer as a display size photodetector array to use the entire OLED display panel surface as an optical sensing surface.

In addition to the examples in FIGS. 2E and 2F, the optical sensors or photodetectors of the optical sensor array can be formed in a separate substrate from the OLED substrate for forming the OLED pixels as a display size photodetector array to use the entire OLED display panel surface as an optical sensing surface. In such implementations, the optical sensors of the optical sensor array on the separate substrate are arranged to spatially correspond to the OLED pixels on the OLED substrate so that once the OLED structure and the optical sensor module structured are integrated or engaged, the optical sensors of the optical sensor module and the OLED pixels of the OLED structure are spatially overlapped and interleaved so that the optical sensors are distributed over the entire OLED pixel array for optical sensing.

FIG. 2G shows an example that the entire OLED display panel can be operated as an optical sensing surface due to the presence of optical sensors that are spatially distributed and interleaved with the OLED pixels. In comparison with the example in FIG. 2A where a smaller optical sensor array is placed underneath the display panel to use a small area of the display panel surface as an optical sensing surface, the full display size optical sensing area in FIG. 2G provides a large optical sensing surface for not only sending fingerprints but other larger patterns such as palm prints or facial patterns.

Figure 3:
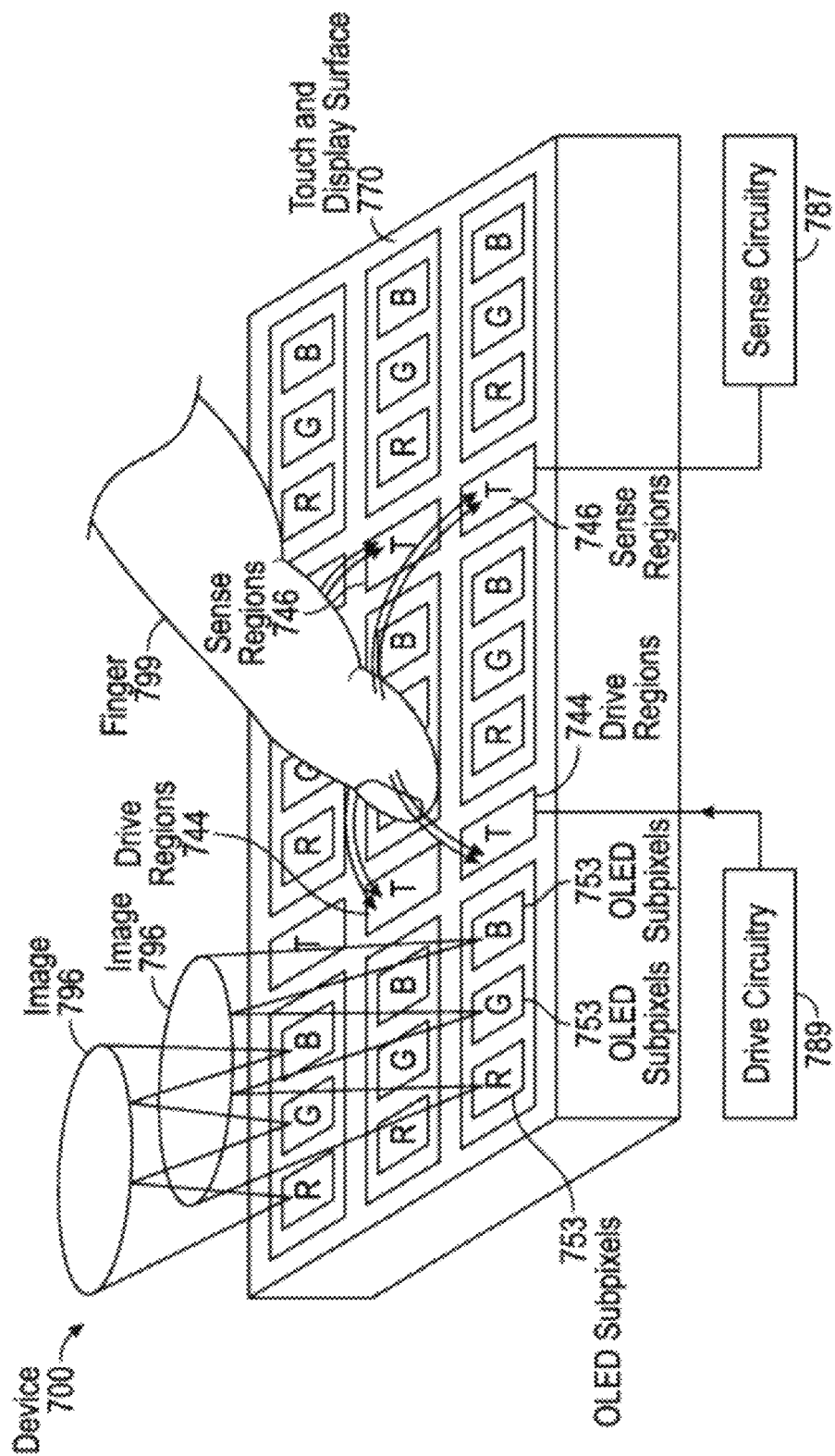
FIG. 3 illustrates one example of an OLED display and touch sensing assembly suitable for implementing the disclosed optical fingerprint sensing technology.

Various OLED display designs and touch sensing designs can be used for the device screen assembly above the optical sensor module in FIGS. 2A, 2B, 2C and 2D. FIG. 3 illustrates one example of an OLED display and touch sensing assembly, which is FIG. 7B of U.S. Patent Publication No. US 2015/0331508 A1 published on Nov. 19, 2015, a patent application entitled "Integrated Silicon-OLED Display and Touch Sensor Panel" by Apple, Inc., which is incorporated by reference as part of the disclosure of this patent document. OLEDs can be implemented in various types or configurations, including, but not limited to, passive-matrix OLEDs (PMOLEDs), active-matrix OLEDs (AMOLEDs), transparent OLEDs, cathode-common OLEDs, anode-common OLEDs, White OLEDs (WOLEDs), and RGB-OLEDs. The different types of OLEDs can have different uses, configurations, and advantages. In the example of a system having an integrated Silicon-OLED display and touch sensor panel, the system can include a Silicon substrate, an array of transistors, one or more metallization layers, one or more vias, an OLED stack, color filters, touch sensors, and additional components and circuitry. Additional components and circuitry can include an electrostatic discharge device, a light shielding, a switching matrix, one or more photodiodes, a near-infrared detector and near-infrared color filters. The integrated Silicon-OLED display and touch sensor panel can be further configured for near-field imaging, optically-assisted touch, and fingerprint detection. In some examples, a plurality of touch sensors and/or display pixels can be grouped into clusters, and the clusters can be coupled to a switching matrix for dynamic change of touch and/or display granularity. In the OLED example in FIG. 3 and other implementations, touch sensors and touch sensing circuitry can include, for example, touch signal lines, such as drive lines and sense lines, grounding regions, and other circuitry. One way to reduce the size of an integrated touch screen can be to include multi-function circuit elements that can form part of the display circuitry designed to operate as circuitry of the display system to generate an image on the display. The multi-function circuit elements can also form part of the touch sensing circuitry of a touch sensing system that can sense one or more touches on or near the display. The multi-function circuit elements can be, for example, capacitors in display pixels of an LCD that can be configured to operate as storage capacitors/electrodes, common electrodes, conductive wires/pathways, etc., of the display circuitry in the display system, and that can also be configured to operate as circuit elements of the touch sensing circuitry. The OLED display example in FIG. 3 can be implemented to include multi-touch functionality to an OLED display without the need of a separate multi-touch panel or layer overlaying the OLED display. The OLED display, display circuitry, touch sensors, and touch circuitry can be formed on a Silicon substrate. By fabricating the integrated OLED display and touch sensor panel on a Silicon substrate, extremely high pixels per inch (PPI) can be achieved. Other arrangements different from FIG. 3 for the OLED and touch sensing structures are also possible. For example, the touch sensing layers can be an assembly that is located on top of the OLED display assembly.

Referring back to FIGS. 2A and 2B, the illustrated under-screen optical sensor module for on-screen fingerprint sensing may be implemented in various configurations.

In one implementation, a device based on the above design can be structured to include a device screen that provides touch sensing operations and includes a display panel structure having light emitting display pixels each operable to emit light for forming a display image, a top transparent layer formed over the device screen as an interface for being touched by a user for the touch sensing operations and for transmitting the light from the display structure to display images to a user, and an optical sensor module located below the display panel structure to receive light that is emitted by at least a portion of the light emitting display pixels of the display structure and is returned from the top transparent layer to detect a fingerprint.

This device can be further configured with various features.

For example, a device electronic control module can be included in the device to grant a user's access to the device if a detected fingerprint matches a fingerprint an authorized user. In addition, the optical sensor module is configured to, in addition to detecting fingerprints, also detect a biometric parameter different form a fingerprint by optical sensing to indicate whether a touch at the top transparent layer associated with a detected fingerprint is from a live person, and the device electronic control module is configured to grant a user's access to the device if both (1) a detected fingerprint matches a fingerprint an authorized user and (2) the detected biometric parameter indicates the detected fingerprint is from a live person. The biometric parameter can include, e.g., whether the finger contains a blood flow, or a heartbeat of a person.

For example, the device can include a device electronic control module coupled to the display panel structure to supply power to the light emitting display pixels and to control image display by the display panel structure, and, in a fingerprint sensing operation, the device electronic control module operates to turn off the light emitting display pixels in one frame to and turn on the light emitting display pixels in a next frame to allow the optical sensor array to capture two fingerprint images with and without the illumination by the light emitting display pixels to reduce background light in fingerprint sensing.

For another example, a device electronic control module may be coupled to the display panel structure to supply power to the light emitting display pixels and to turn off power to the light emitting display pixels in a sleep mode, and the device electronic control module may be configured to wake up the display panel structure from the sleep mode when the optical sensor module detects the presence of a person's skin at the designated fingerprint sensing region of the top transparent layer. More specifically, in some implementations, the device electronic control module can be configured to operate one or more selected light emitting display pixels to intermittently emit light, while turning off power to other light emitting display pixels, when the display panel structure is in the sleep mode, to direct the intermittently emitted light to the designated fingerprint sensing region of the top transparent layer for monitoring whether there is a person's skin in contact with the designated fingerprint sensing region for waking up the device from the sleep mode. Also, the display panel structure may be designed to include one or more LED lights in addition to the light emitting display pixels, and the device electronic control module may be configured to operate the one or more LED lights to intermittently emit light, while turning off power to light emitting display pixels when the display panel structure is in the sleep mode, to direct the intermittently emitted light to the designated fingerprint sensing region of the top transparent layer for monitoring whether there is a person's skin in contact with the designated fingerprint sensing region for waking up the device from the sleep mode.

For another example, the device can include a device electronic control module coupled to the optical sensor module to receive information on multiple detected fingerprints obtained from sensing a touch of a finger and the device electronic control module is operated to measure a change in the multiple detected fingerprints and determines a touch force that causes the measured change. For instance, the change may include a change in the fingerprint image due to the touch force, a change in the touch area due to the touch force, or a change in spacing of fingerprint ridges.

For another example, the top transparent layer can include a designated fingerprint sensing region for a user to touch with a finger for fingerprint sensing and the optical sensor module below the display panel structure can include a transparent block in contact with the display panel substrate to receive light that is emitted from the display panel structure and returned from the top transparent layer, an optical sensor array that receives the light and an optical imaging module that images the received light in the transparent block onto the optical sensor array. The optical sensor module can be positioned relative to the designated fingerprint sensing region and structured to selectively receive returned light via total internal reflection at the top surface of the top transparent layer when in contact with a person's skin while not receiving the returned light from the designated fingerprint sensing region in absence of a contact by a person's skin.

For yet another example, the optical sensor module can be structured to include an optical wedge located below the display panel structure to modify a total reflection condition on a bottom surface of the display panel structure that interfaces with the optical wedge to permit extraction of light out of the display panel structure through the bottom surface, an optical sensor array that receives the light from the optical wedge extracted from the display panel structure, and an optical imaging module located between the optical wedge and the optical sensor array to image the light from the optical wedge onto the optical sensor array.

Specific examples of under-screen optical sensor modules for on-screen fingerprint sensing are provided below.

Figure 4A:
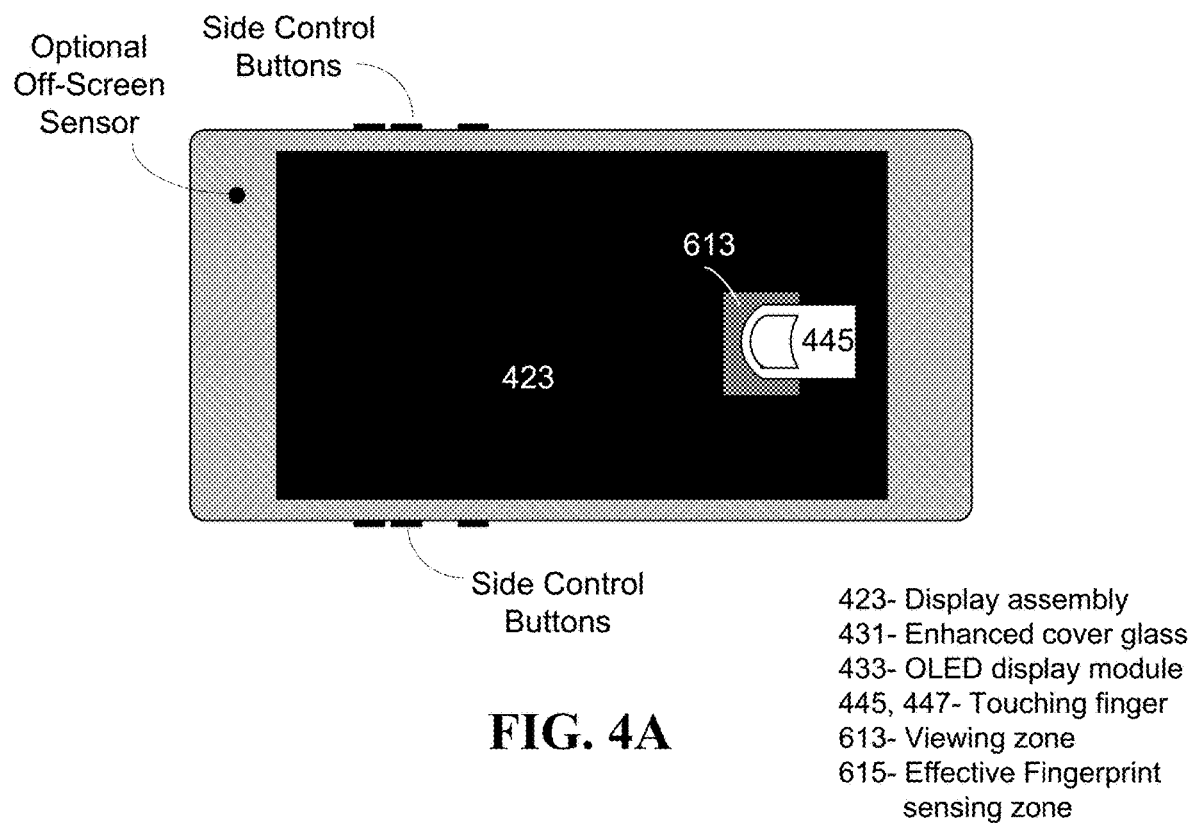
FIGS. 4A and 4B show an example of one implementation of an optical sensor module under the display screen assembly for implementing the design in FIGS. 2A and 2B.
Figure 4B:
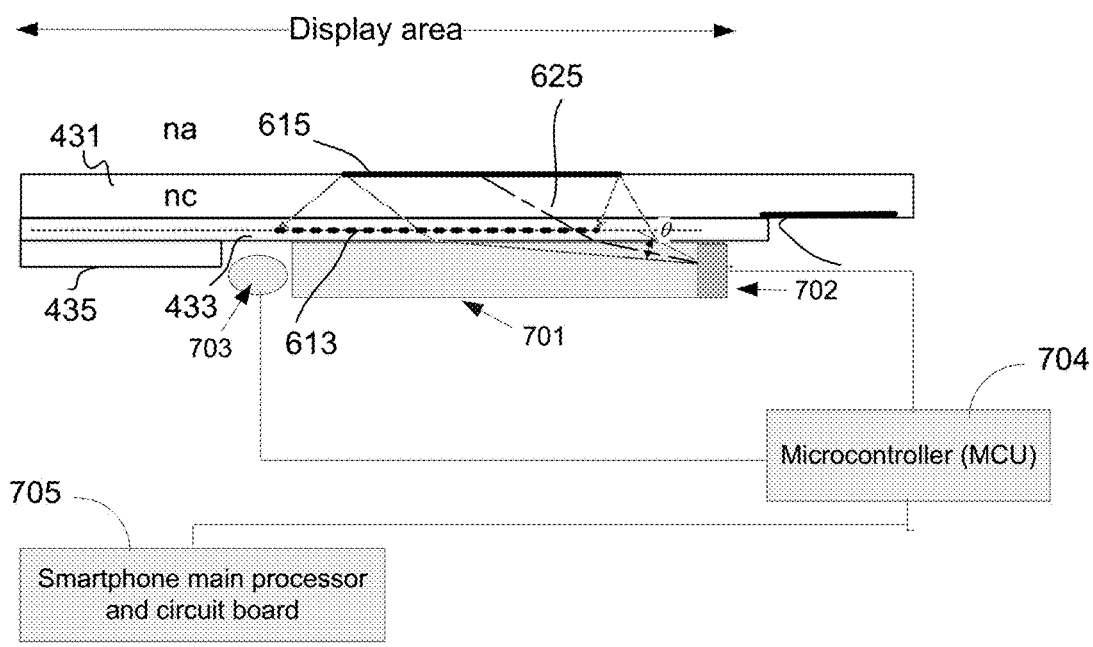

FIG. 4A and FIG. 4B show an example of one implementation of an optical sensor module under the display screen assembly for implementing the design in FIGS. 2A and 2B. The device in FIGS. 4A-4B includes a display assembly 423 with a top transparent layer 431 formed over the device screen assembly 423 as an interface for being touched by a user for the touch sensing operations and for transmitting the light from the display structure to display images to a user. This top transparent layer 431 can be a cover glass or a crystal material in some implementations. The device screen assembly 423 can include an OLED display module 433 under the top transparent layer 431. The OLED display module 433 includes, among others, OLED layers including an array of OLED pixels that emit light for displaying images. The OLED layers have electrodes and wiring structure optically acting as an array of holes and light scattering objects. The array of holes in the OLED layers allows transmission of light from the top transparent layer 431 through the OLED layers to reach the optical sensor module under the OLED layers and the light scattering caused by the OLED layers affects the optical detection by the under-screen optical sensor module for fingerprint sensing. A device circuit module 435 may be provided under the OLED display panel to control operations of the device and perform functions for the user to operate the device.

The optical sensor module in this particular implementation example is placed under OLED display module 433. The OLED pixels in a fingerprint illumination zone 613 can be controlled to emit light to illuminate the fingerprint sensing zone 615 on the top transparent layer 431 within the device screen area for a user to place a finger therein for fingerprint identification. As illustrated, a finger 445 is placed in the illuminated fingerprint sensing zone 615 as the effective sensing zone for fingerprint sensing. A portion of the reflected or scattered light in the zone 615 illuminated by the OLED pixels in the fingerprint illumination zone 613 is directed into the optical sensor module underneath the OLED display module 433 and a photodetector sensing array inside the optical sensor module receives such light and captures the fingerprint pattern information carried by the received light.

In this design of using the OLED pixels in the fingerprint illumination zone 613 within the OLED display panel to provide the illumination light for optical fingerprint sensing, the OLED pixels in the fingerprint illumination zone 613 can be controlled to turn on intermittently with a relatively low cycle to reduce the optical power used for the optical sensing operations. For example, while the rest of the OLED pixels in the OLED panel are turned off (e.g., in a sleep mode), the OLED pixels in the fingerprint illumination zone 613 can be turned on intermittently to emit illumination light for optical sensing operations, including performing optical fingerprint sensing and waking up the OLED panel. The fingerprint sensing operation can be implemented in a 2-step process in some implementations: first, a few of the OLED pixels in the fingerprint illumination zone 613 within the OLED display panel are turned on in a flashing mode without turning on other OLED pixels in the fingerprint illumination zone 613 to use the flashing light to sense whether a finger touches the sensing zone 615 and, once a touch in the zone 615 is detected, the OLED pixels in the fingerprint illumination zone 613 are turned on to activate the optical sensing module to perform the fingerprint sensing. Also, upon activating the optical sensing module to perform the fingerprint sensing, the OLED pixels in the fingerprint illumination zone 613 may be operated at a brightness level to improve the optical detection performance for fingerprint sensing, e.g., at a higher brightness level than their bright level in displaying images.

In the example in FIG. 4B, the under-screen optical sensor module includes a transparent block 701 that is coupled to the display panel to receive the returned light from the top surface of the device assembly that is initially emitted by the OLED pixels in the fingerprint sensing zone 613, and an optical imaging block 702 that performs the optical imaging and imaging capturing. Light from OLED pixels in the fingerprint illumination zone 613, after reaching the cover top surface, e.g., the cover top surface at the sensing area 615 where a user finger touches, is reflected or scattered back from the cover top surface. When fingerprint ridges in close contact of the cover top surface in the sensing area 615, the light reflection under the fingerprint ridges is different, due to the presence of the skin or tissue of the finger in contact at that location, from the light reflection at another location under the fingerprint valley, where the skin or tissue of the finger is absent. This difference in light reflection conditions at the locations of the ridges and valleys in the touched finger area on the cover top surface forms an image representing an image or spatial distribution of the ridges and valleys of the touched section of the finger. The reflection light is directed back towards the OLED pixels, and, after passing through the small holes of the OLED display module 433, reaches the interface with the low index optically transparent block 701 of the optical sensor module. The low index optically transparent block 701 is constructed to have a refractive index less than a refractive index of the OLED display panel so that the returned light can be extracted out of the OLED display panel into the optically transparent block 701. Once the returned light is received inside the optically transparent block 701, such received light enters the optical imaging unit as part of the imaging sensing block 702 and is imaged onto the photodetector sensing array or optical sensing array inside the block 702. The light reflection differences between fingerprint ridges and valleys create the contrast of the fingerprint image. As shown in FIG. 4B is a control circuit 704 (e.g., a microcontroller or MCU) which is coupled to the imaging sensing block 702 and to other circuitry such as the device main processor 705 on a main circuit board.

In this particular example, the optical light path design is such the light ray enters the cover top surface within the total reflect angles on the top surface between the substrate and air interface will get collected most effectively by the imaging optics and imaging sensor array in the block 702. In this design the image of the fingerprint ridge/valley area exhibits a maximum contrast. Such an imaging system may have undesired optical distortions that would adversely affect the fingerprint sensing. Accordingly, the acquired image may be further corrected by a distortion correction during the imaging reconstruction in processing the output signals of the optical sensor array in the block 702 based on the optical distortion profile along the light paths of the returned light at the optical sensor array. The distortion correction coefficients can be generated by images captured at each photodetector pixel by scanning a test image pattern one line pixel at a time, through the whole sensing area in both X direction lines and Y direction lines. This correction process can also use images from tuning each individual pixel on one at a time, and scanning through the whole image area of the photodetector array. This correction coefficients only need to be generated one time after assembly of the sensor.

The background light from environment (e.g., sun light or room light) may enter the image sensor through OLED panel top surface, through TFT substrate holes in the OLED display assembly 433. Such background light can create a background baseline in the interested images from fingers and is undesirable. Different methods can be used to reduce this baseline intensity. One example is to turn on and off the OLED pixels in the fingerprint illumination zone 613 at a certain frequency F and the image sensor accordingly acquires the received images at the same frequency by phase synchronizing the pixel driving pulse and image sensor frame. Under this operation, only one of the image phases has the lights emitted from pixels. By subtracting even and odd frames, it is possible to obtain an image which most consists of light emitted from the modulated OLED pixels in the fingerprint illumination zone 613. Based on this design, each display scan frame generates a frame of fingerprint signals. If two sequential frames of signals by turning on the OLED pixels in the fingerprint illumination zone 613 in one frame and off in the other frame are subtracted, the ambient background light influence can be minimized or substantially eliminated. In implementations, the fingerprint sensing frame rate can be one half of the display frame rate.

A portion of the light from the OLED pixels in the fingerprint illumination zone 613 may also go through the cover top surface, and enter the finger tissues. This part of light power is scattered around and a part of this scattered light may go through the small holes on the OLED panel substrate, and is eventually collected by the imaging sensor array in the optical sensor module. The light intensity of this scattered light depends on the finger's skin color, the blood concentration in the finger tissue and this information carried by this scattered light on the finger is useful for fingerprint sensing and can be detected as part of the fingerprint sensing operation. For example, by integrating the intensity of a region of user's finger image, it is possible to observe the blood concentration increase/decrease depends on the phase of the user's heart-beat. This signature can be used to determine the user's heart beat rate, to determine if the user's finger is a live finger, or to provide a spoof device with a fabricated fingerprint pattern.

Referring to the OLED display example in FIG. 3, an OLED display usually has different color pixels, e.g., adjacent red, green and blue pixels form one color OLED pixels. By controlling which color of pixels within each color pixel to turn on and recording corresponding measured intensity, the user's skin color may be determined. As an example, when a user registers a finger for fingerprint authentication operation, the optical fingerprint sensor also measures intensity of the scatter light from finger at color A, and B, as intensity Ia, Ib. The ratio of Ia/Ib could be recorded to compare with later measurement when user's finger is placed on the sensing area to measure fingerprint. This method can help reject the spoof device which may not match user's skin color.

In some implementations, to provide a fingerprint sensing operation using the above described optical sensor module when the OLED display panel is not turned on, one or more extra LED light sources 703 designated for providing fingerprint sensing illumination can be placed on the side of the transparent block 701 as shown in FIG. 4B. This designated LED light 703 can be controlled by the same electronics 704 (e.g., MCU) for controlling the image sensor array in the block 702. The designated LED light 703 can be pulsed for a short time, at a low duty cycle, to emit light intermittently and to provide pulse light for image sensing. The image sensor array can be operated to monitor the light pattern reflected off the OLED panel cover substrate at the same pulse duty cycle. If there is a human finger touching the sensing area 615 on the screen, the image that is captured at the imaging sensing array in the block 702 can be used to detect the touching event. The control electronics or MCU 704 connected to the image sensor array in the block 702 can be operated to determine if the touch is by a human finger touch. If it is confirmed that it is a human finger touch event, the MCU 704 can be operated to wake up the smartphone system, turn on the OLED display panel (or at least the off the OLED pixels in the fingerprint illumination zone 613 for performing the optical fingerprint sensing), and use the normal mode to acquire a full fingerprint image. The image sensor array in the block 702 will send the acquired fingerprint image to the smartphone main processor 705 which can be operated to match the captured fingerprint image to the registered fingerprint database. If there is a match, the smartphone will unlock the phone, and start the normal operation. If the captured image is not matched, the smartphone will feedback to user that the authentication is failed. User may try again, or input passcode.

In the example in FIG. 4 (specifically, FIG. 4B), the under-screen optical sensor module uses the optically transparent block 701 and the imaging sensing block 702 with the photodetector sensing array to optically image the fingerprint pattern of a touching finger in contact with the top surface of the display screen onto the photodetector sensing array. The optical imaging axis or detection axis 625 from the sensing zone 615 to the photodetector array in the block 702 is illustrated in FIG. 4B. The optically transparent block 701 and the front end of the imaging sensing block 702 before the photodetector sensing array form a bulk imaging module to achieve proper imaging for the optical fingerprint sensing. Due to the optical distortions in this imaging process, a distortion correction can be used, as explained above, to achieve the desired imaging operation.

2-Dimensional Optical Reflective Pattern from a Finger

When probe light is directed to a finger, a portion of the probe light can be reflected, diffracted or scattered at the finger skin surface to produce reflected, diffracted or scattered probe light without entering the internal side of the finger. This portion of the probe light without entering the finger can carry a 2-dimensional optical reflective pattern across the reflected probe light beam caused by the external ridges and valleys of the finger and can be detected to obtain the fingerprint pattern of the external ridges and valleys. This is explained with reference to the examples in FIGS. 5A and 5B in this subsection.

In addition, a portion of the probe light may enter the finger and is scattered by the internal tissues in the finger. Depending on the optical wavelength of the probe light inside the finger, the internal tissues in the finger be optically absorptive and thus can be severally attenuated except for probe light in an optical transmission spectral range roughly from 590 nm and 950 nm. The probe light that can transmit through the finger tissues carries an optical transmissive pattern across the beam and this transmitted probe light beam can carry both a 2-dimensional pattern of the ridges and valleys and an additional topographical information of the internal issues associated with the ridges and valleys due to the internal path through such internal tissues before exiting the finger skin. This optical transmissive pattern is explained with reference to examples in FIGS. 5C and 5D in the next subsection.

In the optical sensing by the under-screen optical sensor module in FIGS. 4A-4B and other designs disclosed herein, the optical signal from the sensing zone 615 on the top transparent layer 431 to the under-screen optical sensor module include different light components.

Figure 5A:
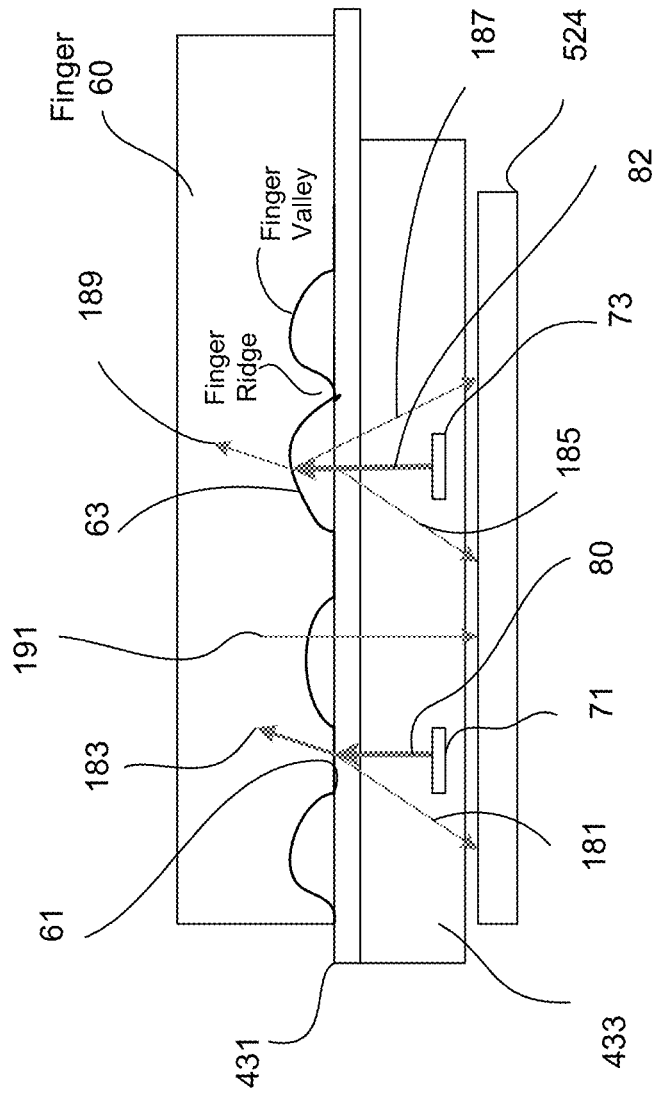
FIGS. 5A and 5B illustrate signal generation for the returned light from the sensing zone on the top sensing surface under two different optical conditions to obtain optical reflective patterns representing external fingerprint patterns formed on the outer skin of a finger and the operation of the under-screen optical sensor module.
Figure 5B:
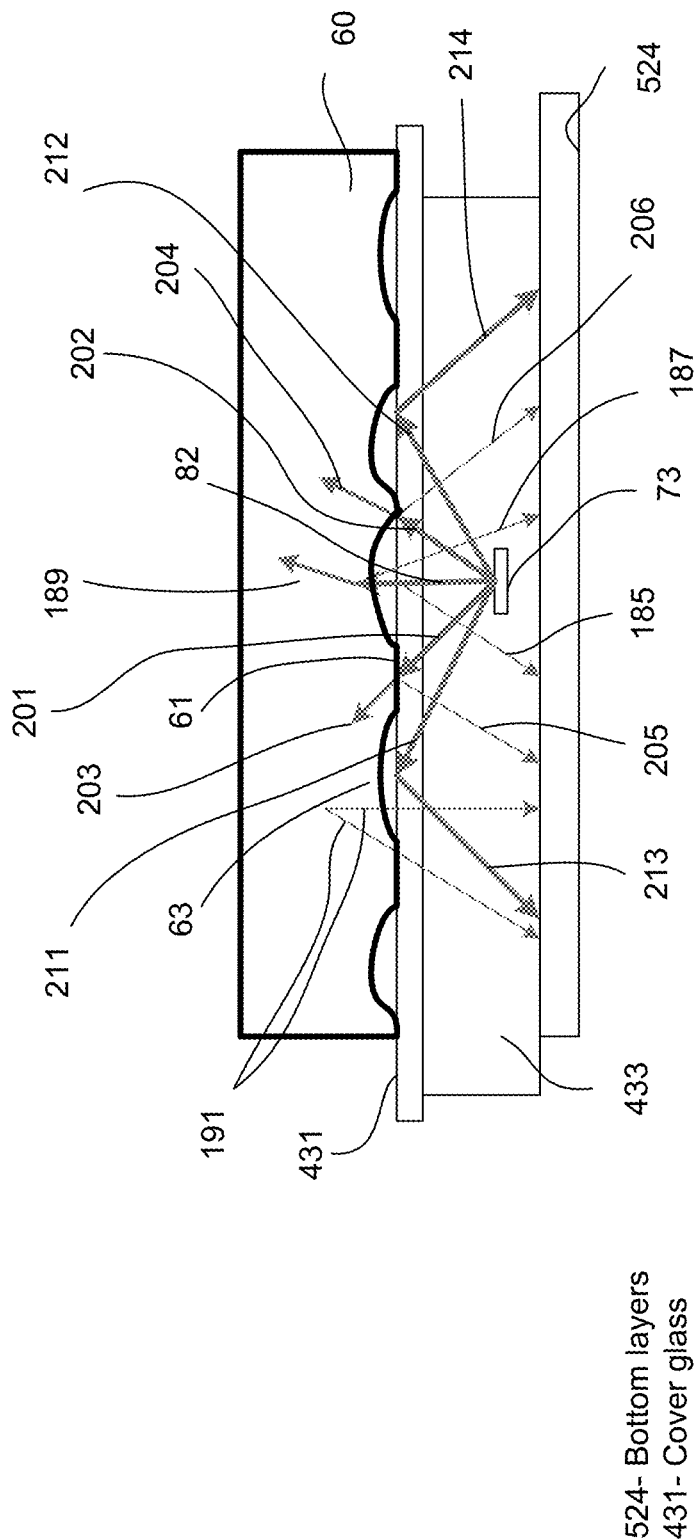

FIGS. 5A and 5B illustrate signal generation for the returned light from the sensing zone 615 for OLED-emitted light or other illumination light at different incident angle ranges under two different optical conditions to facilitate the understanding of the operation of the under-screen optical sensor module.

FIG. 5A shows optical paths of selected OLED-emitted light rays from OLED pixels in the OLED display module 433 that are incident to and transmit through the top transparent layer 431 at small incident angles at the top surface of the transparent layer 431 without the total internal reflection. Such OLED-emitted light rays at small incident angles generates different returned light signals including light signals that carry fingerprint pattern information to the under-screen optical sensor module. Specifically, two OLED pixels 71 and 73 at two different locations are shown to emit OLED output light beams 80 and 82 that are directed to the top transparent layer 431 in a direction that is either perpendicular to the top transparent layer 431 or at relatively small incident angles without experiencing the total reflection at the interfaces of the top transparent layer 431. In the particular example illustrated in FIG. 5A, a finger 60 is in contact with the sensing zone 615 on the top transparent layer 431 and a finger ridge 61 is located above the OLED pixel 71 and a finger valley 63 is located above the OLED pixel 73. As illustrated, the OLED light beam 80 from the OLED pixel 71 toward the finger ridge 61 reaches the finger ridge 61 in contact with the top transparent layer 431 after transmitting through the top transparent layer 431 to generate a transmitted light beam 183 in the finger tissue and another scattered light beam 181 back towards the OLED display module 433. The OLED light beam 82 from the OLED pixel 73 reaches the finger valley 63 located above the top transparent layer 431 after transmitting through the top transparent layer 431 to generate the reflected light beam 185 from the interface with the top transparent layer 431 back towards the OLED display module 433, a second light beam 189 that enters the finger tissue and a third light beam 187 reflected by the finger valley surface.

In the example in FIG. 5A, it is assumed that the finger skin's equivalent index of refraction is about 1.44 at the optical wavelength of 550 nm and the cover glass index of refraction is about 1.51 for the top transparent layer 431. It is also assumed that the finger is clean and dry so that the void between adjacent finger valley and ridge is air. Under those assumptions, the display OLED pixel 71 is turned on at the finger skin ridge location 61 to produce the beam 80. The finger ridge-cover glass interface reflects part of the beam 80 as reflected light 181 to bottom layers 524 below the OLED display module 433. The reflectance is low and is about 0.1%. The majority of the light beam 80 (around 99%) becomes the transmitted beam 183 that transmits into the finger tissue 60 which causes scattering of the light 183 to contribute to the returned scattered light 191 towards the OLED display module 433 and the bottom layers 524.

The OLED-emitted beam 82 from the OLED pixel 73 towards the external valley 63 first passes the interface of the top transparent layer 431 and the air gap due to the presence of the external valley 63 to produce the reflected beam 185 and the remaining portion of the light beam 82 is incident onto the valley 62 to produce the transmitted light beam 189 inside the finger and a reflected beam 187. Similar to the transmitted beam 183 at the finger ridge 61, the transmitted light beam 189 from the OLED pixel 73 in the finger tissue is scattered by the finger tissues and a portion of this scattered light also contributes to the returned scattered light 191 that is directed to towards the OLED display module 433 and the under layers 524. Under the assumptions stated above, about 3.5% of the beam 82 from the display OLED group 73 at the finger skin valley location 63 is reflected by the cover glass surface as the reflected light 185 to the bottom layers 524, and the finger valley surface reflects about 3.3% of the incident light power of the remainder of the beam 82 as the reflected light 187 to bottom layers 524. The total reflection represented by the two reflected beams 185 and 187 is about 6.8% and is much stronger than the reflection 181 at about 0.1% at a finger ridge 61. Therefore, the light reflections 181 and 185/187 from various interface or surfaces at finger valleys 63 and finger ridges 61 of a touching finger are different and form an optical reflective pattern in which the reflection ratio difference carries the fingerprint map information and can be measured to extract the fingerprint pattern of the portion that is in contact with the top transparent layer 431 and is illuminated the OLED light or other illumination light such as extra illumination light sources.

At each finger valley 63, the majority of the beam 82 towards the finger valley 63 (more than 90%) is transmitted into the finger tissues 60 as the transmitted light 189. Part of the light power in the transmitted light 189 is scattered by internal tissues of the finger to contribute to the scattered light 191 towards and into the bottom layers 524. Therefore, the scattered light 191 towards and into the bottom layers 524 includes contributions from both the transmitted light 189 at finger valleys 63 and transmitted light 183 at finger ridges 61.

The example in FIG. 5A shows incident OLED-emitted light to the top transparent layer 431 at small incident angles without the total internal reflection in the top transparent layer 431. For OLED-emitted light incident to the top transparent layer 431 at relatively large incident angles at or greater than the critical angle for the total internal reflection, another higher-contrast optical reflective pattern can be generated to capture the 2-dimensional fingerprint pattern of the external ridges and valleys of a finger. FIG. 5B shows examples of selected OLED-emitted light rays from an OLED pixel 73 in the OLED display module 433 located under a finger valley 63 where some of the illustrated light rays are under a total reflection condition at the interface with the top transparent layer 431 at locations adjacent to the particular finger valley 73. Those illustrated examples of incident light rays generate different returned light signals including light signals that carry fingerprint pattern information to the under-screen optical sensor module. It is assumed that the cover glass 431 and the OLED display module 433 are glued together without any air gap in between so that an OLED light beam emitted by an OLED pixel 73 with a large incident angle to the cover glass 431 at or greater than the critical angle will be totally reflected at the cover glass-air interface. When the display OLED pixel 73 is turned on, the divergent light beams emitted by the OLED pixel 73 can be divided into three groups: (1) central beams 82 with small incident angles to the cover glass 431 without the total reflection, (2) high contrast beams 201, 202, 211, 212 that are totally reflected at the cover glass 431 when nothing touches the cover glass surface and can be coupled into finger tissues when a finger touches the cover glass 431, and (3) escaping beams having very large incident angles that are totally reflected at the cover glass 431 even at a location where the finger is in contact.

For the central light beams 82, as explained in FIG. 5A, the cover glass surface reflects about 0.1%~3.5% to produce the reflected light beam 185 that is transmitted into bottom layers 524, the finger skin reflects about 0.1%~3.3% at the air-finger valley interface to produce a second reflected light beam 187 that is also transmitted into bottom layers 524. As explained above with reference to FIG. 5A, the reflection difference in the reflected rays at small incident angles varies spatially and is dependent on whether the light beams 82 or light beams 80 meet with finger skin valley 63 or ridge 61. The rest of the such incident light rays with small incident angles becomes the transmitted light beams 189 and 183 that are coupled into the finger tissues 60.

FIG. 5B shows high contrast light beams 201 and 202 as examples. The cover glass surface reflects nearly 100% as reflected light beams 205 and 206 respectively if nothing touches the cover glass surface at their respective incident positions. When the finger skin ridges touch the cover glass surface and at the incident positions of the illustrated OLED-emitted light beams 201 and 202, there is no longer the condition for the total internal reflection and thus most of the light power is coupled into the finger tissues 60 as transmitted light beams 203 and 204. For such beams with large incident angles, this change between being under the total internal reflection condition in absence of a finger skin and being out of the total internal reflection condition with a significantly reduced reflection when a finger skin touches is used to produce a contrast pattern in the reflection.

FIG. 5B further shows additional high contrast light beams 211 and 212 as examples for which the cover glass surface reflects nearly 100% to produce corresponding reflected light beams 213 and 214 respectively under the total internal reflection condition if nothing touches the cover glass surface. For example, when the finger touches the cover glass surface and the finger skin valleys happen to be at the incident positions of the light beams 211 and 212, no light power is coupled into finger tissues 60 due to the total internal reflection. If, by contrast, finger ridges happen to be at the incident positions of the light beams 211 and 212, the light power that is coupled into finger tissues 60 increases due to the lack of the total internal reflection caused by the contact of the finger skin.

Similar to the situation in FIG. 5A, light beams (e.g., transmitted beams 203 and 204) that are coupled into finger tissues 60 will experience random scattering by the figure tissues to form the scattered light 191 that propagates towards the bottom layers 524.

The illumination for the examples shown in FIG. 5B can be caused by illumination by the OLED-emitted light or illumination light from extra illumination light sources. In high contrast light beams illuminated area, finger skin ridges and valleys cause different optical reflections and the reflection difference pattern carries the fingerprint pattern information. The high contrast fingerprint signals can be achieved by comparing the difference.

Therefore, as shown in FIGS. 5A and 5B, incident illumination light rays from either OLED-emitted light or extra illumination light sources can produce two types of optical reflection patterns representing the same 2-dimensional fingerprint pattern of a finger: a low contrast optical reflective pattern formed by incident illumination light rays at small incident angles without the total internal reflection and a high contrast optical reflective pattern formed by incident illumination light rays at large incident angles based on a total internal reflection.

2-Dimensional and 3-Dimensional Optical Transmissive Pattern from a Finger

In both FIGS. 5A and 5B, a portion of the incident illumination light rays from either OLED-emitted light or extra illumination light passes through the top transparent layer 431 and enters the finger to cause the scattered light 191 that propagates through the internal tissues of the finger and to penetrate through the finger skin to enter the top transparent layer 431 towards the bottom layers 524. As explained below, such scattered light 191, once transmitting through the internal tissues and the finger skin, carries an optical transmissive pattern of the finger that contains both (1) a 2-dimensional spatial pattern of external ridges and valleys of a fingerprint (2) an internal fingerprint pattern associated with internal finger tissue structures that give rise to the external ridges and valleys of a finger due to the propagation of the scattered light from the internal side of the finger towards the finger skin and transmits the finger skin. Accordingly, the scattered light 191 from the finger can be measured by the optical sensor array and the measurements can be processed for fingerprint sensing. Notably, the internal fingerprint pattern associated with internal finger tissue structures that give rise to the external ridges and valleys of a finger is not substantially affected by the sensing surface condition of the top surface of the top transparent layer 431 or the skin conditions of the finger (e.g., dirty, wet/dry or aged finger patterns) and may still provide sufficient information for fingerprint sensing when the external fingerprint pattern on the external finger skin has a reduced ridge-valley contrast, is somewhat damaged or otherwise is not suitable for providing sufficient fingerprint information in the optical reflective pattern. While the external fingerprint pattern may be duplicated by using artificial materials for invading the fingerprint sensing, the internal fingerprint pattern of a user's finger imprinted in the optical transmissive pattern is extremely difficult to replicate and thus can be used as an anti-spoofing mechanism in the fingerprint sensing.

Figure 5C:
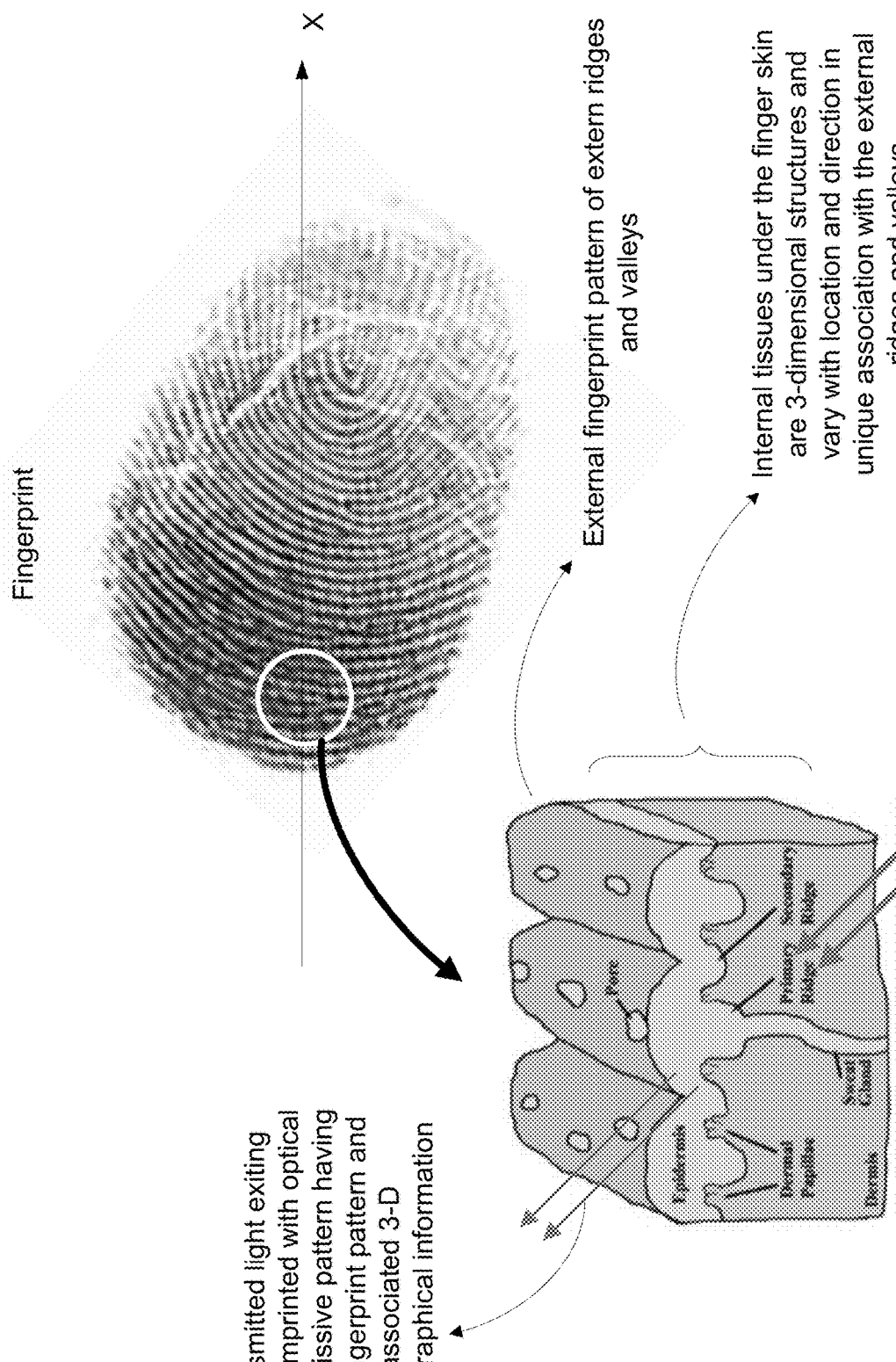
FIGS. 5C and 5D illustrate signal generation for the returned light from the sensing zone on the top sensing surface to obtain optical reflective patterns representing internal finger tissues associated with the external fingerprint patterns formed on the outer skin of a finger and the operation of the under-screen optical sensor module.

FIG. 5C shows an example of an external fingerprint pattern formed by external ridges and valleys of a person's finger and the internal finger issues that are under the skin and are uniquely associated with the external ridges and valleys. See, e.g., Chapter 2 of "*The Fingerprint Sourcebook*" by Holder et al. (U.S. Department of Justice, Office of Justice Programs, National Institute of Justice, Washington, D.C., 2011). As illustrated in FIG. 5C, the internal tissues include the papillary layer under the finger skin that has topographical features from which external ridges and valleys are formed as an expression of the underlying topographical features. In addition, the internal tissues also contain additional structures that are not identically replicated on the external ridges and valleys such as the internal primary and secondary ridges, the sweat glands connected to the primary ridges and other internal structures. As illustrated in FIG. 5C, when probe light propagates from the internal side of the finger outward to the finger skin, the probe light interacts with the internal tissues under the finger skin to carry not only the 2-dimensional fingerprint pattern of the papillary layer that is identical to the external fingerprint pattern formed by the external ridges and valleys but also additional topographical information from the internal tissue structures that is not carried by the external ridges and valleys. Such additional topographical information from the internal tissue structures cannot be obtained from the optical reflective pattern obtained from the optical reflection off the external finger skin. The additional topographical information from the internal tissue structures below the finger skin is valuable information for fingerprint sensing and is 3-dimensional since the internal tissue structures vary with both the lateral position under the skin and the depth from the skin surface (topographical information). Such additional topographical information from the internal tissue structures of a finger can be used, for example, to distinguish a natural finger from an artificial object manufactured with similar or identical external fingerprint pattern as the natural finger.

Referring to FIG. 5C, different illumination probe light beams go through different parts of the under-skin internal tissue structures and thus are imprinted with different 3-D topographical information associated with the different optical paths in different directions of such illumination probe light beams. Imaging processing techniques can be used to process the optical transmissive patterns carried by such different illumination probe light beams to extract the topographical features associated with the under-skin internal tissue structures. The extracted topographical features can be synthesized to construct a 3-D representation or rendition of the under-skin internal tissue structures associated with the fingerprint pattern and this constructed 3-D representation of the under-skin internal tissue structures associated with the fingerprint pattern can be used as a unique and additional identification for the fingerprint pattern and can be used to distinguish a true fingerprint pattern from a real finger of a user from a fabricated fingerprint pattern that would invariably lack of the underlying internal tissue structures of the real finger. In particular, as the number of the different illumination probe light beams in the different directions increases, the more detailed topographical information on the under-skin internal tissue structures can be captured by the optical sensor module. In using the fingerprint for a secured access to the device, the fingerprint identification process can be designed to combine the identification of the 2-D fingerprint pattern and the additional examination of the extracted 3-D representation or rendition of the under-skin internal tissue structures associated with the fingerprint pattern to determine whether or not to grant the access. The extracted topographical features and the constructed 3-D representation or rendition of the under-skin internal tissue structures associated with the fingerprint pattern can be an anti-spoofing mechanism and can used alone or in combination with other anti-spoofing techniques to enhance the security and accuracy of the fingerprint sensing.

One way for the disclosed optical fingerprint sensing technology to capture additional topographical information from the internal tissue structures of a finger is by directing different illumination probe light beams at different directions to detect the different optical shadowing patterns produced by the internal tissue structures under the finger skin that are superimposed over the 2-dimensional fingerprint pattern that is common to all images obtained from the illumination by the different illumination probe light beams at different directions.

Figure 5D:
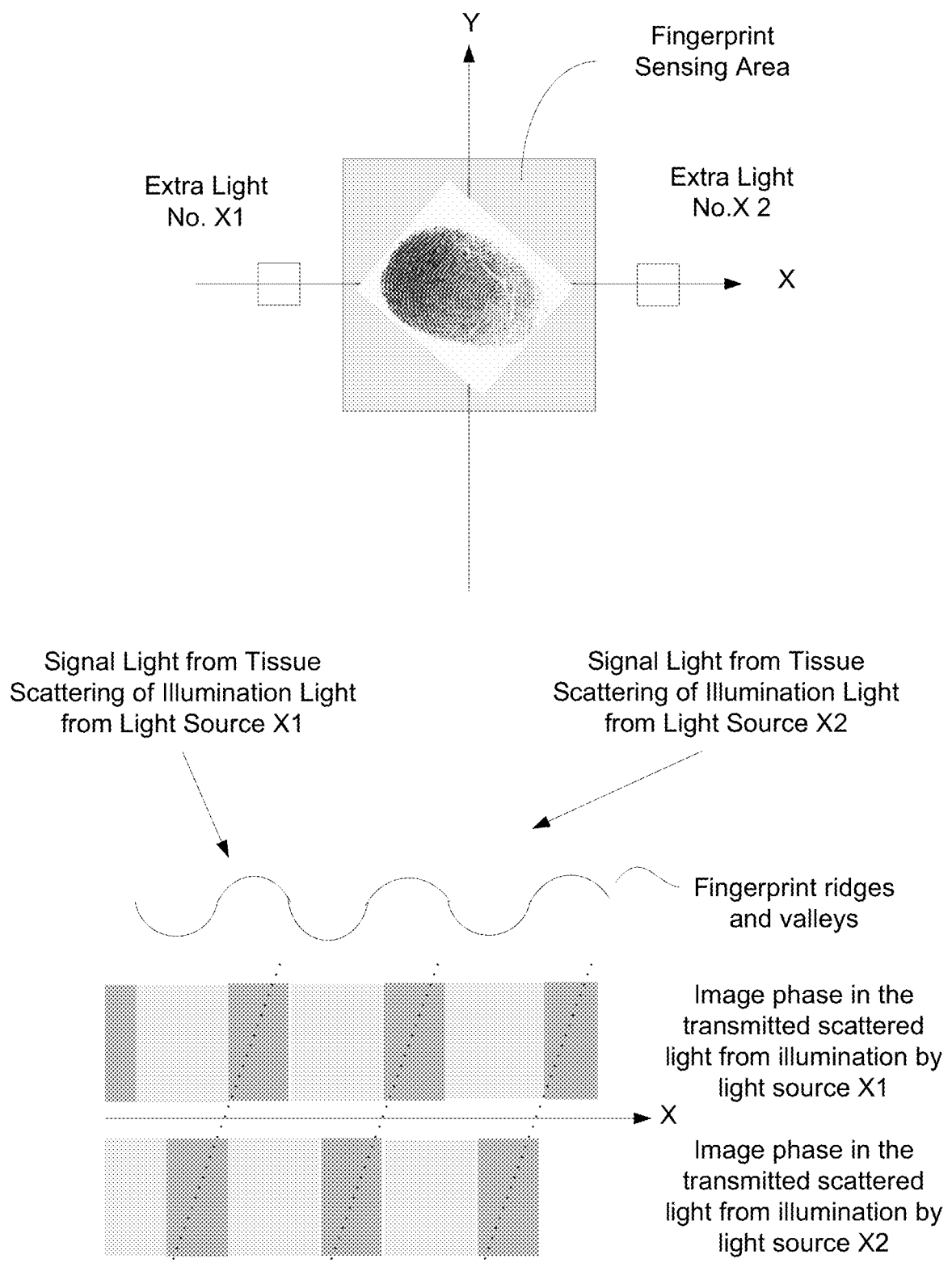

FIG. 5D shows that two extra illumination light sources X1 and X2 are placed on two opposite sides of the fingerprint sensing area on the top transparent layer 431 along the X direction so that they can direct two different illumination probe beams to the finger in opposite directions. The images from both illumination probe beams carry the same 2-D fingerprint pattern but different image shadowing patterns due to their different illumination directions with respect to the internal tissue structures under the finger skin. Specifically, the first extra illumination light source X1 is placed on the left side of the fingerprint sensing area along the X direction so that the first illumination probe beam from the first extra illumination light source X1 is from the left to the right in FIG. 5D. This illumination by the first extra illumination light source X1 causes a shadowing pattern in the first fingerprint image at the under-OLED optical sensor array due to the interaction with the internal tissue structures under the finger skin and this shadowing pattern is shifted spatially towards the right in the X direction. The illumination by the second extra illumination light source X2 on the right side causes a shadowing pattern in the second fingerprint image at the under-OLED optical sensor array due to the interaction with the internal tissue structures under the finger skin and this shadowing pattern is shifted spatially towards the left in the X direction. In implementation of this technique, additional extra illumination light sources may be added, e.g., in the Y direction or in other directions.

In this example, the first illumination probe beam in the first illumination direction from the first extra illumination light source X1 leads to generation of the first scattered probe light by scattering of tissues inside the finger that propagates the internal tissues associated with ridges and valleys of the finger to carry both (1) a first 2-dimensional transmissive pattern representing a fingerprint pattern formed by ridges and valleys of the finger, and (2) a first fingerprint topographical pattern that is associated with the illumination of internal tissues of ridges and valleys of the finger in the first illumination direction and is embedded within the first 2-dimensional transmissive pattern. Similarly, the second illumination probe beam in the second illumination direction from the second extra illumination light source X2 leads to generation of the first scattered probe light by scattering of tissues inside the finger that propagates the internal tissues associated with ridges and valleys of the finger to carry both (1) a second 2-dimensional transmissive pattern representing the fingerprint pattern formed by bridges and valleys of the finger, and (2) a second fingerprint topographical pattern that is associated with the illumination of internal tissues of ridges and valleys of the finger in the second illumination direction and is embedded within the second 2-dimensional transmissive pattern. The two extra illumination light sources X1 and X2 are turned on sequentially at different times so that the optical sensor array can be operated to detect transmitted part of the first scattered probe light that passes through the top transparent layer and the display panel to reach the optical sensor array so as to capture both the first 2-dimensional transmissive pattern, and the first fingerprint topographical pattern and then the second 2-dimensional transmissive pattern and the second fingerprint topographical pattern. The shadowing patterns shown in FIG. 5D are embedded in the captured 2-D fingerprint patterns and are one form of the fingerprint topographical pattern that is associated with the illumination of internal tissues of ridges and valleys of the finger at a particular direction.

In various implementations, two or more extra illumination light sources can be located outside the optical sensor module at different locations to produce different illumination probe beams to illuminate the designated fingerprint sensing area on the top transparent layer in different illumination directions. Since this technique is based on the ability for the probe light to transmit through the finger tissues, each extra illumination light source should be structured to produce probe light in an optical spectral range with respect to which tissues of a human finger exhibit optical transmission to allow probe light to enter a user finger to produce scattered probe light by scattering of tissues inside the finger that propagates towards and passes the top transparent layer to carry both (1) fingerprint pattern information and (2) different fingerprint topographical information associated with the different illumination directions, respectively, caused by transmission through internal tissues of ridges and valleys of the finger. A probe illumination control circuit can be coupled to control the extra illumination light sources to sequentially turn on and off in generating the different illumination probe beams at different times, one beam at a time, so that the optical sensor module located below the display panel is operable to sequentially detect the scattered probe light from the different illumination probe beams to capture both (1) the fingerprint pattern information and (2) the different fingerprint topographical information associated with the different illumination directions, respectively.

In addition to using light sources that are independent of the OLED pixels as the extra illumination light sources located outside the optical sensor module at different locations to produce the different illumination probe beams in different illumination directions, such two or more extra illumination light sources use two or more different OLED pixels at selected different locations with respect to the optical sensor module and outside OLED display area on top of the optical sensor module to produce the different illumination probe beams to illuminate the designated fingerprint sensing area on the top transparent layer in different illumination directions. This can be done by turning on such OLED pixels at different times while turning off all other OLED pixels to obtain the directional illumination at two or more different directions to measure the spatially shifted shadowing patterns caused by the internal tissue structures of the finger.

One notable feature of the disclosed technique in FIG. 5D is the simplicity of the illumination arrangement, the optical detection and the signal processing which can lead to compact optical sensor packaging for mobile and other applications that desire compact sensing device packaging, and real-time processing since the detection and the subsequent processing are simple operations that can be achieved at high speed without complex signal processing. Various optical imaging techniques for capturing 3-D images require complex optical imaging systems and complex and time-consuming signal processing, such as optical coherence tomography (OCT) imaging based on complex OCT data processing such as fast Fourier transform (FFT) and others that are not suitable for 3-D optical fingerprint sensing in smartphones and other mobile devices.

In the examples above, the illumination light for obtaining an optical transmissive pattern of a finger can be from the OLED pixels of the OLED display or extra illumination light sources that are separate from the OLED display. In addition, a portion of the environmental or background light that is within the optical transmission spectral band of a finger (e.g., optical wavelengths between 650 nm and 950 nm) and penetrates through a finger may also be directed into the under-OLED optical sensor array to measure an optical transmissive pattern associated with a fingerprint pattern of the finger. Depending on the intensity of the environmental or background light (e.g., the natural daylight or sunlight), optical attenuation may be provided in the optical path to the optical sensor module to avoid detection saturation at the optical sensor array. In using a portion of the environmental or background light for obtaining the optical transmissive pattern of a finger in optical sensing, proper spatial filtering can be implemented to block the environmental light that does transmits through the finger from entering the optical sensor module since such environmental light does not carry internal fingerprint pattern and can adversely flood the optical detectors in the optical sensor module.

Therefore, the disclosed optical fingerprint sensing can use transmitted light through a finger to capture an optical transmissive pattern of the finger with information on the internal fingerprint pattern associated with the external ridges and valleys of a finger under the finger skin. The transmission of the light is through the finger tissues and the stratum corneum of the finger skin and thus is imprinted with the fingerprint information by the internal structural variations inside the finger skin caused by the fingerprint ridge area and valley area and such internal structural variations manifest light signals with different brightness patterns in different illumination directions caused by the finger tissue absorption, refraction, and reflection, by finger skin structure shading, and/or by optical reflectance difference at the finger skin. This optical transmissive pattern is substantially immune from the contact conditions between the finger and the top touch surface of the device (e.g., dirty contact surface) and the conditions of the external finger skin condition (e.g., dirty, dry or wet fingers, or reduced external variations between ridges and valleys in fingers of certain users such as aged users).

Examples for Using Optical Sensors Interleaved with Display Pixels to Capture Optical Reflective and Transmissive Patterns As shown in examples in FIGS. 2E and 2F, the disclosed optical sensing technology can spatially interleave optical sensors with the OLED display pixels in various configurations for optical sensing where the optical sensors can be placed in the same layer as the OLED display pixels or under the layer of the OLED display pixels.

The optical sensing based on spatially interleaved optical sensors and OLED display pixels can be adversely affected by noise from various sources including the background light from the environment in which a device is used. Various techniques for reducing the background light noise are provided.

For example, the undesired background light in the fingerprint sensing may be reduced by providing proper optical filtering in the light path. One or more optical filters may be used to reject the environment light wavelengths, such as near IR and partial of the red light etc. In some implementation, such optical filter coatings may be made on the surfaces of the optical parts, including the display bottom surface, prism surfaces, sensor surface etc. For example, human fingers absorb most of the energy of the wavelengths under ~580 nm, if one or more optical filters or optical filtering coatings can be designed to reject light in wavelengths from 580 nm to infrared, undesired contributions to the optical detection in fingerprint sensing from the environment light may be greatly reduced. More details on background reduction based on optical filtering are provided in later sections.

Figure 6:
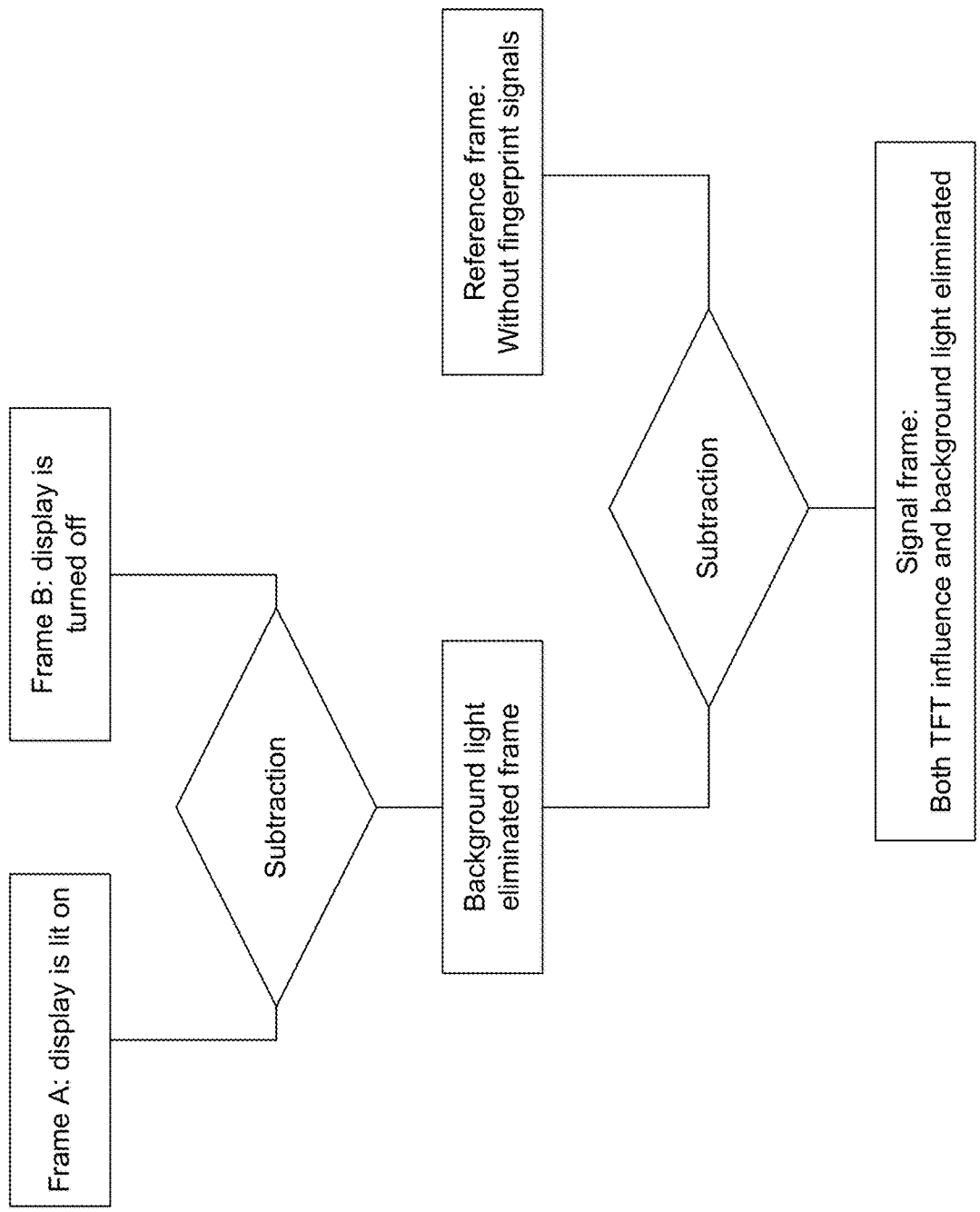
FIG. 6 shows an example of an operation of the fingerprint sensor for reducing or eliminating undesired contributions from the background light in fingerprint sensing.
Figure 7:
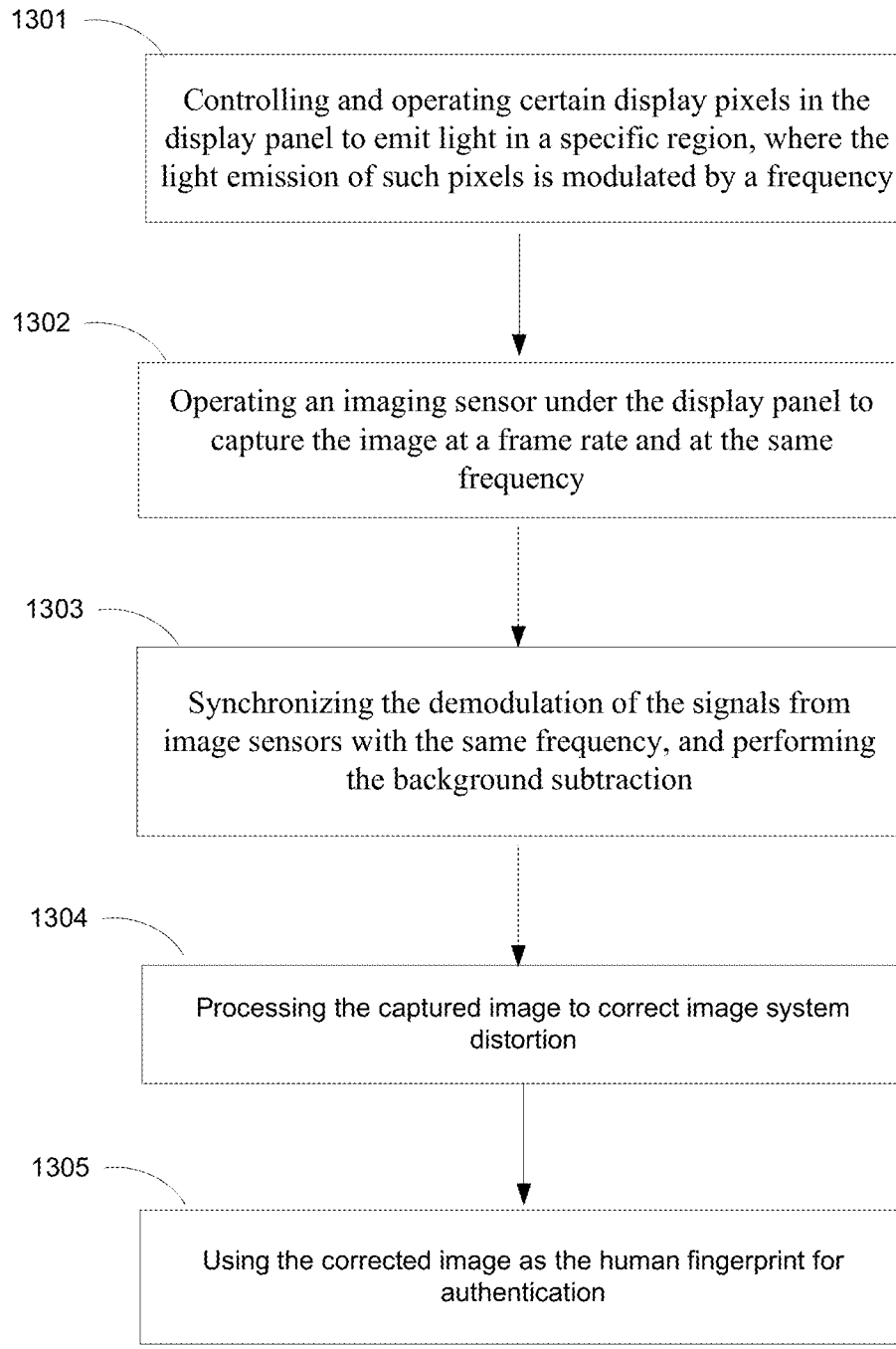
FIG. 7 shows a process for operating an under-screen optical sensor module for capturing a fingerprint pattern.

FIGS. 6 and 7 show two examples of techniques based on particularly ways of capturing and processing optical signals at the optical sensor module.

FIG. 6 shows an example of an operation of the fingerprint sensor for reducing or eliminating undesired contributions from the background light in fingerprint sensing. The optical sensor array can be used to capture various frames and the captured frames can be used to perform differential and averaging operations among multiple frames to reduce the influence of the background light. For example, in frame A the OLED display is turned on to illuminate the finger touching area, in frame B the illumination is changed or turned off. Subtraction of the signals of frame B from the signals of frame A can be used in the image processing to reduce the undesired background light influence.

FIG. 7 shows an example of an operation process for correcting the image distortion in the optical sensor module. At step 1301, certain display pixels are controlled and operated to emit light in a specific region, and the light emission of such pixels is modulated by a frequency F. At step 1302, an imaging sensor under the display panel is operated to capture the image at a frame rate at the same frequency F. In the optical fingerprint sensing operation, a finger is placed on top of the display panel cover substrate and the presence of the finger modulates the light reflection intensity of the display panel cover substrate top surface. The imaging sensor under the display captures the fingerprint modulated reflection light pattern. At step 1303, the demodulation of the signals from image sensors is synchronized with the frequency F, and the background subtraction is performed. The resultant image has a reduced background light effect and includes images from pixel emitting lights. At step 1304, the capture image is processed and calibrated to correct image system distortions. At step 1305, the corrected image is used as a human fingerprint image for user authentication.

The same optical sensors used for capturing the fingerprint of a user can be used also to capture the scattered light from the illuminated finger as shown by the back scattered light 191 in FIGS. 5A and 5B. The detector signals from the back scattered light 191 in FIGS. 5A and 5B in a region of interest can be integrated to produce an intensity signal. The intensity variation of this intensity signal is evaluated to determine the heart rate of the user.

The above fingerprint sensor may be hacked by malicious individuals who can obtain the authorized user's fingerprint, and copy the stolen fingerprint pattern on a carrier object that resembles a human finger. Such unauthorized fingerprint patterns may be used on the fingerprint sensor to unlock the targeted device. Hence, a fingerprint pattern, although a unique biometric identifier, may not be by itself a completely reliable or secure identification. The under-screen optical sensor module can also be used to as an optical anti-spoofing sensor for sensing whether an input object with fingerprint patterns is a finger from a living person and for determining whether a fingerprint input is a fingerprint spoofing attack. This optical anti-spoofing sensing function can be provided without using a separate optical sensor. The optical anti-spoofing can provide high-speed responses without compromising the overall response speed of the fingerprint sensing operation.

Figure 8A:
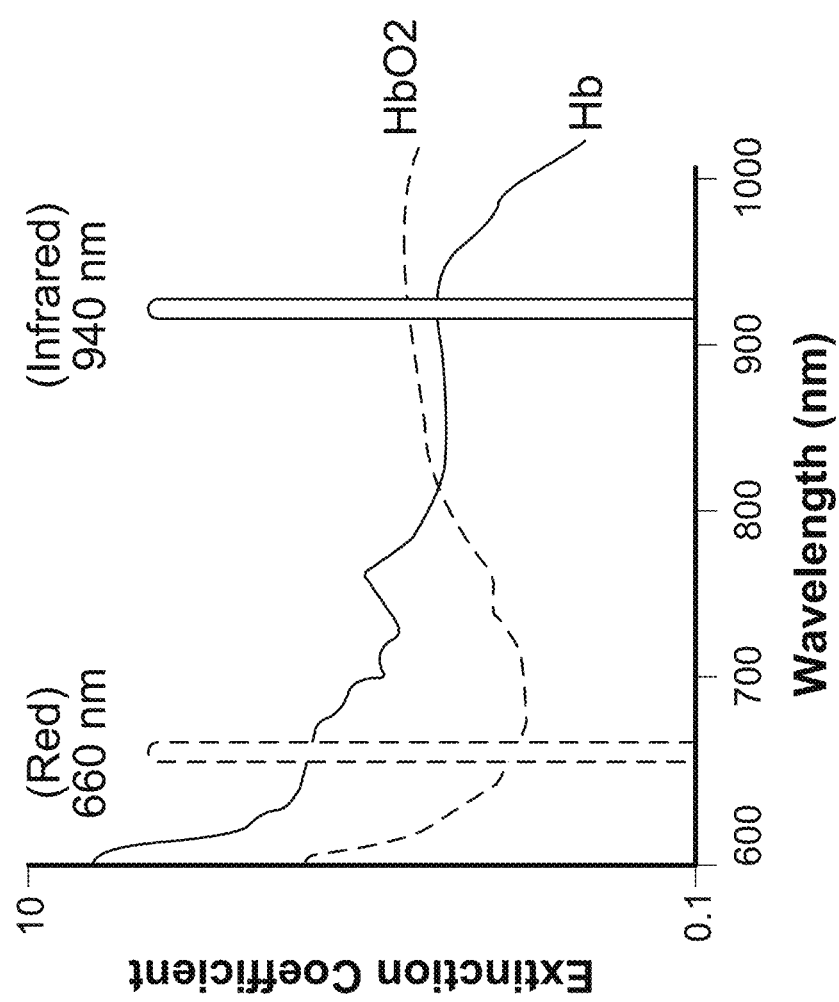
FIGS. 8A, 8B and FIG. 9 show an example of an operation process for determining whether an object in contact with the OLED display screen is part of a finger of a live person by operating the OLED pixels to illuminate the finger in two different light colors.

FIG. 8A shows exemplary optical extinction coefficients of materials being monitored in blood where the optical absorptions are different between the visible spectral range e.g., red light at 660 nm and the infrared range, e.g., IR light at 940 nm. By using probe light to illuminate a finger at a first visible wavelength (Color A) and a second different wavelength such as an IR wavelength (Color B), the differences in the optical absorption of the input object can be captured determine whether the touched object is a finger from a live person. Since the OLED pixels include OLED pixels emitting light of different colors to emit probe light at least two different optical wavelengths to use the different optical absorption behaviors of the blood for live finger detection. When a person' heart beats, the pulse pressure pumps the blood to flow in the arteries, so the extinction ratio of the materials being monitored in the blood changes with the pulse. The received signal carries the pulse signals.

These properties of the blood can be used to detect whether the monitored material is a live-fingerprint or a fake fingerprint.

Figure 8B:
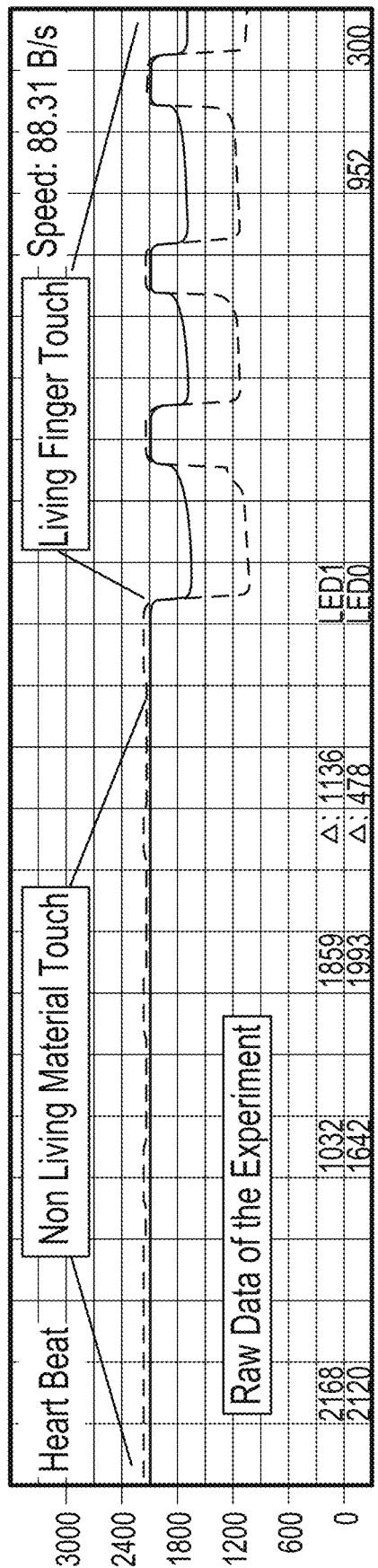

FIG. 8B shows a comparison between optical signal behaviors in the reflected light from a nonliving material (e.g., a fake finger) and a live finger. The optical fingerprint sensor can also operate as a heartbeat sensor to monitor a living organism. When two or more wavelengths of the probe light are detected, the extinction ratio difference can be used to quickly determine whether the monitored material is a living organism, such as live fingerprint. In the example shown in FIG. 8B, probe light at different wavelengths were used, one at a visible wavelength and another at an IR wavelength as illustrated in FIG. 8A.

When a nonliving material touches the top cover glass above the fingerprint sensor module, the received signal reveals strength levels that are correlated to the surface pattern of the nonliving material and the received signal does not contain signal components associated with a finger of a living person. However, when a finger of a living person touches the top cover glass, the received signal reveals signal characteristics associated with a living person, including obviously different strength levels because the extinction ratios are different for different wavelengths. This method does not take long time to determine whether the touching material is a part of a living person. In FIG. 8B, the pulse-shaped signal reflects multiple touches instead of blood pulse. Similar multiple touches with a nonliving material does not show the difference caused by a living finger.

This optical sensing of different optical absorption behaviors of the blood at different optical wavelengths can be performed in a short period for live finger detection and can be faster than optical detection of a person's heart beat using the same optical sensor.

Figure 9:
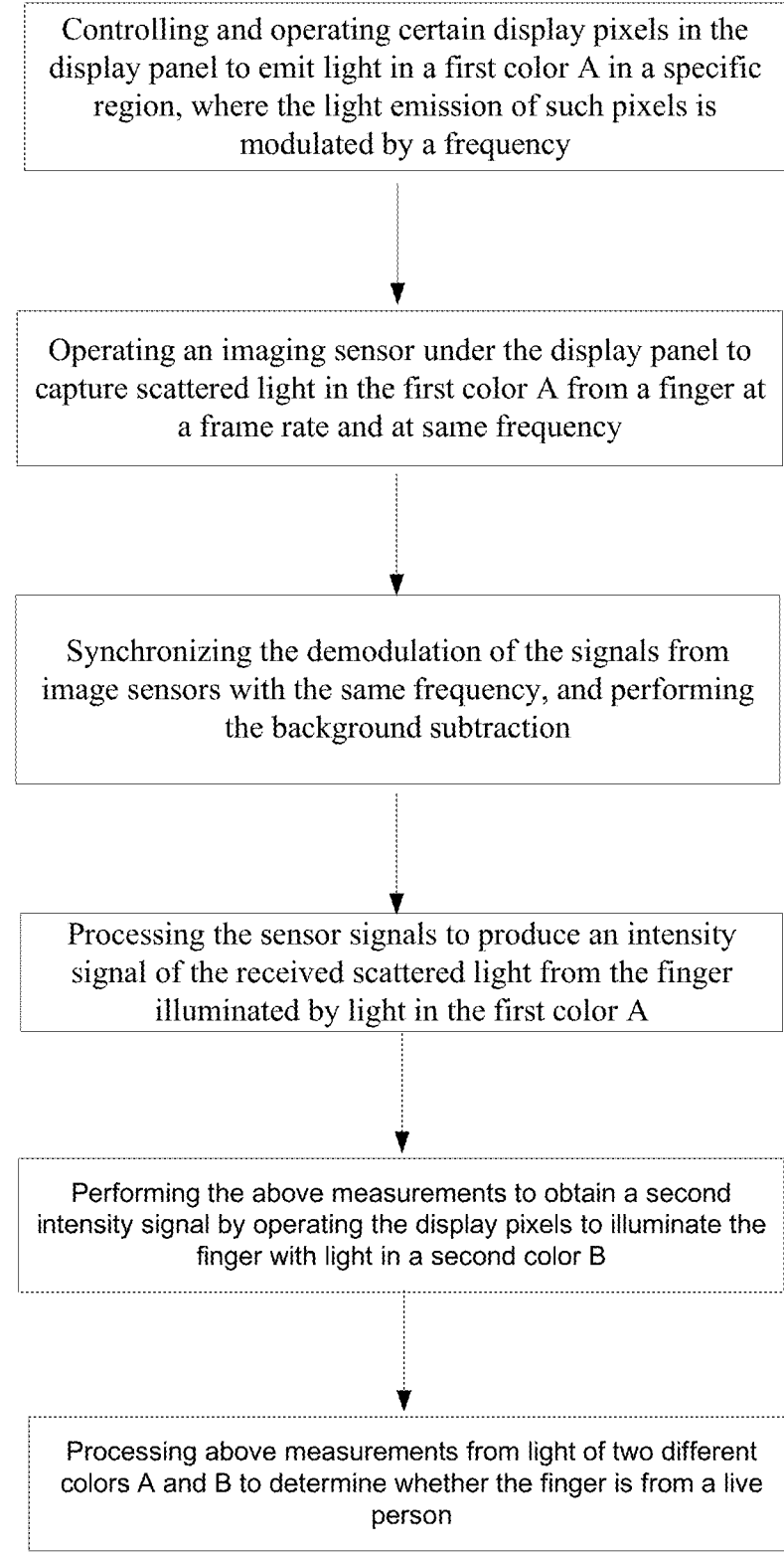

FIG. 9 shows an example of an operation process for determining whether an object in contact with the OLED display screen is part of a finger of a live person by operating the OLED pixels to illuminate the finger in two different light colors.

For yet another example, the disclosed optical sensor technology can be used to detect whether the captured or detected pattern of a fingerprint or palm is from a live person's hand by a "live finger" detection mechanism by other mechanisms other than the above described different optical absorptions of blood at different optical wavelengths. For example, a live person's finger tends to be moving or stretching due to the person's natural movement or motion (either intended or unintended) or pulsing when the blood flows through the person's body in connection with the heartbeat. In one implementation, the optical sensor module can detect a change in the returned light from a finger or palm due to the heartbeat/blood flow change and thus to detect whether there is a live heartbeat in the object presented as a finger or palm. The user authentication can be based on the combination of the both the optical sensing of the fingerprint/palm pattern and the positive determination of the presence of a live person to enhance the access control. For yet another example, as a person touches the OLED display screen, a change in the touching force can be reflected in one or more ways, including fingerprint pattern deforming, a change in the contacting area between the finger and the screen surface, fingerprint ridge widening, or a change in the blood flow dynamics. Those and other changes can be measured by optical sensing based on the disclosed optical sensor technology and can be used to calculate the touch force. This touch force sensing can be used to add more functions to the optical sensor module beyond the fingerprint sensing.

Portable devices such as mobile phones or other devices or systems based on the optical sensing disclosed in this document can be configured to provide additional operation features.

For example, the OLED display panel can be controlled to provide a local flash mode to illuminate a fingerprint sensing area by operating selected OLED display pixels underneath the sensing area. In acquiring a fingerprint image, the OLED display pixels in the window area can be turned on momentarily to produce high intensity illumination for optical sensing of a fingerprint, and, at the same time, the photo detection sensors in the turned-on display area are also turned on to capture the fingerprint image in sync with the turning on of the OLED pixels underneath the sensing area. The time to turn on these OLED pixels can be relatively short but the emission intensity can be set to be higher than the normal emission for displaying images on the OLED display panel. For this reason, this mode for optical fingerprint sensing is a flash mode that enable detection of a larger amount of light to improve the image sensing performance. In the mode, OLED pixels in other areas of the display panel can be turned off or be in a sleep mode to save power when the device is not yet in use. In response to the flashing of the OLED pixels in the viewing zone, the corresponding photo sensors are operated to receive and detect light signals. When a finger touches the sensing zone during this flash wakeup mode, the finger causes returned light to be totally reflected to produce strong returned probe light which is detected at the optical sensor array and the detection of the presence of light can be used to wake up the device in the sleep mode. In addition to using the part of OLED pixels in the viewing zone, one or more extra light sources may be provided in the device to provide the flash mode illumination for the flash wakeup function.

The optical sensors for sensing optical fingerprints disclosed above can be used to capture high quality images of fingerprints to enable discrimination of small changes in captured fingerprints that are captured at different times. Notably, when a person presses a finger on the device, the contact with the top touch surface over the display screen may subject to changes due to changes in the pressing force. When the finger touches the sensing zone on the cover glass, changes in the touching force may cause several detectable changes at the optical sensor array: (1) fingerprint deforming, (2) a change in the contacting area, (3) fingerprint ridge widening, and (4) a change in the blood flow dynamics at the pressed area. Those changes can be optically captured and can be used to calculate the corresponding changes in the touch force. The touch force sensing adds more functions to the fingerprint sensing.

Figure 10:
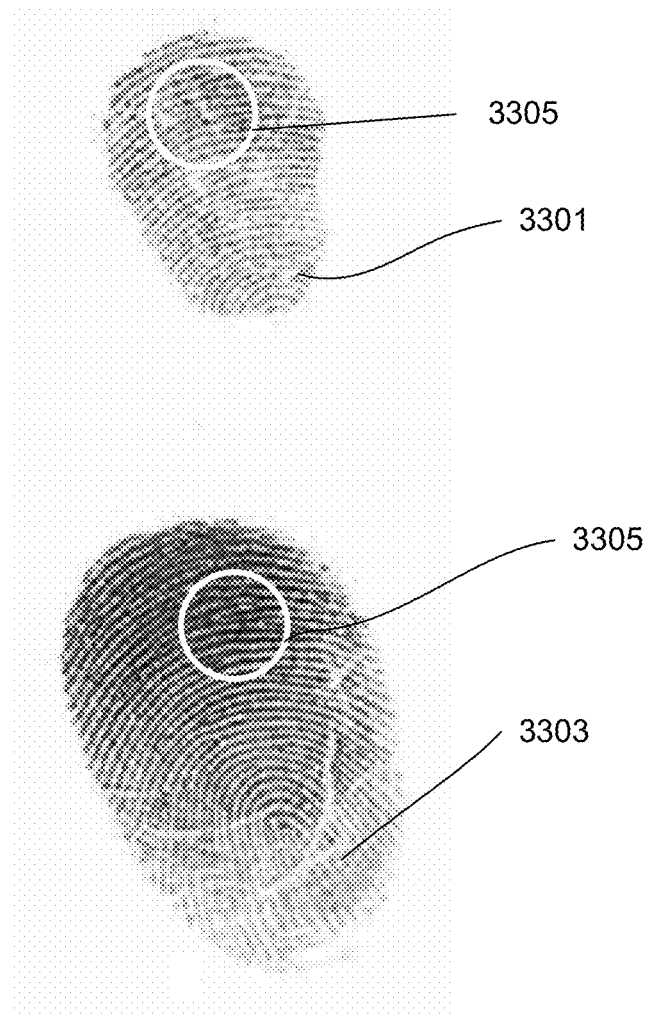
FIG. 10 shows two different fingerprint patterns of the same finger under different press forces: the lightly pressed fingerprint 2301 and the heavily pressed fingerprint 3303.

Referring to FIG. 10, the contact profile area increases with an increase in the press force, meanwhile the ridge-print expands with the increase in the press force. Conversely, the contact profile area decreases with a decrease in the press force, meanwhile the ridge-print contracts or shrinks with the decrease in the press force. FIG. 10 shows two different fingerprint patterns of the same finger under different press forces: the lightly pressed fingerprint 3301 and the heavily pressed fingerprint 3303. The returned probe light from a selected integration zone 3305 of the fingerprint on the touch surface can be captured by a portion of the optical sensors on the optical sensor array that correspond to the selected integration zone 3305 on the touch surface. The detected signals from those optical sensors are analyzed to extract useful information as further explained below.

When a finger touches the sensor surface, the finger tissues absorb the light power thus the receiving power integrated over the photo diode array is reduced. Especially in the case of total inner reflection mode that does not sense the low refractive index materials (water, sweat etc.), the sensor can be used to detect whether a finger touches the sensor or something else touches the sensor accidentally by analyzing the receiving power change trend. Based on this sensing process, the sensor can decide whether a touch is a real fingerprint touch and thus can detect whether to wake up the mobile device based on whether the touch is a real finger press. Because the detection is based on integration power detection, the light source for optical fingerprint sensing at a power saving mode.

In the detailed fingerprint map, when the press force increases, the fingerprint ridges expands, and more light is absorbed at the touch interface by the expanded fingerprint ridges. Therefore, within a relatively small observing zone 3305, the integrated received light power change reflects the changes in the press force. Based on this, the press force can be detected.

Accordingly, by analyzing the integrated received probe light power change within a small zone, it is possible to monitor time-domain evolution of the fingerprint ridge pattern deformation. This information on the time-domain evolution of the fingerprint ridge pattern deformation can then be used to determine the time-domain evolution of the press force on the finger. In applications, the time-domain evolution of the press force by the finger of a person can be used to determine the dynamics of the user's interaction by the touch of the finger, including determining whether a person is pressing down on the touch surface or removing a pressed finger away from the touch surface. Those user interaction dynamics can be used to trigger certain operations of the mobile device or operations of certain apps on the mobile device. For example, the time-domain evolution of the press force by the finger of a person can be used to determine whether a touch by a person is an intended touch to operate the mobile device or an unintended touch by accident and, based on such determination, the mobile device control system can determine whether or not to wake up the mobile device in a sleep mode.

In addition, under different press forces, a finger of a living person in contact with the touch surface can exhibit different characteristics in the optical extinction ratio obtained at two different probe light wavelengths as explained with respect FIGS. 8A and 8B. Referring back to FIG. 10, the lightly pressed fingerprint 3301 may not significantly restrict the flow of the blood into the pressed portion of the finger and thus produces an optical extinction ratio obtained at two different probe light wavelengths that indicates a living person tissue. When the person presses the finger hard to produce the heavily pressed fingerprint 3303, the blood flow to the pressed finger portion may be severely reduced and, accordingly, the corresponding optical extinction ratio obtained at two different probe light wavelengths would be different from that of the lightly pressed fingerprint 3301. Therefore, the optical extinction ratios obtained at two different probe light wavelengths vary under different press forces and different blood flow conditions. Such variation is different from the optical extinction ratios obtained at two different probe light wavelengths from pressing with different forces of a fake fingerprint pattern of a man-made material.

Therefore, the optical extinction ratios obtained at two different probe light wavelengths can also be used to determine whether a touch is by a user's finger or something else. This determination can also be used to determine whether to wake up the mobile device in a sleep mode.

For yet another example, the disclosed optical sensor technology can be used to monitor the natural motions that a live person's finger tends to behave due to the person's natural movement or motion (either intended or unintended) or pulsing when the blood flows through the person's body in connection with the heartbeat. The wake-up operation or user authentication can be based on the combination of the both the optical sensing of the fingerprint pattern and the positive determination of the presence of a live person to enhance the access control. For yet another example, the optical sensor module may include a sensing function for measuring a glucose level or a degree of oxygen saturation based on optical sensing in the returned light from a finger or palm. As yet another example, as a person touches the display screen, a change in the touching force can be reflected in one or more ways, including fingerprint pattern deforming, a change in the contacting area between the finger and the screen surface, fingerprint ridge widening, or a blood flow dynamics change. Those and other changes can be measured by optical sensing based on the disclosed optical sensor technology and can be used to calculate the touch force. This touch force sensing can be used to add more functions to the optical sensor module beyond the fingerprint sensing.

In implementing the disclosed sensing technology, optical filtering can be used for reducing the background light and for improving the optical sensing performance. While the general goal of inserting optical filters in the optical path of the optical sensor module is to reject the environment light wavelengths, such as near IR and partial of the red light and other undesired wavelengths, the specific implementation of such optical filters can vary based on the specific needs of each application. Such optical filters can be formed by forming optical filter coatings on selected surfaces of the optical parts in the optical path leading to the optical sensors, including, e.g., the display bottom surface, surfaces of other optical components such as optical prisms, the upper sensor surface of the optical sensor layer below the OLED display layer in FIG. 2E. For example, human fingers absorb most of the energy of the wavelengths under a certain wavelength (e.g., around ~580 nm), if the optical filters are designed to reject the light in the wavelengths from this wavelength around ~580 nm to infrared, the undesired environment light influence can be greatly reduced.

Figure 11:
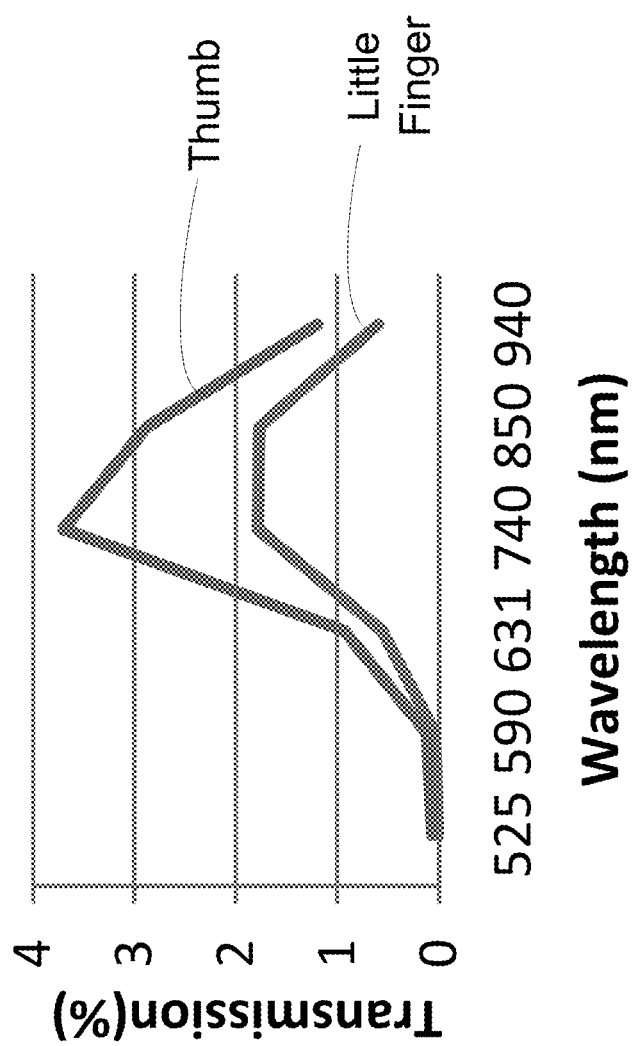
FIG. 11 shows an example of the optical transmission spectral profiles of a typical human thumb and litter finger at several different optical wavelengths from around 525 nm to around 940 nm.

FIG. 11 shows an example of the optical transmission spectral profiles of a typical human thumb and little finger at several different optical wavelengths from around 525 nm to around 940 nm. For short wavelengths, such as wavelengths less than 610 nm, less than 0.5% of the environmental light may pass through the finger. Red light and near IR light have higher transmission. The transmission of the environmental light through a finger goes to a wide range of directions due to scattering by the finger tissues and thus can mix with the signal light to be detected by the under-screen optical sensor module. When operated under the sunlight, the undesired environmental light from the sunlight must be handled carefully due to the high optical power of the sunlight to reduce or minimize the adverse impact to the optical fingerprint sensor performance.

Figure 12:
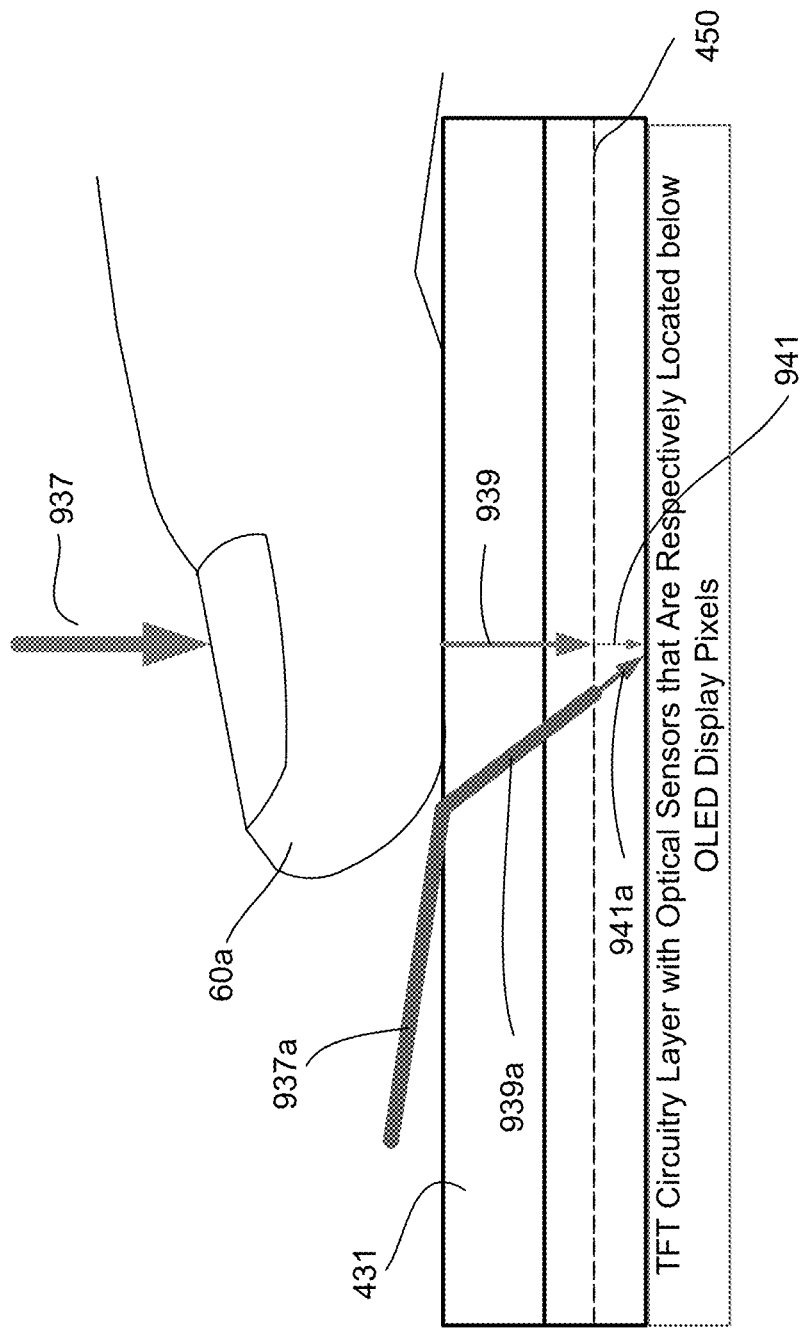
FIG. 12 illustrates influences of the background light in an example of a under-screen optical sensor module.

FIG. 12 illustrates influences of the background light in the spatially interleaved optical sensor design in FIG. 2F where the optical sensors are located in a layer below the OLED display pixel layer. The undesired environmental light that can adversely affect the optical fingerprint sensing may pass through different paths to reach the optical fingerprint sensor 600*a*. In some cases, the environmental light paths can be divided into different situations based on their optical paths: some light like 937 passes through the finger to enter the optical fingerprint sensor 600*a*, and some light like 937*a* does not pass through the finger but enters the optical sensor layer below the OLED display pixel layer from one or more sides around the finger.

With respect to the environmental light 937 that propagates through the finger 60*a*, the finger 60*a* absorbs some of the incident light so that part of the light 939 transmits through the finger 60*a* to reach the cover glass 431, and subsequently transmits through the cover glass 431 to reach the OLED TFT layers. The small holes 450 in the OLED TFT layers block most of such background light but a small portion of light 941 of such background light 939 passes through the small holes 450 to enter into the optical sensor layer below. As discussed with respect to FIG. 5D, such light can carry an optical transmissive pattern representing the fingerprint pattern of the finger based on interacting with the internal structures of the finger associated with the external fingerprint pattern on the external skin surface of the finger and thus may be used in some implementations for optical fingerprint sensing.

Some of the environmental light 937*a* propagates directly to the cover glass 431 without transmitting through the finger 60*a*. Such transmitted light is refracted into the cover glass 431 and becomes light 939*a*. The OLED TFT layers small holes 450 allow a small part of light 941*a* to pass through to reach the optical sensor layer below. This component of environmental light tends to include light components with large incident angles. The detection light paths can be designed include one or more optical filtering layers between the OLED display pixel layer and above the optical sensor layer to reject or reduce such environmental light 941*a*.

The undesired environmental light can include different wavelength components and thus such different environmental light components should be handled differently to reduce their impacts to the optical fingerprint sensing in implementing the disclosed technology.

For example, the undesired environmental light may include light components that transmit through the finger in the red (e.g., longer than 580 nm) and longer wavelengths and light components that do not transmit through the finger in the shorter wavelengths than the red wavelengths (e.g., less than 580 nm). Due to this wavelength-dependent absorption of the finger, the transmitted environmental light through the finger usually includes some near infrared (IR) and partial of the red light component. Therefore, the optical filtering can be included in the light paths to filter out the undesired environmental light that would otherwise enter the optical sensor layer.

An example design is to use one or more IR blocking filter coatings, e.g., an IR-cut filter coating, to reduce the IR or near IR light in the transmitted light from the finger. However, various IR-cut filters used for imaging devices normally only restrict wavelengths greater than 710 nm. When a device is exposed to direct or indirect sunlight, this filtering performance may not be good enough for reducing IR background light in optical fingerprint sensing. Suitable IR filtering coatings should extend the short end cut-off wavelength to shorter wavelengths below 710 nm, for example, 610 nm, in some applications.

Due to the spectral responses of various IR cut coatings, a single IR cut filter with an extended working band to shorter wavelengths may not provide the desired IR blocking performance. In some filter designs for the under-screen optical sensor module, two or more optical filters may be used in combination to achieve the desired IR blocking performance in the sensor light paths. This use of two or more filters is in part because one significant technical issue is the strong background light from the natural day light from the sun. In the examples of disclosed optical sensor layer below the OLED display pixel layer, an optical filtering mechanism can be built above the optical sensor layer to block or reduce the strong background light from the natural day light from the sun that enters the optical sensor layer. Accordingly, one or more optical filter layers may be provided to block the undesired background day light from the sun while allowing the illumination light for the optical fingerprint sensing to pass through to reach the optical sensor layer.

For example, the illumination light may be in the visible range from the OLED emission for the display, e.g., from 400 nm to 650 nm, in some implementations and the one or more optical filters between the OLED panel and the optical sensor layer can be optically transmissive to light between 400 nm and 650 nm while blocking light with optical wavelengths longer than 650 nm, including the strong IR light in the day light. In practice, some commercial optical filters have transmission bands that may not be desirable for this particular application for under screen optical sensors disclosed in this document. For example, some commercial multi-layer bandpass filters may block light above 600 nm but would have transmission peaks in the spectral range above 600 nm, e.g., optical transmission bands between 630 nm and 900 nm. Strong background light in the day light within such optical transmission bands can pass through to reach the optical sensor array and adversely affect the optical detection for optical fingerprint sensing. Those undesired optical transmission bands in such optical filters can be eliminated or reduced by combining two or more different optical filters together with different spectral ranges so that undesired optical transmission bands in one filter can be in the optical blocking spectral range in another optical filter in a way that the combination of two or more such filters can collectively eliminate or reduce the undesired optical transmission bands between 630 nm to 900 nm. Specifically, for example, two optical filters can be combined by using one filter to reject light from 610 nm through 1100 nm while transmitting visible light below 610 nm in wavelength and another filter to reject light in a shifted spectral range from 700 nm through 1100 nm while transmitting visible light under 700 nm in wavelength. This combination of two or more optical filters can be used to produce desired rejection of the background light at optical wavelengths longer than the upper transmission wavelength.

In addition to using proper optical filtering for cutting background light in the red and IR ranges, the background light that should be reduced by the optical filtering may include light in the shorter wavelength spectral ranges including the UV wavelengths. In some implementations, the environmental light in the UV band should be reduced or eliminated because this band of light generate undesired noise. This elimination can be realized by UV-cut off coating or by material absorption. Finger tissues, silicon, and black oil ink and others tend to absorb the UV light strongly. The material absorption of UV light can be used to reduce the UV light influence to the optical fingerprint sensing.

Figure 13:
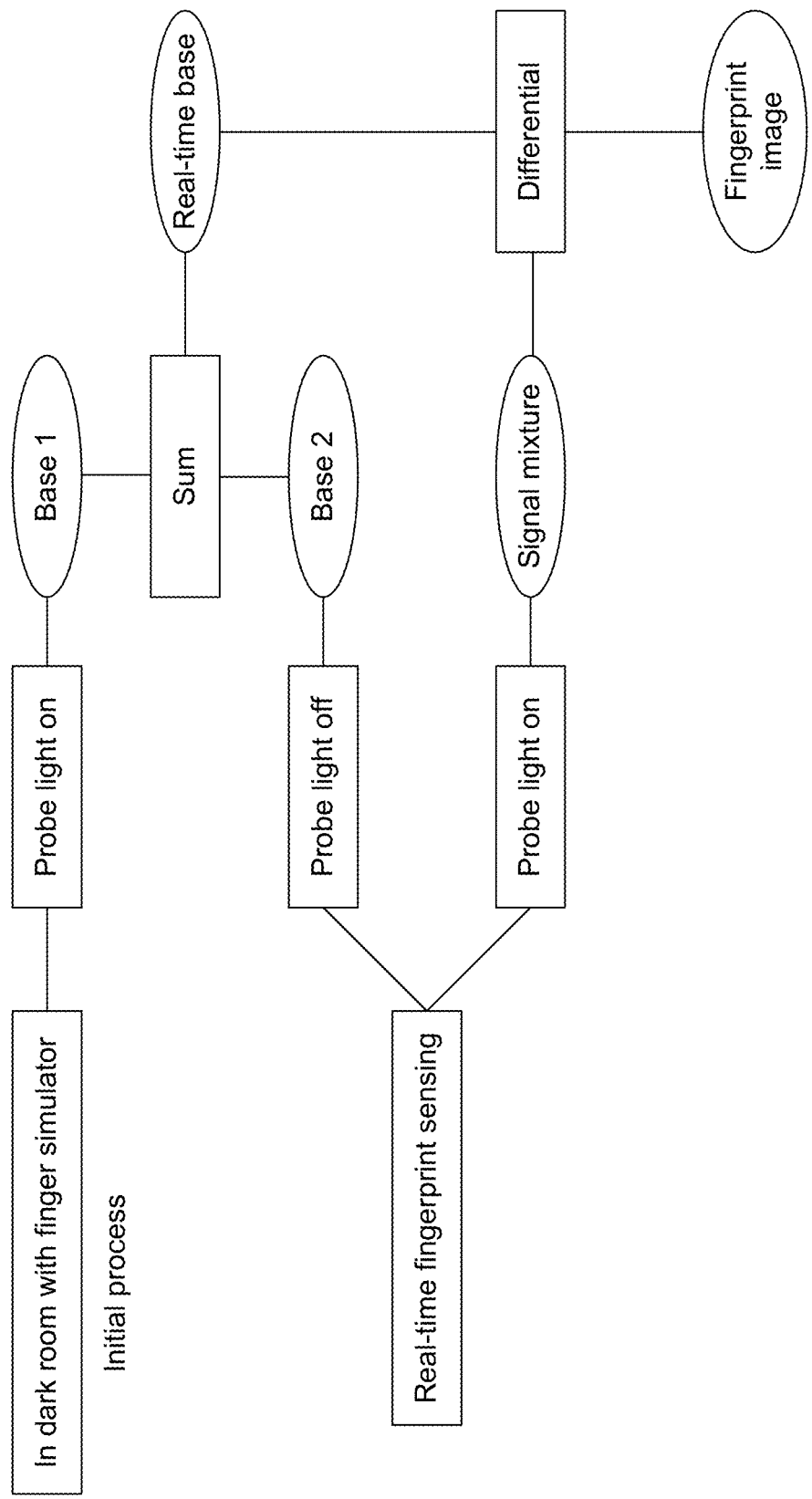
FIG. 13 illustrates an example of a sensor initialization process that measures a baseline background level at the optical sensor array each time a fingerprint is obtained.

The disclosed optical sensing using optical sensors interleaved with the display pixels in FIGS. 2E and 2F may be implemented with a sensor initialization process to reduce undesired influences of the background light. Like the techniques shown in FIGS. 6 and 7, this sensor initialization process is operational in nature. FIG. 13 illustrates an example of this sensor initialization process that measures a baseline background level at the optical sensor array each time a fingerprint is obtained. Before performing the actual fingerprint sensing, in a dark room environment without any environmental light influence, the illumination light or the optical probe light for the optical sensing (the OLED display) is turned on, a finger simulator device is placed on the cover glass to record the image data. The finger simulator device is designed to simulate the finger skin reflection behavior but does not have any fingerprint pattern. This image data obtained from the finger simulator device is saved into memory as the base 1 data for the background light reduction processing in real sensing operations. This process can be a device calibration process done in factory before shipping the device.

In real time fingerprint sensing, the environmental influence is present. In operation, the illumination light or the optical probe light (e.g., the OLED screen) is first turned off to record the image data as base 2, which is made under a condition with the environmental light. This base 2 represents the total influence of all the environmental light residues. The sum of base 1 and base 2 gives the real-time base. Next, the illumination light or optical probe light is turned on to perform fingerprint sensing to capture a real-time signal which is a mixture of the real fingerprint signal from the fingerprint and the real-time base. A differential between the signal mixture and the real-time base can be performed as part of the signal processing to reduce the signal contribution by the environmental light so that the image quality of the fingerprint image can be improved.

Specific Examples of Optical Sensors Interleaved with Display Pixels

Figure 14:
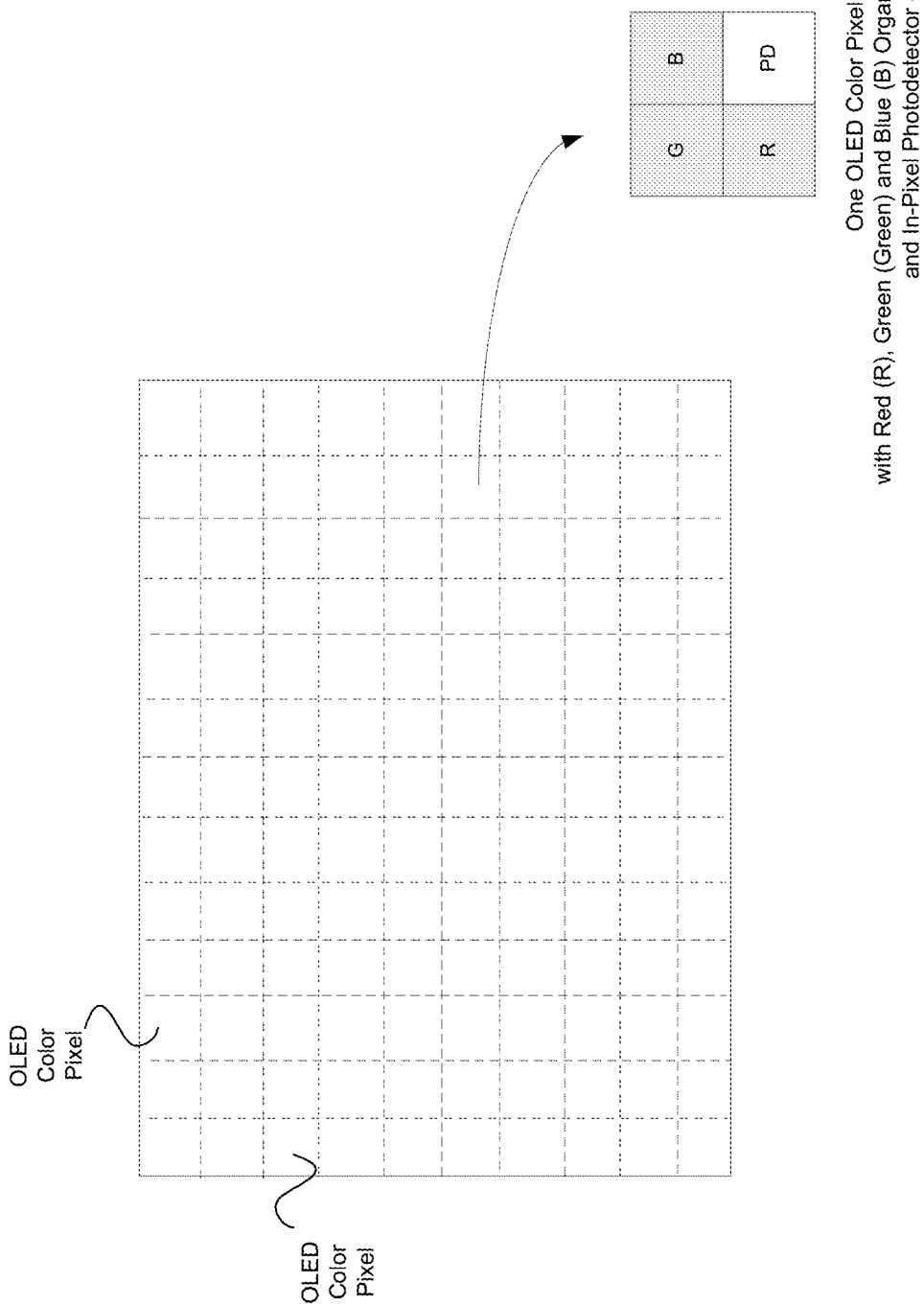
FIG. 14 shows an example of an OLED display where each color pixel includes different colored adjacent OLED pixels and a designated photo detector.

FIG. 14 shows an example of an OLED display panel integrated with spatially distributed optical sensors throughout the OLED display panel in which the optical sensors are spatially interleaved with OLED pixels so that each OLED color pixel includes (1) different colored OLED pixels that collectively produce desired colors for the OLED color pixel (and (2) at least one optical sensor for optical sensing. Under this design, all OLED color pixels are embedded with their own optical sensors to allow full display panel size optical sensing, as initially explained in the examples in FIGS. 2E, 2F and 2G. For example, in some implementations, each OLED color pixel can include, at minimum, a red OLED pixel (R) emitting red light, a green OLED pixel (G) emitting green light, a blue OLED pixel (B) emitting blue light, and an in-pixel photodetector (PD) for optical sensing by and within the OLED color pixel. An example of such an OLED color pixel in FIG. 14 is shown in the insert when viewed from a direction perpendicular to the OLED display panel, in which the in-pixel photodetector (PD) is shown to be shifted in position relative to the RGB OLED pixels within its OLED color pixel. The optical imaging spatial resolution of this optical sensing design is the same as the spatial display resolution defined by the individual OLED color pixel having different OLED pixels emitting different colors.

FIG. 15 shows an example that implements the OLED-PD structure shown in FIG. 2E. FIG. 15A of FIG. 15 shows that OLED display top layers 401 (e.g., sealing layers), an OLED pixel layer 403 with distributed photodetectors (PDs) and an TFT circuitry layer 407 are grown or fabricated over the same substrate. FIG. 15B of FIG. 15 shows a more detailed view of the OLED pixel structure 409 of a single OLED color pixel which includes different OLED pixels (e.g., 409R, 409B and 409G) emitting different colors (e.g., red, blue and green light) and a PD structure 411 for one OLED color pixel. The illustrated example includes an optical collimation structure 411C located above a PD 411P with each OLED color pixel to limit the angular range of incident light that can be collected by the PD 411P so that incident light at large incident angles are rejected by the optical collimation structure 411C from being received by the underlying PD 411P, thus enhancing the spatial resolution of each PD 411P and the imaging resolution of the image captured by the array of the optical sensors. The optical collimation structure 411C may include an optical collimation lens, a spatial aperture, a pinhole, a tubular collimator, or other structures, including a lens-pinhole combination assembly that includes a lens and a pinhole in alignment with each other along the optical axis of the lens.

FIG. 15C shows a top view of the example of the OLED color pixel with different OLED pixels (e.g., 409R, 409B and 409G) emitting different colors and PD structure 411 as shown in FIG. 15B. The OLEDs and the photodetectors 411 are connected to a power driver and programed controller module 413. A memory module 415 is coupled to receive the data for the detected signals from the photodetectors 411 embedded in corresponding OLED color pixels and the received data is processed as part of the optical sensing.

FIG. 16 shows an example that implements the OLED-PD structure shown in FIG. 2F in which photodetectors 417 of the optical sensor array are formed outside the OLED pixel layer 403 of the OLED display panel but are directly formed in a thin film transistor (TFT) layer 407 on the same substrate for forming the OLED display pixel layer 403 as a display size photodetector array to use the entire OLED display panel surface as an optical sensing surface. As in FIGS. 14 and 15, FIG. 16 only shows a single OLED color pixel of OLED color pixels in the OLED display panel. FIG. 16A of FIG. 16 shows the layer structure and FIG. 16B shows the pixel construction and the PD construction. Similar to the design in FIG. 15, an optical collimation structure 417C is provided and located above a PD 417P within the TFT layer 407 to limit the angular range of incident light that can be collected by the PD 417P so that incident light at large incident angles are rejected by the optical collimation structure 417C from being received by the underlying PD 417P. FIG. 16C shows a top view of the example OLED color pixel with different OLED pixels (e.g., 409R, 409B and 409G) emitting different colors and PD structure 417 as shown in FIG. 16B. The OLEDs and the photodetectors 417 are connected to a power driver and programed controller module 413. A memory module 415 is coupled to receive the detected signals from the photodetectors 417 that spatially overlap with corresponding OLED color pixels.

FIG. 17 shows an example that implements the OLED-PD structure in which photodetectors 419 of the optical sensor array are formed in a separate layer 421 outside the OLED pixel layer 403 and the TFT layer 407. The separate layer 421 can be formed on a separate substrate different from a substrate for fabricating the layers 407 and 403 in some implementations. FIG. 17A of FIG. 17 shows the layer structure and FIG. 53B shows the pixel construction and the PD construction. An optical collimation structure 419C is provided and located above a PD 419P to limit the angular range of incident light that can be collected by the PD 419P so that incident light at large incident angles are rejected by the optical collimation structure 419C from being received by the underlying PD 419P. FIG. 17C shows a top view of the example OLED color pixel with different OLED pixels (e.g., 409R, 409B and 409G) emitting different colors and PD structure 419 as shown in FIG. 17B.

Figure 18:
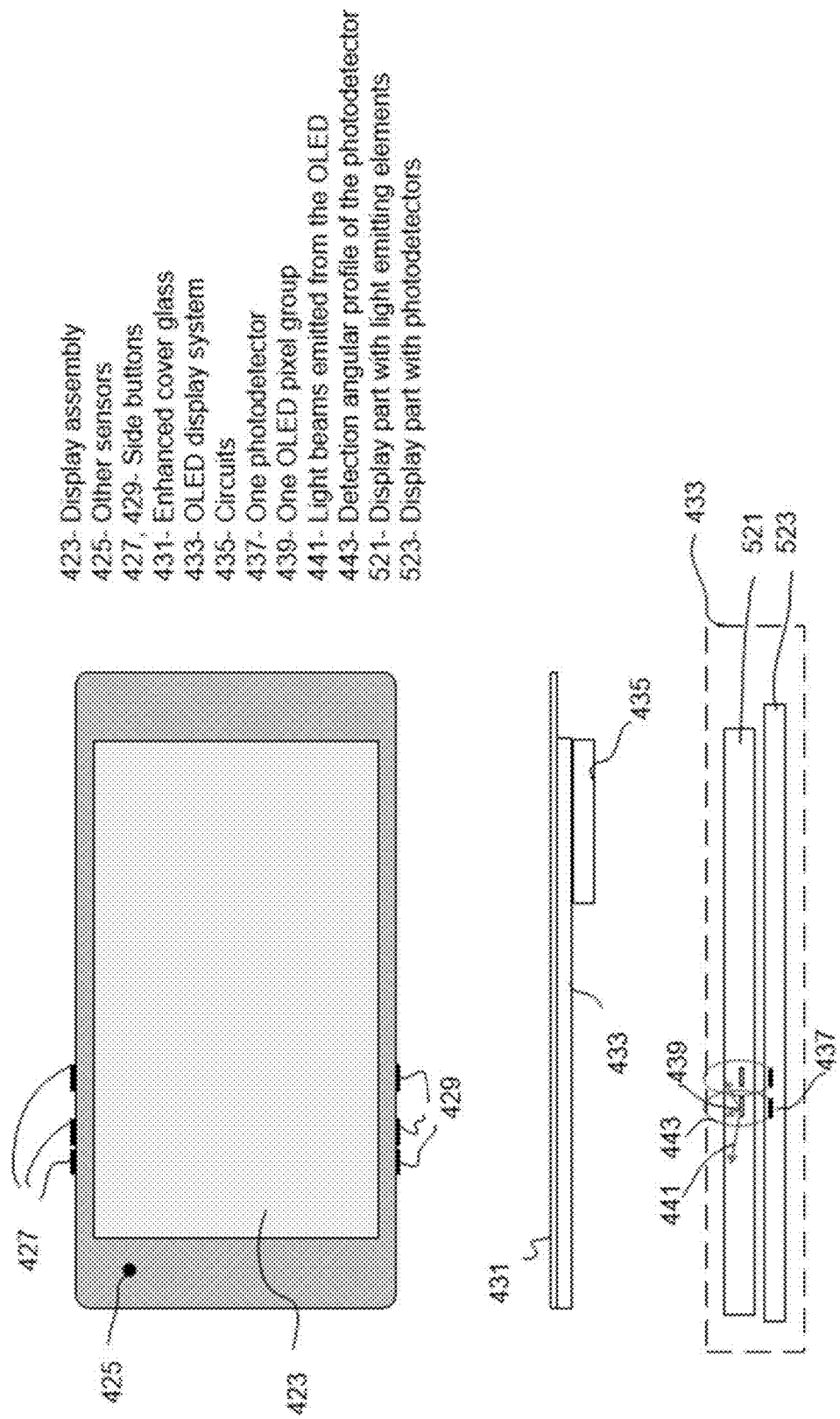

FIG. 18 shows an example of an OLED display system 433 that is further integrated with an enhanced cover glass 431, some other sensors 425, and side buttons 427 and 429 to form the display assembly. In this example, the photodetectors 437 are located in a layer below the OLED pixel layer having OLED light emitting elements forming OLED color pixels 439. As illustrated by two adjacent examples of the photodetectors 437, the photodetectors 437 are spatially distributed throughout the OLED display within respective OLED color pixels 439. A processing circuit 435 is provided to enable or manage various functions or operations for the user to operate the terminal. The OLED display system 433 can be divided into two parts: one part having the light emitting elements forming OLED color pixels 439, and the other part having photodetectors 437. Each OLED pixel group as an OLED color pixel 439 emits light beams 441 in different directions. A photodetector 437 for the OLED pixel group or OLED color pixel 439 can be designed to selectively receive light coming the top of the OLED display for optical fingerprint sensing. For example, as illustrated, the optical reception of the photodetector 437 can be a collimated detection and has an angular sensitivity profile 443 that generally exhibits a high detection sensitivity when light comes from the top directions. An optical collimator or other optical element may be provided to each photodetector 437 for the OLED pixel group or OLED color pixel 439 to achieve the desired collimated optical detection.

For optical sensing, the photodetectors 437 which are spatially distributed throughout the OLED display within respective OLED color pixels 439 enable optical detection over the entire OLED display screen surface by detecting light from the top surface of the OLED display screen. Such light to be detected can be caused by different light sources, including, for example, light present in the environment in which the device is operated such as natural light or ambient light. The light emitted by the OLED color pixels for displaying image on the device, when turned on, can also cause reflected or scattered light from a finger in the top surface of the OLED display screen for detection by the photodetectors 437. In various applications, it is desirable to include designated or extra illumination light sources located above the photodetectors 437 distributed over the OLED display area to enable improved optical sensing operations.

FIG. 19 shows an example of an OLED display with spatially distributed photodetectors that are placed under and are spatially interleaved with OLED pixels for the example shown in FIG. 18 under the design in FIG. 2F. FIG. 19 includes FIG. 19A showing OLED light rays and corresponding components relative to different spatial zones formed by the OLED light rays and FIG. 19B showing a top view of the different spatial zones formed by the OLED light rays. In this example, the spatially distributed photodetectors (e.g., 233, 235) are in a layer below the OLED pixel layer having OLED pixels (e.g., 72, 74) and the cover glass 431 and other display layers 521 may be bonded together (e.g., with glue) so that the total reflection can happen at the cover glass surface. Referring to FIG. 19B, the light emitted from OLED region 241 (such as an OLED color pixel of different adjacent emitting OLED pixels of different colors) forms a central beam zone 243, a sensing zone 247 in a circular shape surrounding the central beam zone 243 and a total reflection zone 245 outside the sensing zone 247. Referring to FIG. 19A, when the emitting OLEDs 74 and the corresponding receiving photodetectors 233 are set at their locations with known spacing L between them and the known layer thickness parameters H1 and H2, the location or coordinate LF of the corresponding total reflection zone 231 at a location between the OLED pixels 74 and the photodetectors 233 on the top sensing surface can be calculated or determined. When the size A of the emitting OLEDs 74 and the size D of the processing photodetectors 233 are known, the size W of the corresponding total reflection zone 231 can also be calculated. Generally, W is smaller than D if the emitting OLEDs size is small enough. Enlarging the size A of the emitting OLEDs 74 and the size of a receiving photodetector can cause the optical detection resolution to be reduced. Based on the geometric optics, in a particular given design with known parameters, when the emitting OLEDs 74 or the size of one photodetector is enlarged by 1 unit, it is possible to cause the resolution of the detection to be reduced by one half unit.

Assuming the environment above the top sensing surface is air which has a refractive index of nearly 1, the minimum total reflection incident angle $\theta$ for a light ray from the emitting OLEDs 74 to the top sensing surface of the cover glass can be calculated by $\theta=\sin^{-1}(1/n)$, where n is the refractive index of the cover glass. As a result, the central light beams zone 243 can be calculated by the angle $\theta$ and the distance H1. The rest positions are located in the total reflection zone 245. For example, if n=1.51, and H1=0.6 mm, for a point light source, the diameter of the central light beams zone is about 1.06 mm. If H2 is given, the closest photodetector distance Lmin can be calculated. For example, H2=0.6 mm, the Lmin is about 1.06 mm.

Because the refractive index of the finger skin (typically 1.43~1.44) is normally lower than the refractive index n of the cover glass, the tilt angle $\theta$ for the light rays from the OLEDs 74 to the corresponding total reflection zone 231 on the top sensing surface can be sufficiently large to cause the total internal optical reflection at the top sensing surface so that light emitted by the OLEDs 74 is not coupled through the top sensing surface to enter the space above the top sensing surface. As such, a finger above the top sensing surface cannot interact with the emitted OLED light and this total internal reflection condition may be maintained unless a finger is in contact with the top sensing surface of the cover glass. This condition for the total internal reflection can be used to estimate the location of the furthest photodetector 233 at a distance Lmax and no total internal reflection occurs at the top sensing surface for photodetectors that are located closer than Lmax. Accordingly, for a given OLED pixel 241, there is a circular sensing zone 247 with a radial distance less than Lmax in which light emitted by the OLED pixel 241 can be partially reflected at the top sensing surface and partially refracted into the space above the top sensing surface for optical sensing of a finger. The region 245 outside the circular sensing zone 247 on the top sensing surface has a distance from the OLED pixel 241 greater than Lmax and thus any light from the OLED pixel 241 is totally reflected. For example, for a device having H2 at 0.6 mm, and the refractive index of a finger is estimated at 1.44, the Lmax is about 3.80 mm. Namely, the effective sensing zone 247 diameter is about 3.80 mm. After taking away the central light beam zone 241, the total effective sensing area is about 10.47 mm². Therefore, to detect 100 mm² fingerprint, about 10 groups of OLEDs should be used. If the local frame rate is 100 fps and each frame only one group of OLEDs is lit on, 0.1 second is enough to detect a fingerprint.

For an optical sensing resolution of 50 micron, if one photodetector is as small as 10 microns, each group of OLEDs can be of 0.1×0.1 mm². In performing the optical sensing, the total emitting light power can be set high (e.g. 0.1 mW) momentarily to cause a strong optical signal at the optical sensors that are spatially interleaved with the OLED display pixels to improve the SNR for the detection. The high resolution fingerprint sensing can also be used to sense the palm print or palm vein print.

Extra Illumination and Optical Sensors Interleaved with Display Pixels

In implementing an OLED display with spatially distributed photodetectors under FIG. 2E or 2F, in addition to using the OLED display light to illuminate the top sensing surface for optical sensing, one or more extra illumination light sources can be provided to enhance or improve the optical sensing operation. The one or more extra illumination light sources allow optical illumination for the optical sensing without turning on OLED pixels of the OLED display to save power during the fingerprint sensing process and also provide other features in optical sensing.

Figure 20:
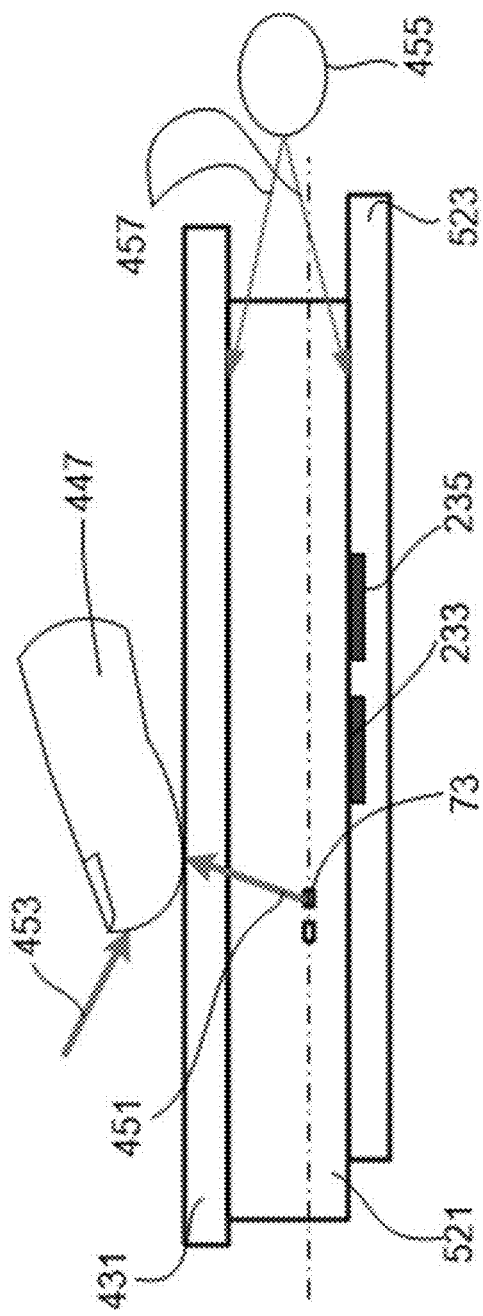
FIG. 20 shows an example for providing one or more extra illumination light sources to optical sensors that are spatially interleaved with OLED pixels in the OLED display panel for optical sensing.

FIG. 20 shows an example of an OLED display system with integrated optical sensors that are spatially distributed in OLED color pixels throughout the display panel so that the photodetectors collectively provide high resolution touch sensing. In this example, one or more extra illumination light sources 455 are provided to emit illumination light (e.g., IR light) for optical sensing.

In operation, a finger 447 may be illuminated by background light 453 coming from the surroundings and display light 451 from OLED pixels. The finger scattered light is received by some of the photodetectors, such as 233 and 235. The background light 453 may come from other light sources such as from the sun, or come from other places of the same display. When the finger 447 touches the display screen, the finger scatters partial of the light from the local OLEDs. This can increase the brightness of the local positions. This brightness change is correlated with the local display frame alternation. When the finger 447 touches the display screen, the finger 447 absorbs partial of the background light. This can reduce the brightness of the background. This brightness change is weakly correlated with the local display frame alternation.

If images captured at different frames are compared, the comparison shows the difference so that the touching induced dynamic influences can be sensed. Because the photodetectors are distributed with a similar spatial resolution of the display pixels, the optical touch sensing features a high resolution in the optically captured images of the finger. In implementations, the one or more extra illumination light sources 455 can be used to illuminate a finger during the fingerprint sensing and user authentication process while allowing the display screen to be in a full or partial sleep mode and the optical sensing can be used as a trigger for to wake up a sleeping display.

In a situation where both the background and the display are fully dark, one or more extra light sources 455, such as some infrared LEDs, can be used to provide illumination for optical sensing. The extra light sources 455 may be installed along the edge of the display and the light beams 457 is scattered by the OLEDs electrode structures, the cover glass surfaces, and the bottom absorbing materials so that the illumination is effective for whole display. The extra light sources 455 can be used to wake up a sleeping display when both the background and the display are dark. The extra light sources can also be directly used for the touch sensing. The optical touch sensing process is also effective in the cases that the finger is covered by a fabric material such as a glove, or other material other than finger is touching the display when the function is activated.

This display technology is open to be integrated with a regular touch sensor panel, such as a capacitive touch sensor panel, to realize touch sensing function.

Referring to FIG. 10 and related description, in addition to optical sensing of a pattern of an object such as a fingerprint, the spatially distributed photodetectors that are interleaved with OLED pixels can be used to provide high resolution touch force sensing. When the touch force changes, there are several related changes that can be detected so as to calculate the touch force: cover glass and display module deforming, touching finger contacting area change, and fingerprint deforming. Because the optical touch sensing has a high imaging resolution, a change in the touching finger contact area and fingerprint deforming can be detected through comparing between a sequence of frames of signals. Upon calibration, the touching force change can be determined. This optical sensing based touch force sensing may be combined with other touching force sensors, such as distributed capacitive touch force sensor, PZT touch force sensor etc. The presence of such other non-optical force sensors can be used to detect a hard device to touch the display screen.

In the disclosed optical sensing technology, one or more extra light sources can be used to illuminate the finger to be detected to improve the optical fingerprint sensing, e.g., by improving the signal to noise ratio in the detection. In this regard, an electronic device capable of detecting a fingerprint by optical sensing can be designed to include a device screen that provides touch sensing operations and includes a display panel structure having light emitting display pixels where each pixel is operable to emit light for forming a portion of a display image, a top transparent layer formed over the device screen as an interface for being touched by a user for the touch sensing operations and for transmitting the light from the display structure to display images to a user, and one or more extra illumination light sources located to provide additional illumination light to the top transparent layer formed over the device screen as the interface for being touched by a user. Optical sensors are provided to spatially interleave with the display pixels as illustrated in FIGS. 2E and 2F to receive light that is emitted by at least a portion of the light emitting display pixels of the display structure and by the one or more extra illumination light sources and is returned from the top transparent layer to detect a fingerprint. Such received light by the optical sensors carries an image in the received light which can be processed for fingerprint sensing and other optical sensing.

Referring back to FIG. 20, the two or more extra light sources 455 can be placed above the OLED display pixel layer. Each extra light source may be one light source or include multiple sources, for example, LED light sources. The extra light sources may be operable to emit light at one single wavelength or at multiple wavelengths (for example, green LED, red LED, near IR LED). The extra light sources 455 may be modulated to produce modulated illumination light or be operated to turn on their emission at different phases. The extra light sources 455 can be used on optical sensing in different ways. First, the illumination light from the extra light sources 455 that is directed within the display panel towards the cover glass can be reflected at the finger-glass interface to generate reflected or back scattered probe light that carries the fingerprint pattern on the exterior of the finger skin as shown in FIGS. 5A and 5B. This reflected signal can carry an optical reflective pattern representing the external fingerprint pattern formed by the ridges and valleys of the finger. Second, a portion of the illumination light from the extra light sources 455 may enter the finger and the scattering of this portion of the illumination light by the internal tissue structures as explained in FIGS. 5C and 5D can carry an optical transmissive pattern associated with the fingerprint pattern and the internal tissue structures, which is also explained in FIGS. 5C and 5D. The tissues in the finger scatter the illumination light to produce scattered probe light in various directions, including back scattered probe light with the optical transmissive pattern for optical fingerprint sensing. The back scattered probe light propagates back through the top transparent surface to enter the TFT layers towards the optical sensors.

As explained with respect to FIGS. 5C and 5D, the back scattered probe light from the probe light propagates through the finger skin and the fingerprint ridge and valley areas manifest light signals with a spatial varying brightness pattern in an optical transmissive pattern due to interactions with the internal finger tissues associated with the external ridges and valleys of the finger and this brightness contrast forms part of the fingerprint pattern and is caused by the finger tissue absorption, refraction, and reflection, by finger skin structure shading, and by reflectance difference at the finger skin-display cover glass interface. Because of the complicated mechanism of the fingerprint contrast, the fingerprint can be detected even if the finger is dry, wet, or dirty.

The background light present at the device can generally include two different portions: the environmental or background light incident to the finger and environmental or background light incident to the top transparent layer without entering the finger. The environmental or background light that propagates into finger and is scattered by the finger tissues. Some of the scattered light in the scattered background light propagates back towards the optical sensors through the finger. A portion of the environmental light that does not go through the finger may enter the optical sensor layer and thus could adversely impact the optical sensing operation.

When extra light sources are provided for optical sensing, the illumination power for optical sensing is no longer limited by the optical power from the OLED display light. Such extra light sources can be designed to provide sufficient illumination for optical sensing to improve the optical detection signal to noise ration to offset the environmental light influence. In implantations, the extra light sources can be modulated without affecting the display function and lifetime. In addition, the extra light sources can be flashed with high output power for a short time during the fingerprint sensing so as to obtain optimized detection. In addition, the use of extra light sources can provide flexibility in the determination of whether a detected finger is a live finger so that fake fingerprint detection can be avoided. For example, green LEDs and near IR LEDs may be used as extra light sources to also assist the live finger detection as explained with reference to FIGS. 8A and 8B where finger tissues absorb the green light strongly so that the finger image manifests a desired large brightness gradient and the near IR light illuminates all through the finger so that the finger image brightness appears more uniform.

Figure 21A:
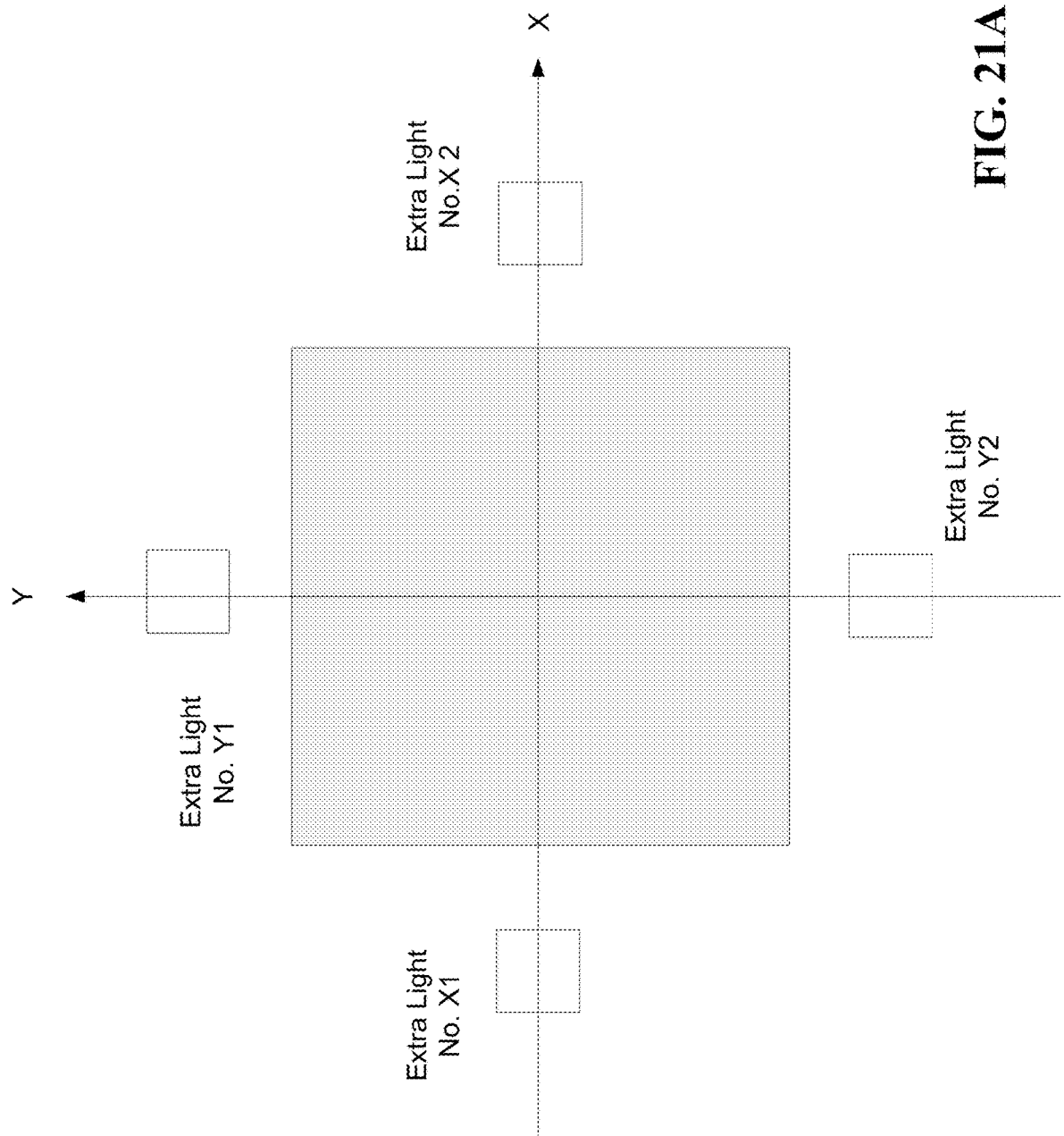
FIG. 21A shows an example for placing 4 extra illumination light sources in two orthogonal directions on opposite sides of the fingerprint sensing area based on the design in FIG. 5D.

Specific Examples for Placing Extra Illumination Light Sources to Obtain Optical Transmissive Patterns FIGS. 21A and 21B show examples of under-OLED optical sensor module designs for placing extra illumination light sources to obtain optical transmissive pattern by directing the illumination light to transmit through a finger under the detection.

FIG. 21A shows an example for placing 4 extra illumination light sources in two orthogonal directions on opposite sides of the fingerprint sensing area based on the design in FIG. 5D. This example is one implementation of an electronic device capable of detecting a fingerprint by optical sensing that includes a display panel that includes light emitting display pixels operable to emit light for displaying images; a top transparent layer formed over the display panel as an interface for user touch operations and for transmitting the light from the display panel to display images, the top transparent layer including a designated fingerprint sensing area for a user to place a finger for fingerprint sensing; and optical sensors that that are spatially interleaved with display pixels to receive light that is emitted by at least a portion of the light emitting display pixels and is returned from the top transparent layer to detect a fingerprint. This device further includes extra illumination light sources located at different locations to produce different illumination probe beams to illuminate the designated fingerprint sensing area on the top transparent layer in different illumination directions. Each extra illumination light source can be structured to produce probe light in an optical spectral range with respect to which tissues of a human finger exhibit optical transmission to allow probe light in each illumination probe beam to enter a user finger over the designated fingerprint sensing area on the top transparent layer to produce scattered probe light by scattering of tissues inside the finger that propagates towards and passes the top transparent layer to carry both (1) fingerprint pattern information and (2) different fingerprint topographical information associated with the different illumination directions, respectively, caused by transmission through internal tissues of ridges and valleys of the finger. A probe illumination control circuit is coupled to control the extra illumination light sources to sequentially turn on and off in generating the different illumination probe beams at different times, one beam at a time, so that the optical sensor module located below the display panel is operable to sequentially detect the scattered probe light from the different illumination probe beams to capture both (1) the fingerprint pattern information and (2) the different fingerprint topographical information associated with the different illumination directions, respectively.

FIG. 21B shows that a first illumination probe beam is directed to illuminate a designated fingerprint sensing area over the top transparent layer in a first illumination direction and to enter a user finger over the designated fingerprint sensing area to produce first scattered probe light by scattering of tissues inside the finger that propagates towards and passes the top transparent layer by transmission through internal tissues of ridges and valleys of the finger to carry both (1) a first 2-dimensional transmissive pattern representing a fingerprint pattern formed by bridges and valleys of the finger, and (2) a first fingerprint topographical pattern that is associated with the illumination of internal tissues of ridges and valleys of the finger in the first illumination direction and is embedded within the first 2-dimensional transmissive pattern. While under the illumination by the first illumination probe beam, the optical sensors are operated to detect transmitted part of the first scattered probe light that passes through the top transparent layer and the display panel to reach the optical sensor array so as to capture both (1) the first 2-dimensional transmissive pattern, and (2) the first fingerprint topographical pattern.

Next, a second illumination probe beam, while turning off the first illumination light source, is directed to illuminate the designated fingerprint sensing area over the top transparent layer in a second, different illumination direction and to enter the user finger to produce second scattered probe light by scattering of tissues inside the finger that propagates towards and passes the top transparent layer by transmission through internal tissues of ridges and valleys of the finger to carry both (1) a second 2-dimensional transmissive pattern representing the fingerprint pattern, and (2) a second fingerprint topographical pattern that is associated with the illumination of the internal tissues of ridges and valleys of the finger in the second illumination direction and that is embedded within the second 2-dimensional transmissive pattern. The second topographical pattern is different from the first topographical pattern due to different beam directions of the first and second illumination probe beams. See FIG. 5C and FIG. 5D. While under the illumination by the second illumination probe beam, the optical sensors are operated to detect transmitted part of the second scattered probe light that passes through the top transparent layer and the display panel to reach the optical sensor array so as to capture both (1) the second 2-dimensional transmissive pattern, and (2) the second fingerprint topographical pattern.

Subsequently, a detected fingerprint pattern is constructed from the first and second transmissive patterns and the first and second fingerprint topographical patterns are processed to determine whether the detected fingerprint pattern is from a natural finger.

When extra illumination light sources are provided for optical sensing, the illumination power for optical sensing is no longer limited by the optical power from the OLED display light. Such extra illumination light sources can be designed to provide sufficient illumination for optical sensing to improve the optical detection signal to noise ration to offset the environmental light influence. In implantations, the extra illumination light sources can be modulated without affecting the display function and lifetime. In addition, the extra illumination light sources can be flashed with high output power for a short time during the fingerprint sensing so as to obtain optimized detection. Furthermore, the use of extra illumination light sources can provide flexibility in the determination of whether a detected finger is a live finger so that fake fingerprint detection can be avoided. For example, green LEDs and near IR LEDs may be used as extra light sources to also assist the live finger detection where finger tissues absorb the green light strongly so that the finger image manifests a desired large brightness gradient and the near IR light illuminates all through the finger so that the finger image brightness appears more uniform. For another example, extra illumination light sources can be used to provide optical fingerprint sensing based on optical transmissive patterns by optical transmission of the probe illumination light through the internal tissues associated with the external finger ridges and valleys as explained in FIGS. 5A through 5D.

In implementations, the use of a pinhole-lens assembly as the optical collimation structure for each optical sensor in the optical sensors that are spatially interleaved with the OLED color pixels can enhance the optical imaging. FIGS. 22A and 22B show two examples for using a pinhole-lens assembly as the optical collimation structure 411C, 417C or 419C in FIG. 15, 16 or 17, respectively. In FIG. 22A, the illustrated optical collimator structure includes a microlens 2210 and a pinhole 2220 that are aligned with each other along the optical axis of the microlens 2210 as a lens-pinhole collimation structure placed above the photodetector (PD) that is associated with one OLED color pixel with different OLED pixels. The incident light to the photodetector enters the microlens 2210 and passes through the pinhole 2220 to reach the underlying PD. A pinhole support 2230 is provided to support a pinhole structure such as an opaque film or layer formed with a center hole as the pinhole 2220. In the illustrated example in FIG. 22A, the lens 2210 is a hemisphere microlens with its top spherical surface facing the top glass over the display panel to receive incident light from the top glass for optical sensing of a fingerprint. The hemisphere microlens 2210 has a bottom circular flat surface on which the pinhole 2220 is located at or near the center of the bottom circular flat surface. This particular lens-pinhole assembly enable a wide field of view and a large incident aperture for receiving incident light and focus the received incident light to the central region of the bottom circular flat surface of the microlens 2210. The pinhole 2220 provides a spatial aperture to limit the effective numerical aperture (NA) of the lens-pinhole assembly to reduce optical cross talk between adjacent optical sensors of two adjacent OLED color pixels. The size of the pinhole 2220 can be set sufficiently small so that light from the space above an adjacent OLED color pixel can be largely blocked by the small centrally located pinhole 2220.

The above use of a pinhole to (1) limit the effective NA and (2) to reduce optical cross talk with one or more adjacent regions or OLED color pixels may be further enhanced by including at least one more pinhole located between the pinhole 2220 and the underlying photodetector (PD). One example of this design is shown in FIG. 22B where a second pinhole 220 is formed between the first pinhole 2220 and the photodetector. Incident light or other stray light with large incident angles that is received by the lens 2210 and passes through the first pinhole 2220 at the bottom of the lens 2210 can be further spatially filtered by the presence of the second pinhole 220 and thus blocked from reaching the photodetector PD. This combination of two pinholes 2220 and 2240 at two different locations along the optical path of the incident light to the photodetector PD reduces the optical crosstalk and the undesired stray light in optical sensing while still allowing the microlens 2210 to operate with a sufficiently large NA in collecting incident light to achieve a high imaging resolution at the photodetector PD. In implementations, a second pinhole support structure 2242 may be provided to provide a structure for forming the second pinhole 2240.

FIGS. 23A and 23B show additional examples for using a lens-pinhole assembly. In FIG. 23A, the spatial positions of the microlens 2210 and the pinhole 220 are different from those in FIGS. 22A and 22B: the pinhole 2220 is placed above the microlens 2210 to collect the incident light so that the collected light is directed to pass through the underlying microlens 2210. This pinhole-lens collimation structure provides a large aperture by placing the pinhole 2220 as the input of the collimation structure while the microlens 2210 focuses the collected light onto the PD. The lens 2210 may be a hemisphere microlens with its top spherical surface to interface with the pinhole 2220 and to receive incident light from the top glass for optical sensing of a fingerprint. In FIG. 23B, the hemisphere microlens 2210 is oriented to place its circular flat surface to interface with the pinhole 2220 and to receive incident light from the top glass for optical sensing of a fingerprint. This arrangement can be advantageous in reducing optical distortions by the imaging operation of the microlens 2210 since the pinhole 2220 is located at the central region of the flat surface of the microlens 2210.

In implementations, different collimation structures shown in FIGS. 22A and 22B are placed to align with different optical detectors that are interleaved with OLED color pixels, respectively, one collimation structure per optical detector. In FIG. 15, a pinhole-lens collimation structure or lens-pinhole collimation structure is used to implement the collimator 411C in the layer 403, or above the layer 403 but below the top layer(s) 401. In FIG. 16, a pinhole-lens collimation structure or lens-pinhole collimation structure is used to implement the collimator 417C in the layer 407, or above the layer 407 but below the OLED layer(s) 403. In FIG. 17, a pinhole-lens collimation structure or lens-pinhole collimation structure is used to implement the collimator 419C in the layer 421, or above the layer 421 but below the layer(s) 407.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. An electronic device capable of detecting a fingerprint by optical sensing, comprising:
   a display panel that includes light emitting display pixels operable to emit light for displaying images;
   a top transparent layer formed over the display panel as an interface for user touch operations and for transmitting the light from the display panel to display images, the top transparent layer including an optical sensing area that overlays with the display panel for a user to place a finger for fingerprint sensing;
   optical detectors that are spatially distributed across the light emitting display pixels and are spatially interleaved with the light emitting display pixels to provide optical sensing across the display panel, each optical detector operable to convert received light that carries a part of a fingerprint pattern of the user into a detector signal and detector signals from the optical detectors collectively representing the fingerprint pattern;
   optical collimation structures that are spatially distributed so that each optical collimation structure is coupled to a corresponding optical detector to spatially select incident light to be detected by the optical detector; and
   a controller configured to capture a plurality of frames from the optical detectors, wherein the plurality of frames comprise:
   a first frame of the plurality of frames corresponding to a calibration measurement taken once with no background light and one or more of the light emitting display pixels being turned on illuminating a finger simulator, the first frame being stored in a memory of the controller,
   a second frame of the plurality of frames taken with background light from an environment of the electronic device illuminating the finger with the light emitting display pixels being turned off, wherein the controller is configured to generate a first sum of the first frame and the second frame representing a background base image, and
   a third frame of the plurality of frames taken with one or more of the light emitting display pixels being turned on and with background light, wherein the third frame represents a mixture of a fingerprint pattern image and the background base image, wherein the controller is further configured to subtract the first sum of the first frame and the second frame from the third frame to generate a difference frame representing the fingerprint pattern image.

2. The device as in claim 1, wherein:
the optical detectors and the light emitting display pixels are formed in a common layer in the display panel.

3. The device as in claim 1, wherein:
the optical detectors and the light emitting display pixels are formed in two different layers in the display panel.

4. The device as in claim 1, wherein:
the optical detectors and the light emitting display pixels are formed in a common layer in the display panel, and the optical detectors are formed in a thin film transistor layer.

5. The device as in claim 1, wherein:
each optical collimation structure includes a lens.

6. The device as in claim 1, wherein:
each optical collimation structure includes a pinhole.

7. The device as in claim 1, wherein:
each optical collimation structure includes a combination of a lens and a pinhole layer structured to include a pinhole.

8. The device as in claim 7, wherein:
the lens is positioned to receive incident light from the top transparent layer formed over the display panel; and the pinhole is positioned between the lens and a corresponding optical detector.

9. The device as in claim 8, further comprising:
a second pinhole layer structured to support a second pinhole,
wherein the second pinhole is located between the pinhole and the corresponding optical detector to provide additional spatial filtering of light that transmits through the pinhole.

10. The device as in claim 1, further comprising:
one or more optical filters to block or reduce an amount of environmental light from entering the optical detectors.

11. The device as in claim 10, wherein:
the one or more optical filters are designed to filter out infrared light.

12. The device as in claim 10, wherein:
the one or more optical filters are designed to filter out UV light.

13. An electronic device capable of detecting a fingerprint by optical sensing, comprising:
a display panel that includes light emitting display pixels operable to emit light for displaying images;
a top transparent layer formed over the display panel as an interface for user touch operations and for transmitting the light from the display panel to display images, the top transparent layer including a sensing area that overlays with the display panel for a user to place a finger for fingerprint sensing;

optical detectors that are spatially distributed across the light emitting display pixels and are spatially interleaved with the light emitting display pixels to provide optical sensing across the display panel, each optical detector operable to convert received light that carries a part of a fingerprint pattern of the user into a detector signal and detector signals of the optical detectors collectively representing the fingerprint pattern;

one or more extra illumination light sources, separate from the display panel, to provide illumination at the top transparent layer for illuminating a finger for fingerprint sensing; and a controller configured to capture a plurality of frames from the optical detectors, wherein the plurality of frames comprise:

a first frame of the plurality of frames corresponding to a calibration measurement taken once with no background light and one or more of the light emitting display pixels being turned on illuminating a finger simulator, the first frame being stored in a memory of the controller, a second frame of the plurality of frames taken with a background light from an environment of the electronic device illuminating the finger and the light emitting display pixels being turned off, wherein the controller is configured to generate a first sum of the first frame and the second frame representing a background base image, and a third frame of the plurality of frames taken with one or more of the light emitting display pixels being turned on and with background light, wherein the third frame represents a mixture of a fingerprint pattern image and the background base image, wherein the controller is further configured to subtract the first sum of the first frame and the second frame from the third frame to generate a difference frame representing the fingerprint pattern image.

14. The device as in claim 13, wherein:
the optical detectors and the light emitting display pixels are formed in a common layer in the display panel.

15. The device as in claim 14, further comprising a thin film transistor layer, wherein the common layer is between the top transparent layer and the thin film transistor layer.

16. The device as in claim 13, wherein:
the optical detectors and the light emitting display pixels are formed in two different layers in the display panel.

17. The device as in claim 16, wherein:
the optical detectors are formed in a thin film transistor layer.

18. The device as in claim 16, further comprising:
a thin film transistor layer that is separated from the two different layers for the optical detectors and light emitting display pixels.

19. The device as in claim 13,
wherein the controller controls the one or more extra illumination light sources to provide illumination for optical sensing without turning on the light emitting display pixels in the display panel.

20. The device as in claim 13, wherein:
each extra illumination light source emits probe light at different probe wavelengths; and
the controller processes optical detector signals from the optical detectors from sensing the probe light at the different probe wavelengths to determine whether a detected fingerprint is from a finger of a live person.

21. The device as in claim 13, wherein:
the one or more extra illumination light sources include different extra illumination light sources located outside the display panel at different locations to produce different illumination probe beams to illuminate the top transparent layer in different illumination directions, each extra illumination light source structured to produce probe light in an optical spectral range with respect to which tissues of a human finger exhibit optical transmission to allow probe light in each illumination probe beam to enter a user finger over the sensing area on the top transparent layer to produce scattered probe light by scattering of tissues inside the finger that propagates towards and passes the top transparent layer to carry both (1) fingerprint pattern information and (2) different fingerprint 3-D topographical information associated with the different illumination directions, respectively, caused by transmission through internal tissues of ridges and valleys of the finger; and a probe illumination control circuit coupled to control the extra illumination light sources to sequentially turn on and off in generating the different illumination probe beams at different times, one beam at a time, so that the optical sensors detectors are operable to sequentially detect the scattered probe light from the different illumination probe beams to capture both (1) the fingerprint pattern information and (2) the different fingerprint 3-D topographical information associated with the different illumination directions, respectively.

22. The device as in claim 13, wherein:
adjacent light emitting display pixels are arranged to emit light of different colors and are grouped to form different light emitting display color pixel groups; and
the optical detectors are spatially distributed in the different light emitting display color pixel groups so that each light emitting display color pixel group includes one optical detector.

* * * * *